US012477881B2

(12) United States Patent
Pikulski et al.

(10) Patent No.: US 12,477,881 B2
(45) Date of Patent: Nov. 18, 2025

(54) THERMAL MANAGEMENT SYSTEMS AND METHODS FOR ELECTRICALLY-POWERED DEVICES SUCH AS MICROPROCESSORS AND MICROPROCESSOR CHIPS

(71) Applicants: Joseph L. Pikulski, Westlake Village, CA (US); Willett Tuitele, South Pasedena, CA (US)

(72) Inventors: Joseph L. Pikulski, Westlake Village, CA (US); Willett Tuitele, South Pasedena, CA (US)

( * ) Notice: Subject to any disclaimer, the term of this patent is extended or adjusted under 35 U.S.C. 154(b) by 0 days.

(21) Appl. No.: 18/830,426

(22) Filed: Sep. 10, 2024

(65) Prior Publication Data

US 2025/0151491 A1     May 8, 2025

Related U.S. Application Data

(63) Continuation of application No. 18/269,128, filed as application No. PCT/US2021/065151 on Dec. 23, 2021, now Pat. No. 12,119,438, which is a continuation of application No. 17/133,200, filed on Dec. 23, 2020, now Pat. No. 11,211,538.

(51) Int. Cl.
    *H01L 33/64*          (2010.01)
    *H10H 20/858*       (2025.01)

(52) U.S. Cl.
    CPC .............................. *H10H 20/8586* (2025.01)

(58) Field of Classification Search
    CPC ................................................. H01L 33/648
    USPC ........................................................ 362/294
    See application file for complete search history.

(56) References Cited

U.S. PATENT DOCUMENTS

| | | | |
|---|---|---|---|
| 5,183,104 A | * | 2/1993 | Novotny ............ H05K 7/20354 165/104.34 |
| 6,016,038 A | | 1/2000 | Mueller |
| 6,150,774 A | | 11/2000 | Mueller |
| 6,166,496 A | | 12/2000 | Lys |
| 6,211,626 B1 | | 4/2001 | Lys |
| 6,292,901 B1 | | 9/2001 | Lys |

(Continued)

FOREIGN PATENT DOCUMENTS

| | | |
|---|---|---|
| CN | 103824928 | 5/2014 |
| WO | 2010147336 | 12/2010 |

OTHER PUBLICATIONS

International Search Report Issued in International Application No. PCT/US21/65151 mailed Mar. 17, 2022.

(Continued)

*Primary Examiner* — Christopher M Raabe
(74) *Attorney, Agent, or Firm* — Ferguson Case Orr Paterson

(57) ABSTRACT

Described herein are devices, systems and methods for utilizing fluid cooling to thermally manage electrically-powered devices such as microprocessors and microprocessor chips. Embodiments incorporating features of the present disclosure can purge heated cooling fluid from the system immediately after it has been used to absorb heat from an electrically-powered device, so that other devices in the system do not receive cooling fluid from another device in the system. In some embodiments, cooling fluid can be made to directly impinge on or near an electrically-powered device such as a microprocessor or microprocessor chip.

22 Claims, 52 Drawing Sheets

(56) References Cited

U.S. PATENT DOCUMENTS

| | | |
|---|---|---|
| 6,340,868 B1 | 1/2002 | Lys |
| 6,459,919 B1 | 10/2002 | Lys |
| 6,528,954 B1 | 3/2003 | Lys |
| 6,548,967 B1 | 4/2003 | Dowling |
| 6,577,080 B2 | 6/2003 | Lys |
| 6,624,597 B2 | 9/2003 | Dowling |
| 6,717,376 B2 | 4/2004 | Lys |
| 6,720,745 B2 | 4/2004 | Lys |
| 6,774,584 B2 | 8/2004 | Lys |
| 6,777,891 B2 | 8/2004 | Lys |
| 6,780,678 B2 | 8/2004 | Simon |
| 6,781,329 B2 | 8/2004 | Mueller |
| 6,788,011 B2 | 9/2004 | Mueller |
| 6,806,659 B1 | 10/2004 | Mueller |
| 6,888,322 B2 | 5/2005 | Dowling |
| 6,897,624 B2 | 5/2005 | Lys |
| 6,936,978 B2 | 8/2005 | Morgan |
| 6,965,205 B2 | 11/2005 | Piepgras |
| 6,967,448 B2 | 11/2005 | Morgan |
| 6,969,954 B2 | 11/2005 | Lys |
| 6,973,801 B1 | 12/2005 | Campbell |
| 6,975,079 B2 | 12/2005 | Lys |
| 7,014,336 B1 | 3/2006 | Ducharme |
| 7,038,398 B1 | 5/2006 | Lys |
| 7,038,399 B2 | 5/2006 | Lys |
| 7,042,172 B2 | 5/2006 | Dowling |
| 7,064,498 B2 | 6/2006 | Dowling |
| 7,086,247 B2 | 8/2006 | Campbell |
| 7,113,541 B1 | 9/2006 | Lys |
| 7,132,804 B2 | 11/2006 | Lys |
| 7,135,824 B2 | 11/2006 | Lys |
| 7,139,617 B1 | 11/2006 | Morgan |
| 7,161,311 B2 | 1/2007 | Mueller |
| 7,161,313 B2 | 1/2007 | Piepgras |
| 7,161,556 B2 | 1/2007 | Morgan |
| 7,180,252 B2 | 2/2007 | Lys |
| 7,184,269 B2 | 2/2007 | Campbell |
| 7,186,003 B2 | 3/2007 | Dowling |
| 7,187,141 B2 | 3/2007 | Mueller |
| 7,202,613 B2 | 4/2007 | Morgan |
| 7,206,203 B2 | 4/2007 | Campbell |
| 7,221,104 B2 | 5/2007 | Lys |
| 7,231,060 B2 | 6/2007 | Dowling |
| 7,233,115 B2 | 6/2007 | Lys |
| 7,233,494 B2 | 6/2007 | Campbell |
| 7,242,152 B2 | 7/2007 | Dowling |
| 7,248,239 B2 | 7/2007 | Dowling |
| 7,253,566 B2 | 8/2007 | Lys |
| 7,256,554 B2 | 8/2007 | Lys |
| 7,272,005 B2 | 9/2007 | Campbell |
| 7,274,160 B2 | 9/2007 | Mueller |
| 7,274,566 B2 | 9/2007 | Campbell |
| 7,277,283 B2 | 10/2007 | Campbell |
| 7,283,358 B2 | 10/2007 | Campbell |
| 7,286,351 B2 | 10/2007 | Campbell |
| 7,298,617 B2 | 11/2007 | Campbell |
| 7,298,618 B2 | 11/2007 | Campbell |
| 7,300,192 B2 | 11/2007 | Mueller |
| 7,301,770 B2 | 11/2007 | Campbell |
| 7,308,296 B2 | 12/2007 | Lys |
| 7,309,965 B2 | 12/2007 | Dowling |
| 7,318,660 B2 | 1/2008 | Yu |
| 7,344,279 B2 | 3/2008 | Mueller |
| 7,349,209 B2 | 3/2008 | Campbell |
| 7,349,213 B2 | 3/2008 | Campbell |
| 7,350,936 B2 | 4/2008 | Ducharme |
| 7,352,138 B2 | 4/2008 | Lys |
| 7,352,339 B2 | 4/2008 | Morgan |
| 7,353,071 B2 | 4/2008 | Blackwell |
| 7,358,679 B2 | 4/2008 | Lys |
| 7,358,706 B2 | 4/2008 | Lys |
| 7,358,929 B2 | 4/2008 | Mueller |
| 7,362,574 B2 | 4/2008 | Campbell |
| 7,375,962 B2 | 5/2008 | Campbell |
| 7,380,409 B2 | 6/2008 | Campbell |
| 7,385,359 B2 | 6/2008 | Dowling |
| 7,385,817 B2 | 6/2008 | Campbell |
| 7,387,405 B2 | 6/2008 | Ducharme |
| 7,397,661 B2 | 7/2008 | Campbell |
| 7,400,504 B2 | 7/2008 | Campbell |
| 7,400,505 B2 | 7/2008 | Campbell |
| 7,405,936 B1 | 7/2008 | Campbell |
| 7,408,776 B1 | 8/2008 | Campbell |
| 7,420,808 B2 | 9/2008 | Campbell |
| 7,427,840 B2 | 9/2008 | Morgan |
| 7,450,385 B1 | 11/2008 | Campbell |
| 7,453,217 B2 | 11/2008 | Lys |
| 7,459,864 B2 | 12/2008 | Lys |
| 7,462,997 B2 | 12/2008 | Mueller |
| 7,477,514 B2 | 1/2009 | Campbell |
| 7,482,565 B2 | 1/2009 | Morgan |
| 7,482,764 B2 | 1/2009 | Morgan |
| 7,486,512 B2 | 2/2009 | Campbell |
| 7,486,514 B2 | 2/2009 | Campbell |
| 7,492,593 B2 | 2/2009 | Campbell |
| 7,495,671 B2 | 2/2009 | Chemel |
| 7,499,279 B2 | 3/2009 | Campbell |
| 7,502,034 B2 | 3/2009 | Chemel |
| 7,511,437 B2 | 3/2009 | Lys |
| 7,511,957 B2 | 3/2009 | Campbell |
| 7,518,871 B2 | 4/2009 | Campbell |
| 7,520,634 B2 | 4/2009 | Ducharme |
| 7,525,254 B2 | 4/2009 | Lys |
| 7,542,257 B2 | 6/2009 | Miccormick |
| 7,550,931 B2 | 6/2009 | Lys |
| 7,550,935 B2 | 6/2009 | Lys |
| 7,557,521 B2 | 7/2009 | Lys |
| 7,571,028 B2 | 8/2009 | Lapinski |
| 7,593,227 B2 | 9/2009 | Campbell |
| 7,598,681 B2 | 10/2009 | Lys |
| 7,598,684 B2 | 10/2009 | Lys |
| 7,598,686 B2 | 10/2009 | Lys |
| 7,609,519 B2 | 10/2009 | Campbell |
| 7,630,795 B2 | 12/2009 | Campbell |
| 7,639,498 B2 | 12/2009 | Cambell |
| 7,639,499 B1 | 12/2009 | Campbell |
| 7,641,101 B2 | 1/2010 | Campbell |
| 7,642,730 B2 | 1/2010 | Dowling |
| 7,642,914 B2 | 1/2010 | Campbell |
| 7,646,029 B2 | 1/2010 | Mueller |
| 7,657,347 B2 | 2/2010 | Campbell |
| 7,659,674 B2 | 2/2010 | Mueller |
| 7,660,121 B2 | 2/2010 | Campbell |
| 7,665,325 B2 | 2/2010 | Campbell |
| 7,707,880 B2 | 5/2010 | Campbell |
| 7,709,296 B2 | 5/2010 | Campbell |
| 7,724,524 B1 | 5/2010 | Campbell |
| 7,731,079 B2 | 6/2010 | Campbell |
| 7,737,643 B2 | 6/2010 | Lys |
| 7,745,898 B2 | 6/2010 | Campbell |
| 7,751,918 B2 | 7/2010 | Campbell |
| 7,762,314 B2 | 7/2010 | Campbell |
| 7,764,026 B2 | 7/2010 | Dowling |
| 7,781,979 B2 | 8/2010 | Lys |
| 7,787,248 B2 | 8/2010 | Campbell |
| 7,788,941 B2 | 9/2010 | Campbell |
| 7,809,448 B2 | 10/2010 | Lys |
| 7,812,365 B2 | 10/2010 | Murayama |
| 7,828,465 B2 | 11/2010 | Roberge |
| 7,830,664 B2 | 11/2010 | Campbell |
| 7,841,385 B2 | 11/2010 | Campbell |
| 7,845,823 B2 | 12/2010 | Mueller |
| 7,878,007 B2 | 2/2011 | Campbell |
| 7,883,266 B2 | 2/2011 | Campbell |
| 7,885,070 B2 | 2/2011 | Campbell |
| 7,885,074 B2 | 2/2011 | Campbell |
| 7,903,411 B2 | 3/2011 | Campbell |
| 7,905,096 B1 | 3/2011 | Campbell |
| 7,907,406 B1 | 3/2011 | Campbell |
| 7,916,483 B2 | 3/2011 | Campbell |
| 7,944,694 B2 | 5/2011 | Campbell |
| 7,948,757 B2 | 5/2011 | Campbell |
| 7,956,458 B2 | 6/2011 | Campbell |
| 7,959,320 B2 | 6/2011 | Mueller |

(56) References Cited

U.S. PATENT DOCUMENTS

| | | |
|---|---|---|
| 7,959,673 B2 | 6/2011 | Carpentier |
| 7,961,475 B2 | 6/2011 | Campbell |
| 7,963,119 B2 | 6/2011 | Campbell |
| 7,967,062 B2 | 6/2011 | Campbell |
| 7,978,472 B2 | 7/2011 | Campbell |
| 7,978,473 B2 | 7/2011 | Campbell |
| 7,983,040 B2 | 7/2011 | Campbell |
| 7,990,709 B2 | 8/2011 | Campbell |
| 8,013,281 B2 | 9/2011 | Morgan |
| 8,014,150 B2 | 9/2011 | Campbell |
| 8,018,720 B2 | 9/2011 | Campbell |
| 8,020,298 B2 | 9/2011 | Campbell |
| 8,026,673 B2 | 9/2011 | Lys |
| 8,027,162 B2 | 9/2011 | Campbell |
| 8,051,897 B2 | 11/2011 | Campbell |
| 8,059,405 B2 | 11/2011 | Capbell |
| 8,080,819 B2 | 12/2011 | Mueller |
| 8,081,461 B2 | 12/2011 | Campbell |
| 8,094,453 B2 | 1/2012 | Campbell |
| 8,134,303 B2 | 3/2012 | Lys |
| 8,141,621 B2 | 3/2012 | Campbell |
| 8,144,467 B2 | 3/2012 | Campbell |
| 8,179,677 B2 | 5/2012 | Campbell |
| 8,184,436 B2 | 5/2012 | Campbell |
| 8,189,334 B2 | 5/2012 | Campbell |
| 8,192,053 B2 | 6/2012 | Owen |
| 8,194,406 B2 | 6/2012 | Campbell |
| 8,203,842 B2 | 6/2012 | Campbell |
| 8,208,258 B2 | 6/2012 | Campbell |
| 8,230,906 B2 | 7/2012 | Campbell |
| 8,248,801 B2 | 8/2012 | Campbell |
| 8,266,802 B2 | 9/2012 | Campbell |
| 8,274,790 B2 | 9/2012 | Campbell |
| 8,322,029 B2 | 12/2012 | Campbell |
| 8,322,154 B2 | 12/2012 | Campbell |
| 8,327,582 B2 | 12/2012 | Storey |
| 8,345,423 B2 | 1/2013 | Campbell |
| 8,351,206 B2 | 1/2013 | Campbell |
| 8,365,466 B1 | 2/2013 | Storey |
| 8,369,091 B2 | 2/2013 | Campbell |
| 8,387,249 B2 | 3/2013 | Campbell |
| 8,390,207 B2 | 3/2013 | Dowling |
| 8,472,182 B2 | 6/2013 | Campbell |
| 8,490,679 B2 | 7/2013 | Campbell |
| 8,550,702 B2 | 10/2013 | Campbell |
| 8,564,952 B2 | 10/2013 | Campbell |
| 8,583,290 B2 | 11/2013 | Campbell |
| 8,619,428 B2 | 12/2013 | Campbell |
| 8,689,861 B2 | 4/2014 | Campbell |
| 8,711,563 B2 | 4/2014 | Campbell |
| 8,713,955 B2 | 5/2014 | Campbell |
| 8,713,957 B2 | 5/2014 | Campbell |
| 8,720,063 B2 | 5/2014 | Campbell |
| 8,721,135 B2 | 5/2014 | Derose |
| 8,734,007 B2 | 5/2014 | Campbell |
| 8,736,197 B2 | 5/2014 | Datta |
| 8,739,406 B2 | 6/2014 | Campbell |
| 8,743,545 B2 | 6/2014 | Campbell |
| 8,760,863 B2 | 6/2014 | Campbell |
| 8,783,052 B2 | 7/2014 | Campbell |
| 8,789,385 B2 | 7/2014 | Campbell |
| 8,797,740 B2 | 8/2014 | Campbell |
| 8,806,749 B2 | 8/2014 | Campbell |
| 8,813,515 B2 | 8/2014 | Campbell |
| 8,816,593 B2 | 8/2014 | Lys |
| 8,817,465 B2 | 8/2014 | Campbell |
| 8,817,474 B2 | 8/2014 | Campbell |
| 8,820,972 B2 | 9/2014 | Mollnow |
| 8,824,143 B2 | 9/2014 | Campbell |
| 8,833,096 B2 | 9/2014 | Campbell |
| 8,857,057 B2 | 10/2014 | Campbell |
| 8,867,209 B2 | 10/2014 | Campbell |
| 8,879,257 B2 | 11/2014 | Campbell |
| 8,896,229 B2 | 11/2014 | Lys |
| 8,899,052 B2 | 12/2014 | Campbell |
| 8,922,998 B2 | 12/2014 | Campbell |
| 8,925,333 B2 | 1/2015 | Campbell |
| 8,929,080 B2 | 1/2015 | Campbell |
| 8,934,250 B2 | 1/2015 | Campbell |
| 8,938,468 B2 | 1/2015 | Morgan |
| 8,941,994 B2 | 1/2015 | Campbell |
| 8,947,873 B2 | 2/2015 | Campbell |
| 8,953,317 B2 | 2/2015 | Campbell |
| 8,953,320 B2 | 2/2015 | Campbell |
| 8,955,346 B2 | 2/2015 | Campbell |
| 8,955,347 B2 | 2/2015 | Campbell |
| 8,959,941 B2 | 2/2015 | Campbell |
| 8,964,390 B2 | 2/2015 | Campbell |
| 8,966,922 B2 | 3/2015 | Campbell |
| 8,985,847 B2 | 3/2015 | Campbell |
| 9,009,968 B2 | 4/2015 | Campbell |
| 9,013,872 B2 | 4/2015 | Campbell |
| 9,025,331 B2 | 5/2015 | Campbell |
| 9,025,332 B2 | 5/2015 | Campbell |
| 9,038,406 B2 | 5/2015 | Campbell |
| 9,042,098 B2 | 5/2015 | Campbell |
| 9,042,099 B2 | 5/2015 | Campbell |
| 9,061,382 B2 | 6/2015 | Campbell |
| 9,061,383 B2 | 6/2015 | Campbell |
| 9,067,288 B2 | 6/2015 | Campbell |
| 9,069,532 B2 | 6/2015 | Campbell |
| 9,075,582 B2 | 7/2015 | Campbell |
| 9,078,379 B2 | 7/2015 | Campbell |
| 9,089,936 B2 | 7/2015 | Campbell |
| 9,095,889 B2 | 8/2015 | Campbell |
| 9,095,942 B2 | 8/2015 | Campbell |
| 9,101,021 B2 | 8/2015 | Lys |
| 9,101,078 B2 | 8/2015 | Campbell |
| 9,102,021 B2 | 8/2015 | Campbell |
| 9,113,581 B2 | 8/2015 | Campbell |
| 9,144,178 B2 | 9/2015 | Arvelo |
| 9,148,982 B2 | 9/2015 | Campbell |
| 9,148,983 B2 | 9/2015 | Campbell |
| 9,161,480 B2 | 10/2015 | Harrington |
| 9,167,721 B2 | 10/2015 | Campbell |
| 9,173,324 B2 | 10/2015 | Campbell |
| 9,200,851 B2 | 12/2015 | Campbell |
| 9,201,474 B2 | 12/2015 | Campbell |
| 9,207,002 B2 | 12/2015 | Campbell |
| 9,210,830 B2 | 12/2015 | Campbell |
| 9,210,831 B2 | 12/2015 | Arvelo |
| 9,213,343 B2 | 12/2015 | Campbell |
| 9,218,008 B2 | 12/2015 | Campbell |
| 9,220,207 B2 | 12/2015 | Storey |
| 9,250,024 B2 | 2/2016 | Campbell |
| 9,253,921 B2 | 2/2016 | Campbell |
| 9,253,923 B2 | 2/2016 | Arvelo |
| 9,258,925 B2 | 2/2016 | Arvelo |
| 9,261,308 B2 | 2/2016 | Campbell |
| 9,265,176 B2 | 2/2016 | Arvelo |
| 9,265,177 B2 | 2/2016 | Arvelo |
| 9,265,178 B2 | 2/2016 | Arvelo |
| 9,282,675 B2 | 3/2016 | Campbell |
| 9,282,678 B2 | 3/2016 | Campbell |
| 9,288,932 B2 | 3/2016 | Campbell |
| 9,291,281 B2 | 3/2016 | Campbell |
| 9,295,181 B2 | 3/2016 | Campbell |
| 9,298,231 B2 | 3/2016 | Arvelo |
| 9,301,433 B2 | 3/2016 | Campbell |
| 9,303,926 B2 | 4/2016 | Campbell |
| 9,313,920 B2 | 4/2016 | Campbell |
| 9,332,674 B2 | 5/2016 | Campbell |
| 9,338,924 B2 | 5/2016 | Campbell |
| 9,341,418 B2 | 5/2016 | Arvelo |
| 9,345,169 B1 | 5/2016 | Campbell |
| 9,351,431 B2 | 5/2016 | Campbell |
| 9,357,674 B2 | 5/2016 | Campbell |
| 9,357,675 B2 | 5/2016 | Campbell |
| 9,357,682 B2 | 5/2016 | Campbell |
| 9,363,924 B2 | 6/2016 | Campbell |
| 9,380,751 B2 | 7/2016 | Storey |
| 9,414,519 B2 | 8/2016 | Campbell |
| 9,414,525 B2 | 8/2016 | Campbell |
| 9,420,721 B2 | 8/2016 | Campbell |

(56) References Cited

U.S. PATENT DOCUMENTS

| | | |
|---|---|---|
| 9,439,325 B2 | 9/2016 | Campbell |
| 9,446,487 B2 | 9/2016 | Campbell |
| 9,456,527 B2 | 9/2016 | Arvelo |
| 9,462,729 B1 | 10/2016 | Campbell |
| 9,470,439 B2 | 10/2016 | Campbell |
| 9,474,186 B2 | 10/2016 | Campbell |
| 9,491,836 B2 | 11/2016 | Lys |
| 9,491,915 B2 | 11/2016 | Storey |
| 9,497,888 B2 | 11/2016 | Arvelo |
| 9,504,188 B1 | 11/2016 | Campbell |
| 9,504,189 B1 | 11/2016 | Campbell |
| 9,546,575 B2 | 1/2017 | Campbell |
| 9,546,576 B2 | 1/2017 | Campbell |
| 9,591,787 B2 | 3/2017 | Arvelo |
| 9,622,379 B1 | 4/2017 | Campbell |
| 9,623,520 B2 | 4/2017 | Campbell |
| 9,629,284 B2 | 4/2017 | Campbell |
| 9,629,286 B2 | 4/2017 | Campbell |
| D785,497 S | 5/2017 | Storey |
| 9,648,786 B2 | 5/2017 | Campbell |
| 9,661,784 B2 | 5/2017 | Arvelo |
| 9,677,987 B2 | 6/2017 | Campbell |
| 9,681,507 B2 | 6/2017 | Lys |
| 9,686,889 B2 | 6/2017 | Campbell |
| 9,686,891 B2 | 6/2017 | Campbell |
| 9,687,943 B2 | 6/2017 | Campbell |
| 9,693,413 B2 | 6/2017 | Lys |
| 9,750,159 B2 | 8/2017 | Campbell |
| D796,378 S | 9/2017 | Storey |
| 9,761,508 B2 | 9/2017 | Campbell |
| 9,763,357 B2 | 9/2017 | Campbell |
| 9,781,782 B2 | 10/2017 | Lys |
| 9,793,247 B2 | 10/2017 | Yuan |
| 9,795,055 B1 | 10/2017 | Campbell |
| 9,852,963 B2 | 12/2017 | Shedd |
| 9,861,010 B2 | 1/2018 | Campbell |
| 9,865,522 B2 | 1/2018 | Campbell |
| 9,904,811 B2 | 2/2018 | Campbell |
| 9,907,211 B2 | 2/2018 | Campbell |
| 9,949,412 B2 | 4/2018 | Campbell |
| 9,955,541 B2 | 4/2018 | Dowling |
| 9,968,006 B2 | 5/2018 | Campbell |
| D821,915 S | 7/2018 | Storey |
| 10,024,606 B2 | 7/2018 | Arvelo |
| D826,769 S | 8/2018 | Storey |
| 10,047,943 B2 | 8/2018 | Storey |
| 10,070,560 B2 | 9/2018 | Campbell |
| 10,080,332 B1 | 9/2018 | Yi |
| 10,082,048 B2 | 9/2018 | Campbell |
| D832,738 S | 11/2018 | Storey |
| 10,160,072 B2 | 12/2018 | Boday |
| 10,169,624 B2 | 1/2019 | Campbell |
| 10,241,021 B2 | 3/2019 | Campbell |
| 10,244,665 B2 | 3/2019 | Campbell |
| 10,265,812 B2 | 4/2019 | Boday |
| 10,271,459 B2 | 4/2019 | Campbell |
| 10,280,944 B2 | 5/2019 | Arnella |
| 10,287,925 B2 | 5/2019 | Campbell |
| 10,306,847 B2 | 6/2019 | Whitcher |
| 10,309,423 B2 | 6/2019 | Arnella |
| 10,321,528 B2 | 6/2019 | Cavalcanti |
| 10,385,878 B2 | 8/2019 | Arnella |
| 10,390,495 B2 | 8/2019 | Smith |
| 10,485,186 B2 | 11/2019 | Storey |
| 10,492,264 B2 | 11/2019 | Petluri |
| 10,544,707 B2 | 1/2020 | Campbell |
| 10,595,447 B2 | 3/2020 | Campbell |
| 10,602,674 B2 | 3/2020 | Storey |
| 10,617,075 B2 | 4/2020 | Storey |
| 10,631,481 B2 | 4/2020 | Storey |
| 10,638,677 B2 | 5/2020 | Storey |
| 10,662,961 B2 | 5/2020 | Campbell |
| 10,694,644 B2 | 6/2020 | Campbell |
| 10,721,802 B2 | 7/2020 | Lys, I |
| 10,734,307 B2 | 8/2020 | Campbell |
| 10,753,236 B2 | 8/2020 | Campbell |
| 10,772,271 B2 | 9/2020 | Storey |
| 10,856,470 B2 | 12/2020 | Lys |
| 10,881,051 B2 | 1/2021 | Lys |
| 10,888,054 B2 | 1/2021 | Storey |
| 10,959,383 B2 | 3/2021 | Lys |
| 10,973,185 B2 | 4/2021 | Creechley |
| 10,999,976 B2 | 5/2021 | Lys |
| 11,013,078 B2 | 5/2021 | Lys |
| 11,019,755 B2 | 5/2021 | Campbell |
| 11,026,378 B2 | 6/2021 | Storey |
| 11,044,854 B2 | 6/2021 | Lys |
| 11,076,536 B2 | 8/2021 | Lys |
| 11,089,741 B2 | 8/2021 | Goodspeed |
| 11,191,184 B2 | 11/2021 | Mizerak |
| 11,211,538 B1 * | 12/2021 | Pikulski ............. H10H 20/8586 |
| 11,277,937 B2 | 3/2022 | Malouin |
| 12,119,438 B2 * | 10/2024 | Pikulski ............. H10H 20/8586 |
| 2006/0162365 A1 * | 7/2006 | Hoang ................ H01L 23/4735 |
| | | 62/310 |
| 2007/0252268 A1 | 11/2007 | Chew |
| 2008/0037221 A1 * | 2/2008 | Campbell ........... H01L 23/4735 |
| | | 361/699 |
| 2010/0328888 A1 * | 12/2010 | Campbell ........... H01L 23/4735 |
| | | 361/699 |
| 2012/0212907 A1 | 8/2012 | Dede |
| 2014/0076523 A1 | 3/2014 | Pritzker |
| 2014/0246174 A1 | 9/2014 | Arvelo |
| 2016/0118317 A1 * | 4/2016 | Shedd ...................... F28F 9/26 |
| | | 257/712 |
| 2016/0136851 A1 | 5/2016 | Campbell |
| 2020/0029463 A1 * | 1/2020 | Han ........................ F28F 13/06 |
| 2020/0352053 A1 * | 11/2020 | Mizerak ............. H05K 7/20772 |
| 2021/0037676 A1 * | 2/2021 | Malouin ............. H05K 7/20254 |
| 2023/0048500 A1 * | 2/2023 | Malouin ............. H05K 7/20272 |
| 2023/0156959 A1 | 5/2023 | Malouin |
| 2023/0180437 A1 | 6/2023 | Whitmore |
| 2023/0280024 A1 | 9/2023 | Spiro |
| 2024/0114653 A1 * | 4/2024 | Wattier ...................... G06F 1/20 |
| 2024/0266253 A1 * | 8/2024 | Kang ..................... H01L 23/473 |
| 2025/0006589 A1 * | 1/2025 | Mookken ............ H01L 23/4006 |
| 2025/0087558 A1 * | 3/2025 | Clark ................ H01L 23/49575 |

OTHER PUBLICATIONS

International Written Opinion Issued in International Application No. PCT/US21/65151 mailed Mar. 17, 2022.

\* cited by examiner

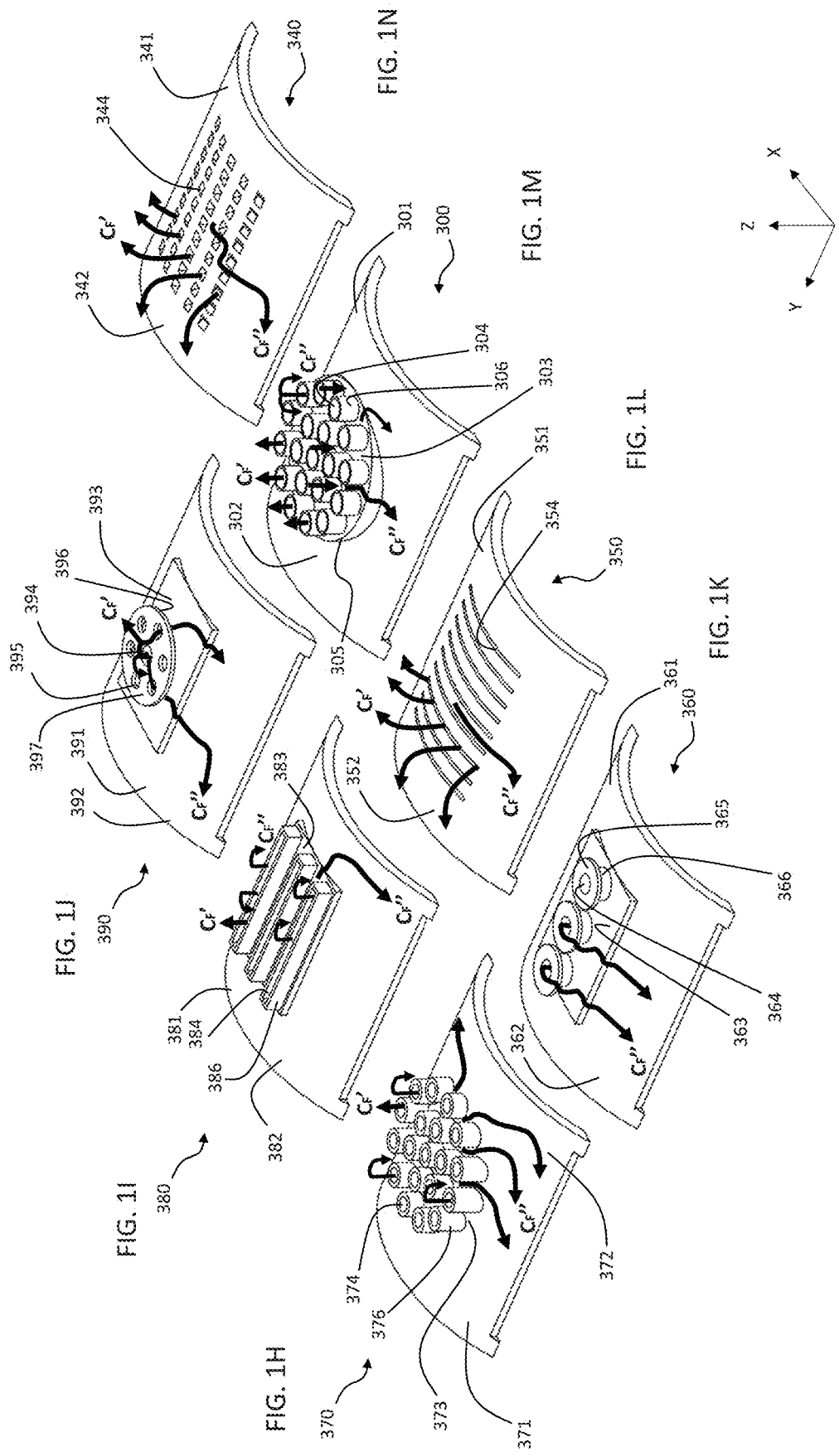

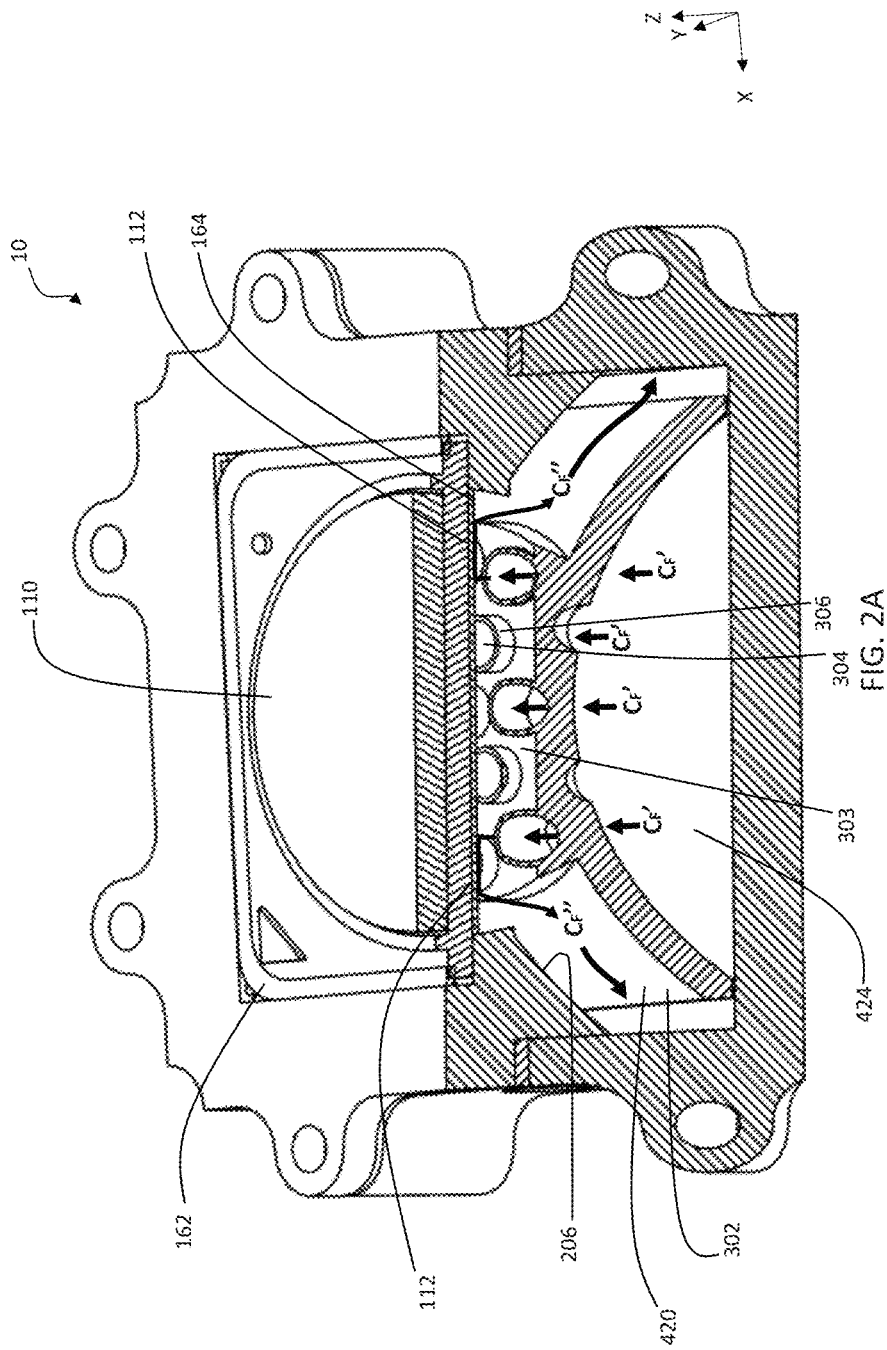

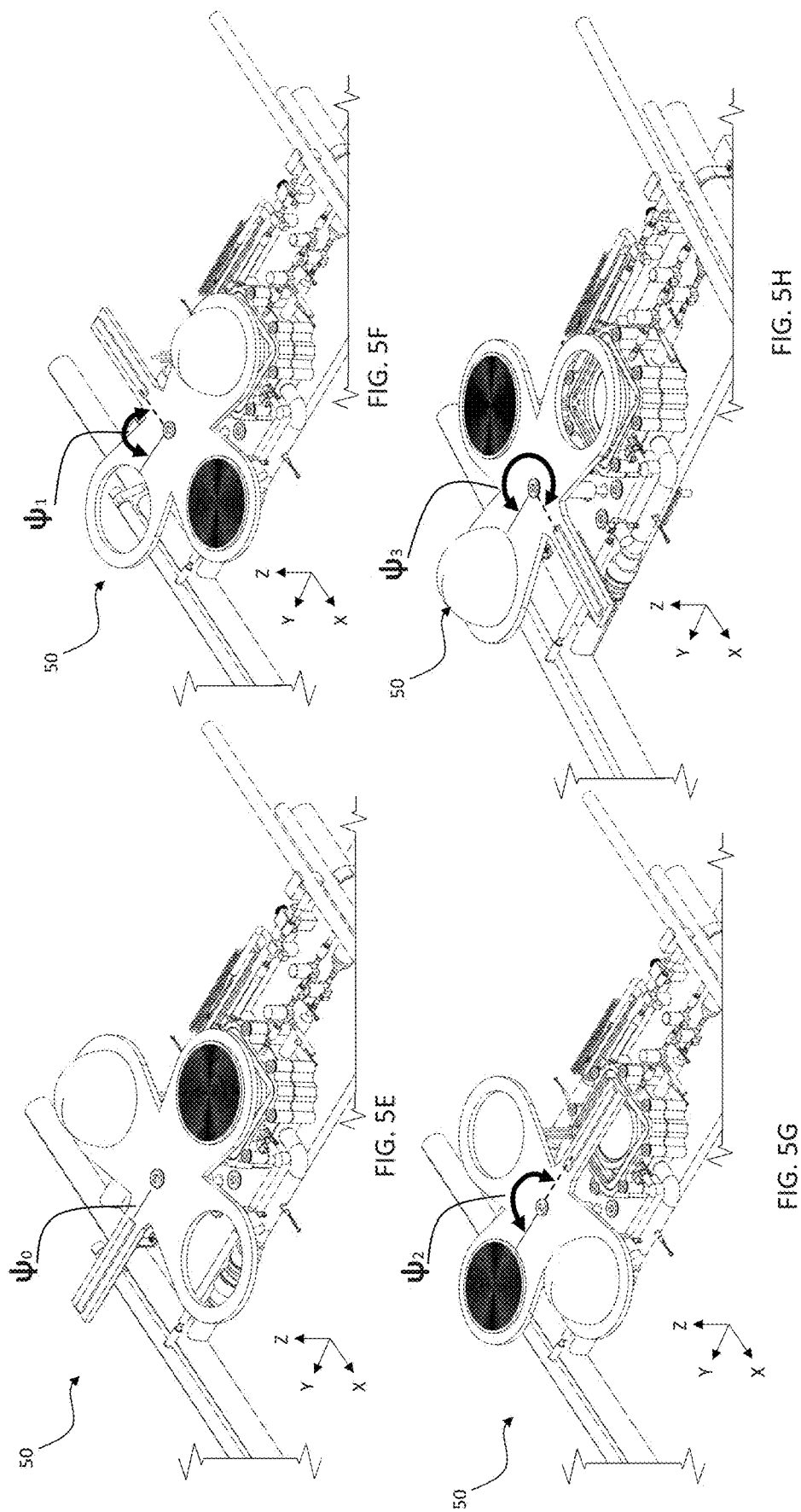

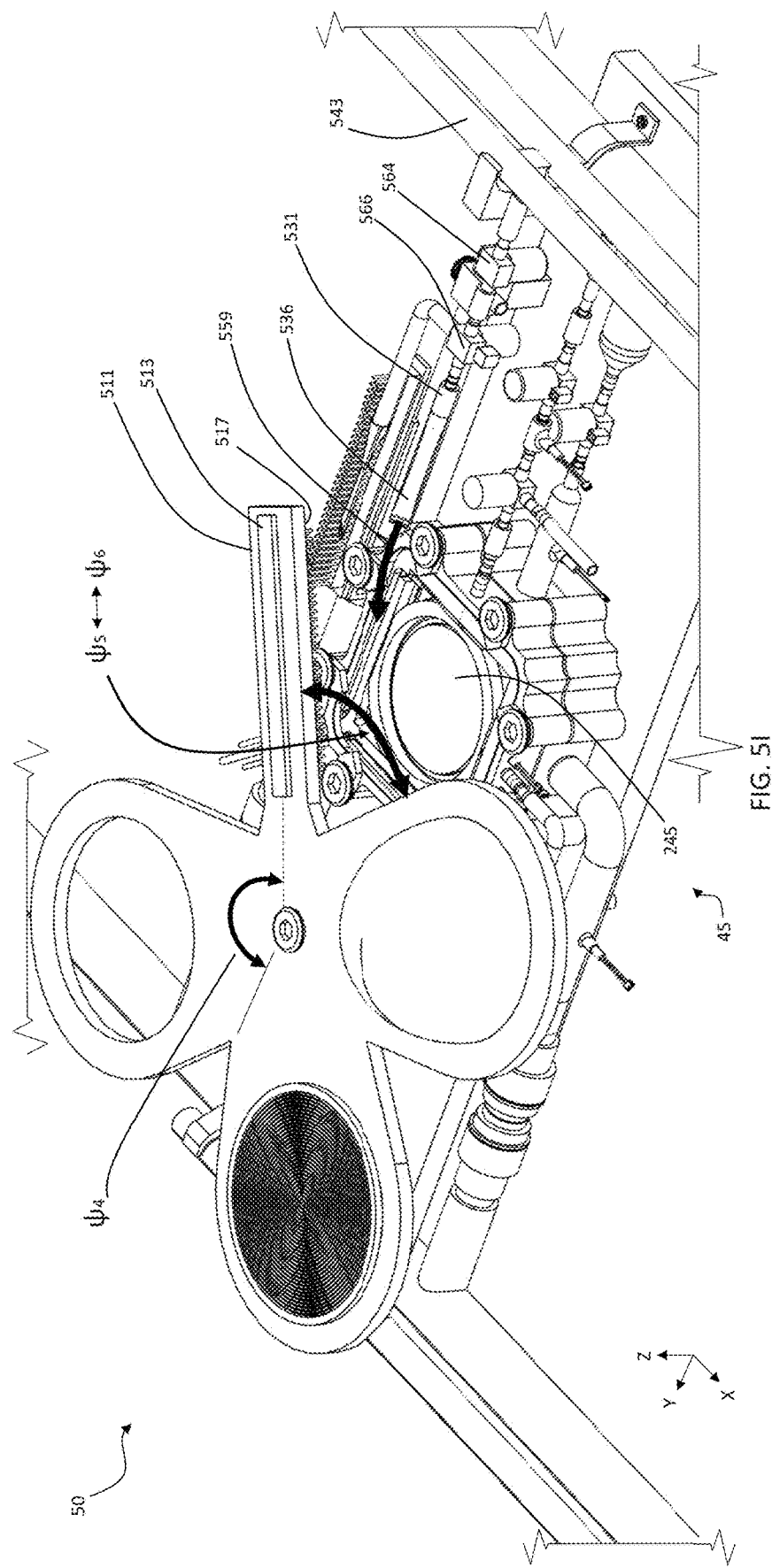

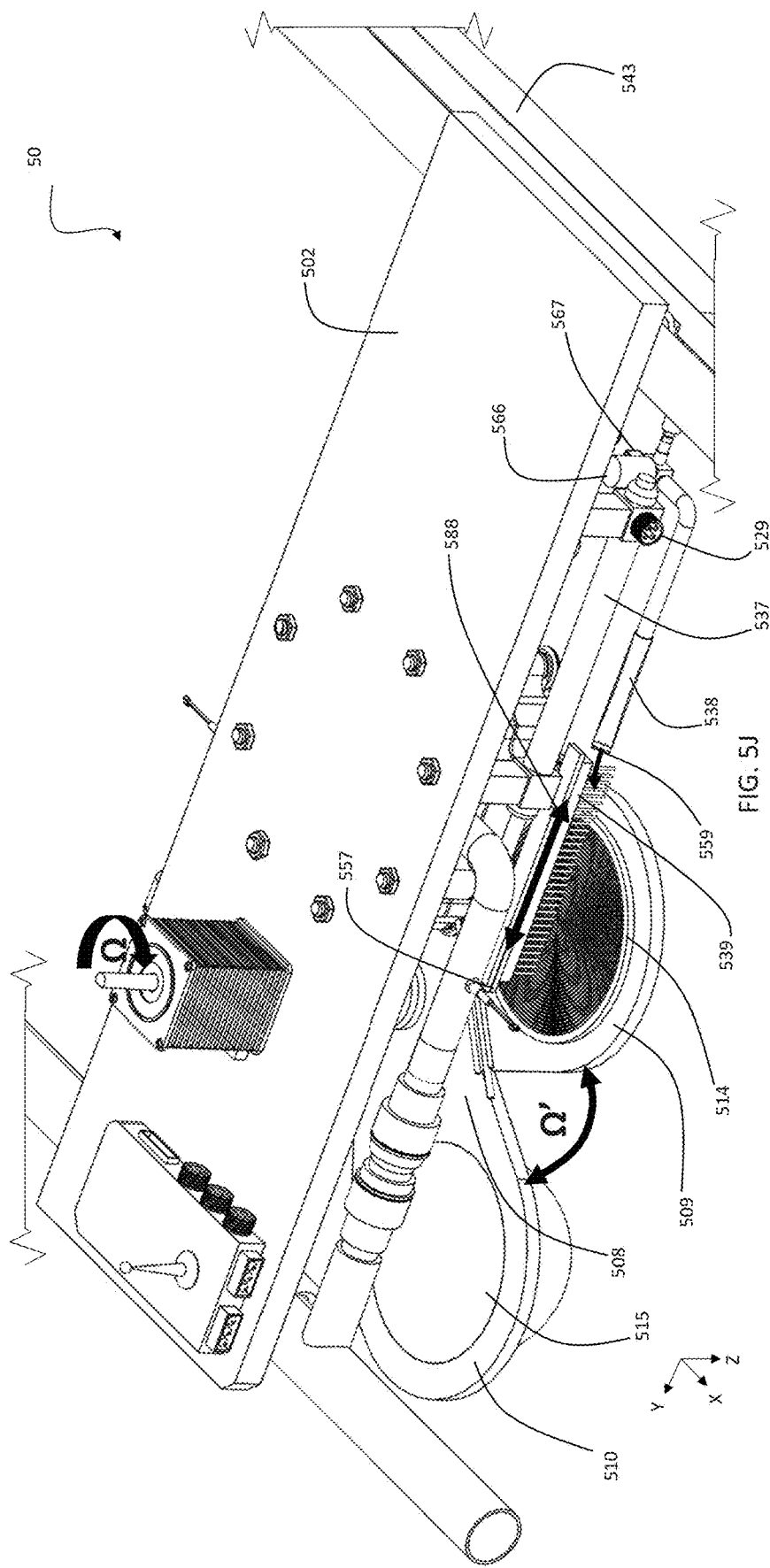

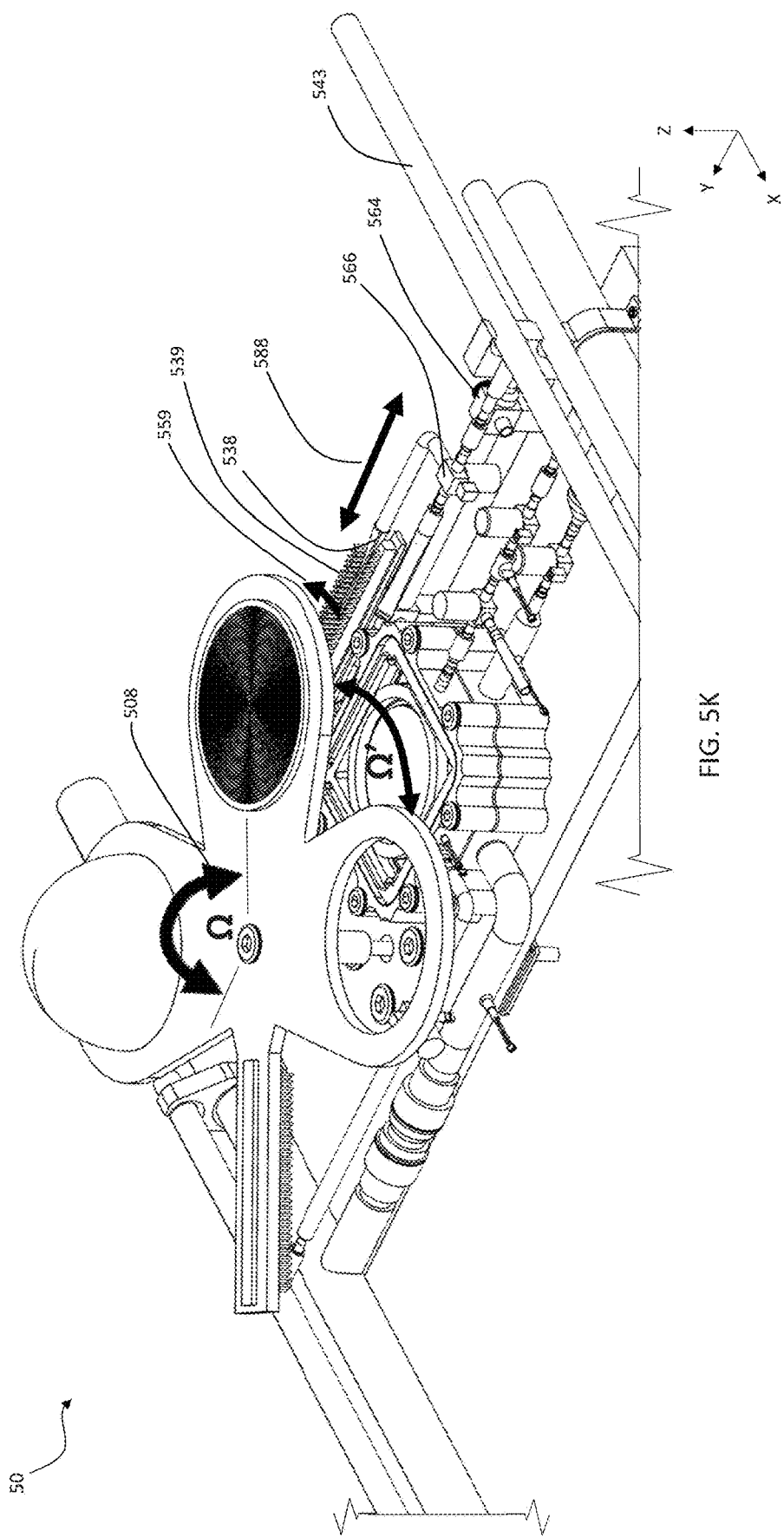

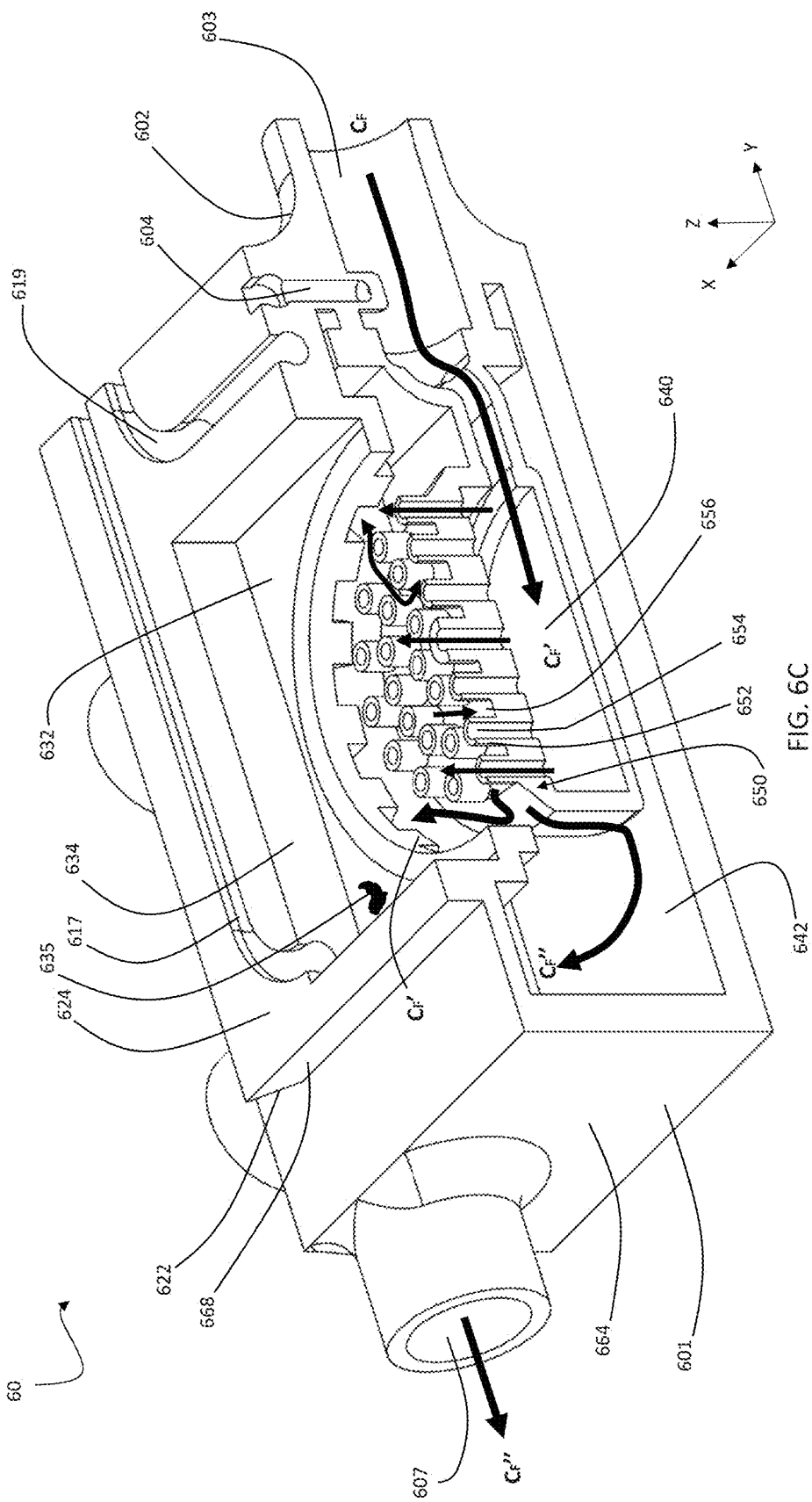

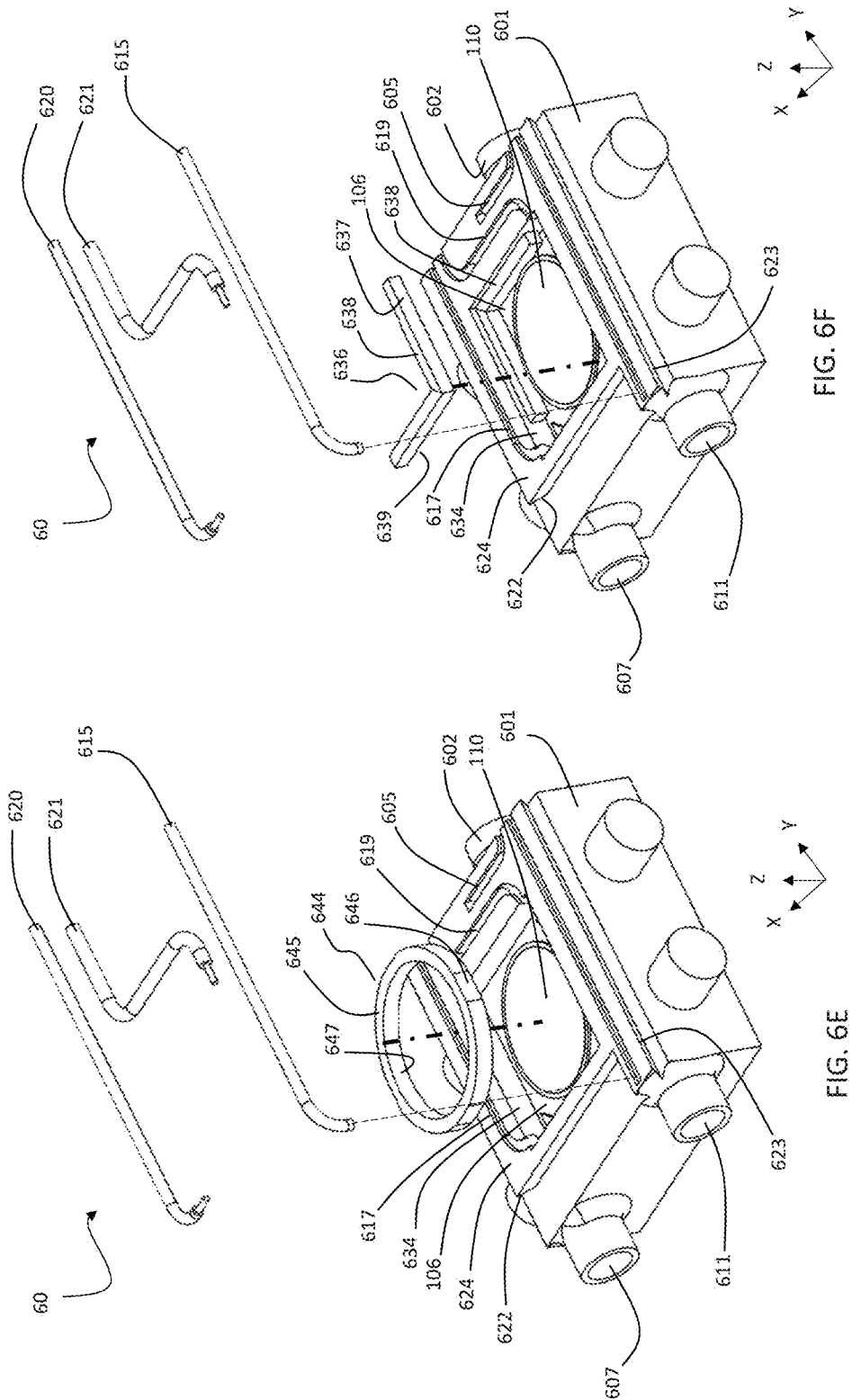

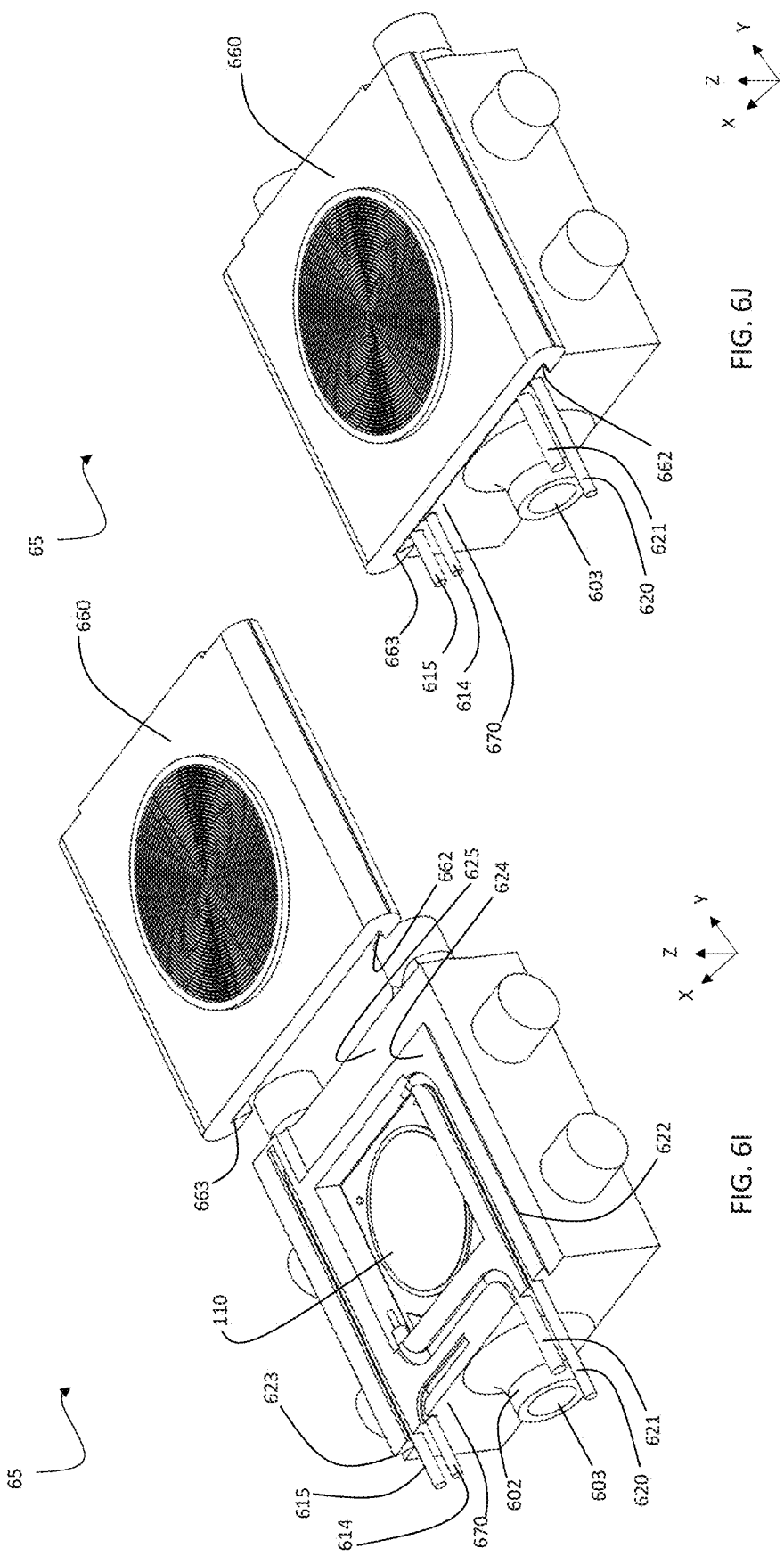

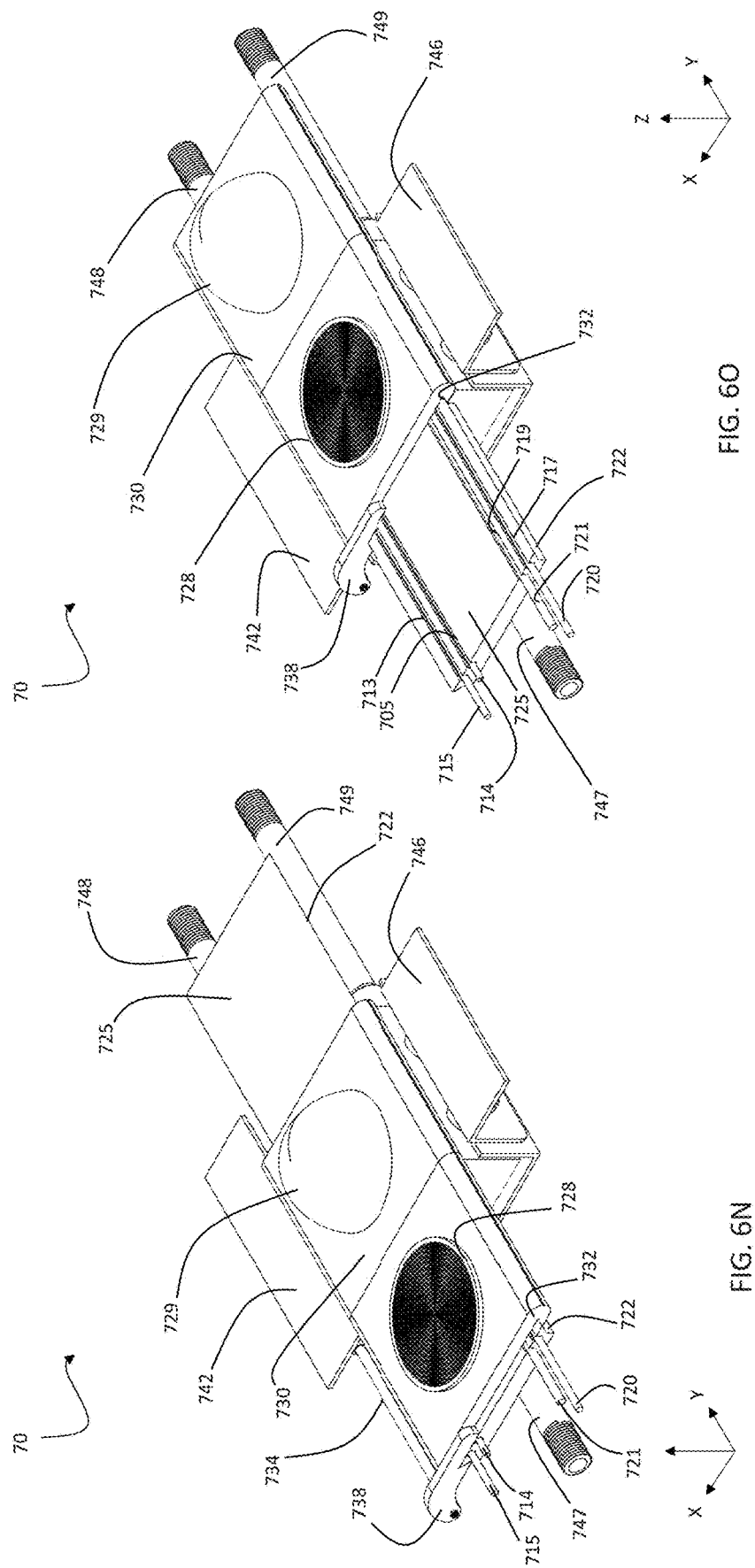

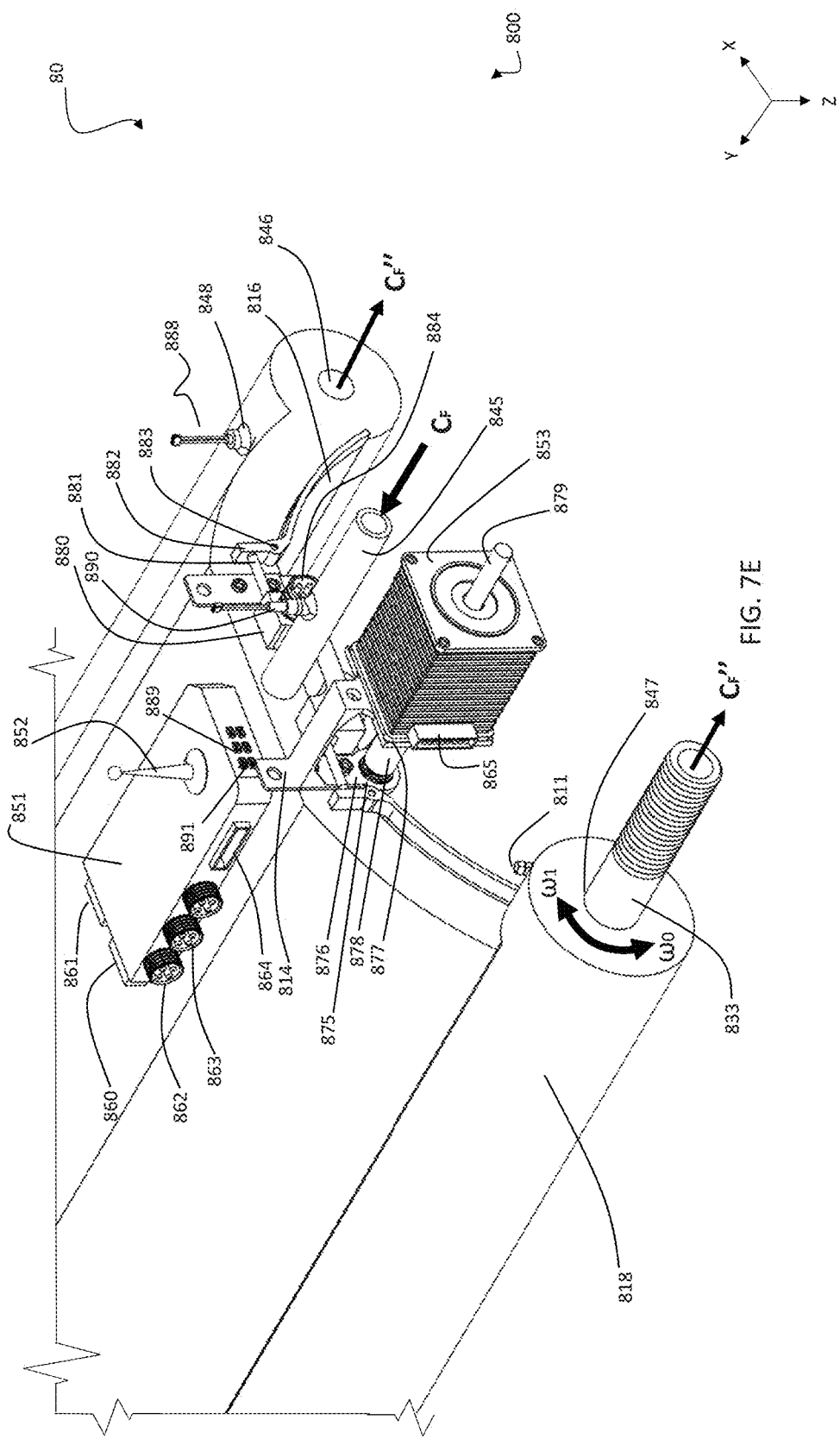

THERMAL MANAGEMENT SYSTEMS AND METHODS FOR ELECTRICALLY-POWERED DEVICES SUCH AS MICROPROCESSORS AND MICROPROCESSOR CHIPS

CROSS REFERENCE TO RELATED APPLICATIONS

This application is a continuation of U.S. application Ser. No. 18/269,128 with a 371(c) date of Jun. 22, 2023, which is a national stage entry of PCT/US2021/065151, with a filing date of Dec. 23, 2021, which claims the benefit of U.S. application Ser. No. 17/133,200, filed on Dec. 23, 2020, to Joseph L. Pikulski, et al., entitled THERMAL MANAGEMENT SYSTEM FOR ELECTRICALLY-POWERED DEVICES; each of these three priority applications is hereby incorporated by reference herein in its entirety.

BACKGROUND

Related Field

Described herein are devices, systems and methods relating to thermal management, for example, the cooling of electrically-powered devices, and particularly to the use of fluid cooling of electrically-powered devices.

Description of the Related Art

In modern times, many areas of technology are concerned with damage and malfunction caused to electrically-powered devices due to overheating through their ordinary use. Many different fields are concerned with this issue, for example microprocessors to lighting solutions. One area where cooling of lighting devices is particularly needed is in the field of grow lights used on commercial crops, for example in greenhouse-based farming.

While fluid-based cooling itself is sometimes utilized to cool electrically-powered devices, the devices are put in direct serial fluid communication where each subsequent device receives heated cooling fluid from the previous device in serial fluid communication. This results in the cooling fluid becoming more and more heated after it absorbs heat from each subsequent device in series. This can result in the devices receiving different levels of cooling and can result in the devices having different levels of damage across the array of electrically-powered devices in cooling fluid serial. In the aforementioned field of greenhouse growing, for example, this can result in different areas of a crop receiving different levels of light due to the differing levels of damage across an array of lights, resulting in an uneven growing rate across the crop.

SUMMARY

Embodiments incorporating features of the present disclosure include devices, systems and methods to cool one or more electrically-powered devices without a device receiving a cooling fluid that has previously absorbed heat from a previous device.

In one embodiment, a thermal management system comprises a base thermal management fixture in fluid communication with a cooling fluid source, the base thermal management fixture being configured to receive and hold at least one electrically-powered device in a targeted area and comprising a fluid-input opening configured to receive cooling fluid from the cooling fluid source, wherein the base thermal management fixture comprises internal components configured to direct the cooling fluid toward the targeted area, such that the cooling fluid can absorb heat from the at least one electrically-powered device and become heated waste fluid. The base thermal management fixture also comprises an exit port configured such that the heated waste fluid can exit from the exit port and can be removed from the base thermal management fixture and the thermal management system.

In another embodiment, a base thermal management fixture for use in a thermal management system comprises a targeted area configured to receive at least one electrically-powered device, an input opening configured to receive cooling fluid from a cooling fluid source, internal components configured to direct cooling fluid received from the cooling fluid source toward the targeted area, such that the cooling fluid can absorb heat from the at least one electrically-powered device and become heated waste fluid and an exit port configured such that the heated waste fluid can exit from the exit port and can be removed from the base thermal management fixture.

In yet another embodiment, a method of thermally-regulating a plurality of electrically-powered devices comprises providing a cooling fluid source and flowing cooling fluid from the cooling fluid source through a first base thermal management fixture in fluid communication with the cooling fluid source, the first base thermal management fixture configured to receive and hold a first electrically-powered device in a first targeted area. The first base thermal management fixture comprises internal features configured to direct the cooling fluid received from the cooling fluid source toward the first targeted area, such that the cooling fluid absorbs heat from the first electrically-powered device and becomes a first heated waste fluid. The first base thermal management fixture is configured such that the first heated waste fluid exits from the first base thermal management fixture and is removed from the thermal management system, flowing cooling fluid from the first thermal management body, received from the cooling fluid source, to a second base thermal management fixture in fluid communication with the first base thermal management fixture, the second base thermal management fixture is configured to receive and hold a second electrically-powered device in a second targeted area, wherein the second base thermal management fixture comprises internal features configured to direct said cooling fluid received from said first base thermal management fixture toward said second targeted area.

These and other further features and advantages of the invention would be apparent to those skilled in the art from the following detailed description, taken together with the accompanying drawings, wherein like numerals designate corresponding parts in the figures, in which:

BRIEF DESCRIPTION OF THE DRAWINGS

FIG. 1H is an isometric view of another embodiment incorporating features of the present disclosure;

FIG. 1I is an isometric view of another embodiment incorporating features of the present disclosure;

FIG. 1J is an isometric view of another embodiment incorporating features of the present disclosure;

FIG. 1K is an isometric view of another embodiment incorporating features of the present disclosure;

FIG. 1L is an isometric view of another embodiment incorporating features of the present disclosure;

FIG. 1M is an isometric view of another embodiment incorporating features of the present disclosure;

FIG. 1N is an isometric view of another embodiment incorporating features of the present disclosure;

FIG. 2A is an angular cross-sectional view of another embodiment of the embodiment of FIG. 1A;

FIG. 5E an isometric view of a normal operating position of a multi-station rotary head incorporating features of the present disclosure;

FIG. 5F an isometric view of a different rotary position of the multi-station rotary head of FIG. 5E;

FIG. 5G an isometric view of a different rotary position of the multi-station rotary head of FIG. 5E;

FIG. 5H an isometric view of a different rotary position of the multi-station rotary head of FIG. 5E;

FIG. 5I shows the multi-position rotary head of FIG. 5H positioned at an angle of $\psi 3$ with respect to the index shown in FIG. 5H;

FIG. 5J shows the multi-position rotary head of FIG. 5H positioned at an angle rotated to the $\Omega$ lens cleaning starting position;

FIG. 5K shows a different aspect for the rotation of the multi-position rotary head of FIG. 5H through the arbitrary angle of $\Omega$;

FIG. 6C is a cross cut sectional view of the embodiment of FIG. 6A;

FIG. 6E is an expanded isometric view of the embodiment of FIG. 6A;

FIG. 6F is an expanded isometric view of the embodiment of FIG. 6A, with additional features added;

FIG. 6I is the top view shown in FIG. 6H with the lens holder body feature removed;

FIG. 6J is an isometric view of the of the embodiment of FIG. 6H with the lens holder body shown in a fully closed position;

FIG. 6N is an isometric view of the embodiment of 6L;

FIG. 6O is another isometric view of the embodiment of 6L, except integrating automated features from FIG. 6N;

FIG. 7E is an off axis elevated view of the embodiment of FIG. 7A;

DETAILED DESCRIPTION

Figure 1A:
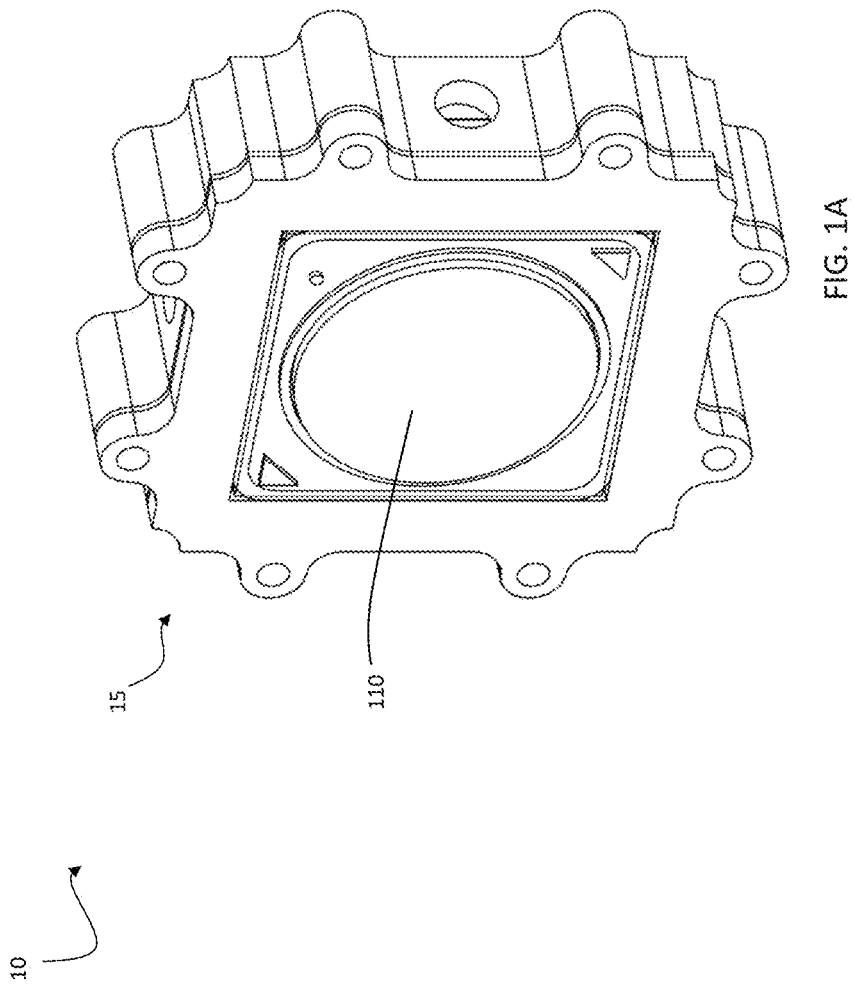
FIG. 1A shows a front perspective view of an embodiment incorporating features of the present disclosure.

In the following detailed description, numerous specific details are set forth in order to provide a more thorough understanding of embodiments incorporating features of the present disclosure. However, it will be apparent to one skilled in the art that the present invention can be practiced without necessarily being limited to these specifically recited details. In other instances, well-known structures and devices are shown in block diagram form, rather than in detail, in order to better describe embodiments incorporating features of the present invention.

Systems and methods incorporating features of the present disclosure can utilize one or more base thermal management fixtures, which can be configured to receive and/or securely hold one or more electrically-powered devices, for example, a light-emitting device or a microprocessor, but it can be any device powered by electricity that can benefit from thermal management. The base thermal management fixtures can be configured to receive the electrically-powered device by any known structure and can comprise a device recess with dimensions accommodating or corresponding to a particular device, and/or can comprise clips, adhesives, fastening structures or other structural features to connect an electrically-powered device to the base thermal management fixture.

The portion of the base thermal management fixture that is configured to receive the electrically-powered device can define a targeted area. The base thermal management fixture can comprise internal components such as channels, internal walled structures and impingement heads, as is described in more detail herein. The base thermal management fixtures can be put in fluid communication with a source of cooling fluid, for example, air or gas, and can receive the cooling fluid such that it flows through the internal components and is directed to impinge upon the targeted area and thus the electrically-powered device.

After the cooling fluid impinges upon the electrically-powered device and absorbs heat from it, the heated cooling fluid can be directed to an exit port by the internal components and the heated fluid flushed from the system.

In systems and methods incorporating features of the present disclosure, multiple base thermal management fixtures can be connected in parallel, wherein each individual base thermal management fixture in the system receives its own cooling fluid supply, or they can be connected in a serial, cascading fashion, wherein each subsequent instance of a base thermal management fixture receives cooling fluid from the fixture before it in fluid communication. In the embodiments utilizing this serial configuration, the cooling fluid that has been directed to impinge on a connected electrically-powered device and which has absorbed heat can be expelled from the base thermal management fixture after it has impinged, thus not passing on heated cooling fluid to a further base thermal management fixture. In these serial embodiments the only cooling fluid received by a base thermal management fixture from a previous base thermal management fixture would be cooling fluid that has not impinged on an electrically-powered device and absorbed heat.

One advantage of the disclosed thermal management system is that the impingement configuration can obviate the need for extensive heat sinks, which can require expensive frames made of metal or other costly materials to support. The disclosed base thermal management fixtures can be manufactured with cheaper, lightweight materials such as plastics, saving on cost and management costs associated with transporting and maintaining bulky, heavy, costly metal frames.

Throughout this description, the preferred embodiment and examples illustrated should be considered as exemplars, rather than as limitations on the present invention. As used herein, the term "invention," "device," "present invention," or "present device" refers to any one of the embodiments of the invention described herein, and any equivalents. Furthermore, reference to various feature(s) of the "invention," "device," "present invention," or "present device" throughout this document does not mean that all claimed embodiments or methods must include the referenced feature(s).

Furthermore, any element in a claim that does not explicitly state "means for" performing a specified function, or "step for" performing a specific function, is not to be interpreted as a "means" or "step" clause as specified in 35 U.S.C. § 112, for example, in 35 U.S.C. § 112(f) or pre-AIA 35 U.S.C. § 112, sixth paragraph. In particular, the use of "step of" or "act of" in the claims herein is not intended to invoke the provisions of 35 U.S.C. § 112.

It is also understood that when an element or feature is referred to as being "on" or "adjacent" to another element or feature, it can be directly on or adjacent the other element or feature or intervening elements or features may also be present. It is also understood that when an element is referred to as being "attached," "connected" or "coupled" to another element, it can be directly attached, connected or coupled to the other element or intervening elements may be present. In contrast, when an element is referred to as being "directly attached," "directly connected" or "directly coupled" to another element, there are no intervening elements present.

Where used, relative terms such as "left," "right," "front," "back," "top," "bottom"" "forward," "reverse," "clockwise," "counter-clockwise," "outer," "inner," "above," "upper," "lower," "below," "Horizontal," "vertical," and similar terms, have been used for convenience purposes only and are not intended to imply any particular fixed direction. Instead, they are used to reflect relative locations and/or directions between various portions of an object.

Although the terms first, second, third, etc., may be used herein to describe various elements or components, these elements or components should not be limited by these terms. These terms are only used to distinguish one element or component from another element or component. Thus, a first element or component discussed below could be termed a second element or component without departing from the teachings of the present invention.

The terminology used herein is for describing particular embodiments only and is not intended to be limiting of the invention. As used herein, the singular forms "a," "an," and "the" are intended to include the plural forms as well, unless the context clearly indicates otherwise. It will be further understood that the terms "comprises," "comprising," when used herein, specify the presence of stated features, integers, steps, operations, elements, and/or components, but do not preclude the presence or addition of one or more other features, integers, steps, operations, elements, components, and/or groups thereof.

Embodiments of the invention are described herein with reference to different views and illustrations that are schematic illustrations of idealized embodiments of the invention. As such, variations from the shapes of the illustrations as a result, for example, of manufacturing techniques and/or tolerances are expected. Embodiments of the invention should not be construed as limited to the particular shapes of the regions illustrated herein, but are to include deviations in shapes that result, for example, from manufacturing.

It is understood that when a first element is referred to as being "between," "sandwiched," or "sandwiched between" two or more other elements, the first element can be directly between the two or more other elements or intervening elements may also be present between the two or more other elements. For example, if a first element is "between" or "sandwiched between" a second and third element, the first element can be directly between the second and third elements with no intervening elements or the first element can be adjacent to one or more additional elements with the first element and these additional elements all between the second and third elements.

As used herein, the term "cooling fluid" can include any fluid or combination of fluids that can perform the cooling function, for example a liquid, a gas or a combination thereof. In some embodiments the cooling fluid can comprise water. In some embodiments the cooling fluid can comprise water. In some embodiments, cooling fluid can comprise antifreeze-type substances, such as ethylene glycol or propylene glycol. In some embodiments the cooling fluid can comprise ambient air.

When describing the various specific embodiments incorporating features of the present disclosure, it is understood that the disclosed features of one embodiment can be utilized in any other embodiment unless a description of a particular embodiment explicitly states otherwise.

FIG. 1A depicts an embodiment incorporating features of the present disclosure showing a base thermal management fixture 10, comprising a thermal management device body 15, which is configured to receive an electrically-powered device 110. In the embodiment shown, the electrically-powered device 110 is a light, such as a solid state light, such as a light emitting diode (LED), however it is understood that any electrically-powered lights, for example, incandescent lights, or entire arrays of solid state lights or chip on board (COB) LED lights, can be utilized in embodiments incorporating features of the present disclosure. Indeed, in some embodiments, the base thermal management fixture 10 is configured to receive an electrically-powered device 110 that is not a light at all, but instead a different electrically-powered device. The electrically-powered device 110 can be any electrically-powered device that can benefit from the thermal management features of the present disclosure, for example, cooling needs. In some embodiments, the electrically-powered device 110 is a microprocessor or array or microprocessors, such as the microprocessor (or array of microprocessors) 111 shown schematically in FIG. 1BB (discussed more fully below).

The device body 15 can comprise any suitable shape or material capable of comprising the fluid pathways or performing the functions of fluid dynamic systems set forth in the present disclosure. For example, the body 15 can comprise the shape of any regular or irregular polygon. Some example materials the body 15 can comprise include, but are not limited to: plastics, polyvinyl chloride (PVC), metal, wood, and combinations thereof. In some embodiments, the body 15 comprises waterproof or water-resistant materials; in such embodiments, this provides the advantage of protecting the body 102 against operational wear and tear in systems utilizing a liquid cooling fluid.

Figure 1B:
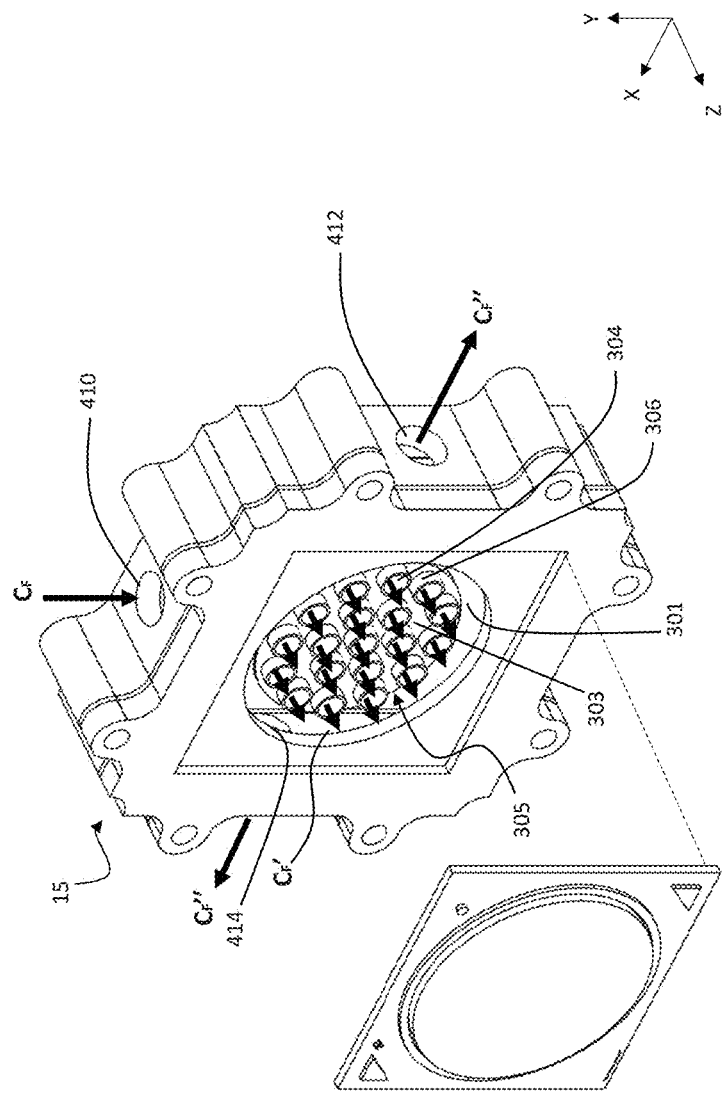
FIG. 1B is a semi-exploded front perspective view of the embodiment of FIG. 1A, and FIG. 1BB is a semi-exploded front perspective view of an alternative embodiment.
Figure 1B:
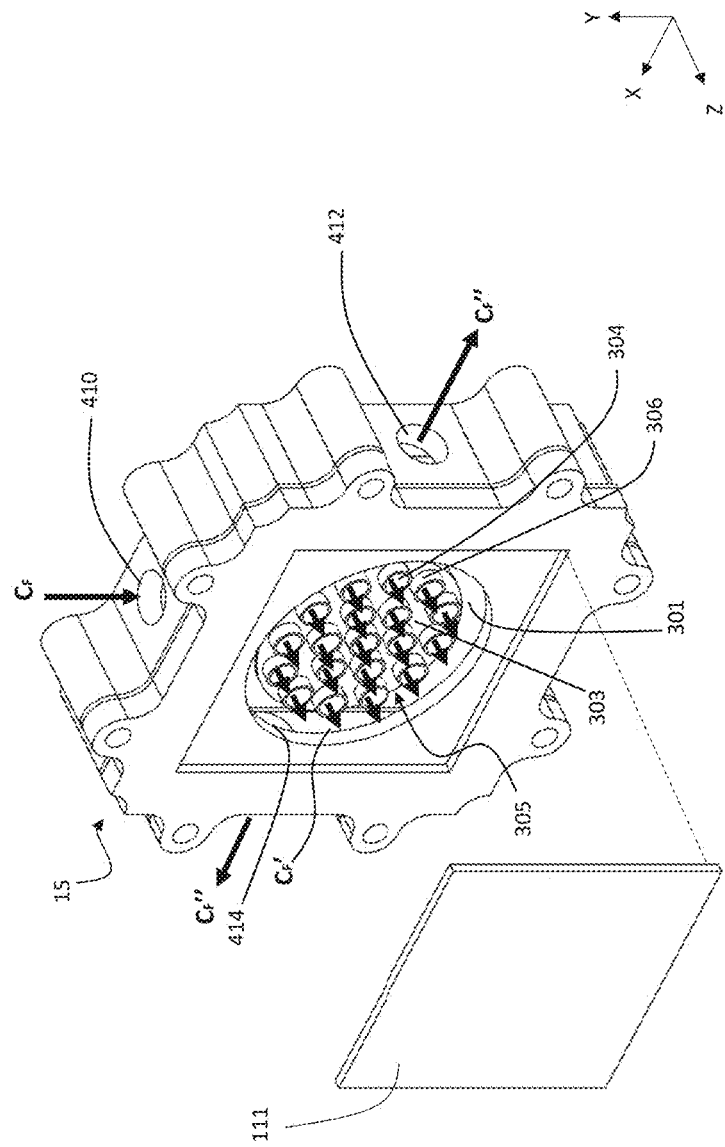

FIG. 1B is an off-axis view of the thermal management fixture 10 of FIG. 1A, showing the body 15 further comprising an impingement head 305. This impingement head 305 can be formed as an integral part of the body 15 (as shown), or can be a separate feature integrated into, or separately-contained within the body 15. In the embodiment shown, the impingement head 305 comprises a shower-head style thermal management feature positioned to direct cooling fluid CF, such as a liquid or gas, toward the electrically-powered device 110, such as toward the rear and/or substrate of the electrically-powered device 110. For example, in some embodiments, the impingement head 305 can be positioned in other positions that also allow the cooling fluid CF to be directed toward the electrically-powered device 110, for example, the impingement head 305 can be positioned above or lateral to the electrically-powered device 110. In some embodiments, the impingement head 305 can be configured to rotate, vibrate, or otherwise move to further enhance, alter or further customize the distribution of cooling fluid from the impingement head. FIG. 1BB shows the same view, but with the microprocessor (or array of microprocessors) 111.

Cooling fluid CF can be introduced into the main body interior through a cooling fluid input aperture 410. In systems utilizing multiple base thermal management fixtures 10, the cooling fluid CF can be introduced into individual instances of separate thermal management fixtures 10, through piping connected to each of the thermal management features respective input apertures 410 in a parallel-style fashion. In other embodiments, the separate thermal management structures can be fluidly connected in a serial or cascading fashion wherein each subsequent instance of the thermal management fixtures 10 are configured to receive cooling fluid CF from the preceding thermal management fixture, which is fluidly connected upstream. In these cascading embodiments, heated waste fluid, which has already absorbed heat from, and therefore cooled, the electrically-powered device 110 can be expelled from the thermal management fixture 10, such that the downstream fluidly-connected thermal management fixture can receive cooling fluid CF from the upstream fluidly connected thermal management fixture, without receiving heated cooling fluid, that has already absorbed heat from an electrically-powered device. After cooling fluid CF is introduced into the body 15 of the thermal management fixture 10 via the input aperture 410, the cooling fluid CF can then be introduced to a channel forming egress wall 302 and the floor 303 of the main body interior. This forms an internal cooling fluid reservoir (shown in more detail in FIG. 1C), so that the cooling fluid CF' is forced out of the impingement head 305 impinging on the electrically-powered device 110. In embodiments wherein the electrically-powered device 110 is a light, the electrically-powered device can be configured such that the heat that's generated from the light will exit the backside of the electrically-powered device 110 and the light will exit the front emitter side of the electrically-powered device 110.

The cooling fluid CF' can be configured to emerge from one or more orifices 304, which impingement head 305 can comprise. The cooling fluid CF' can be configured to impinge on the electrically-powered device 110, for example, on the backside of the electrically-powered device 110 as shown in FIG. 1B, and can carry the heat away and exit through the one or more cooling fluid exit ports (two shown, 412 and 414). The exiting heated waste cooling fluid is designated CF". The heated waste cooling fluid CF", can travel to the exit port 414 and/or the exit port 412 by moving to the floor 303 of the impingement head 305 and can exit the respective cooling fluid exit apertures 414 and 412.

Figure 1C:
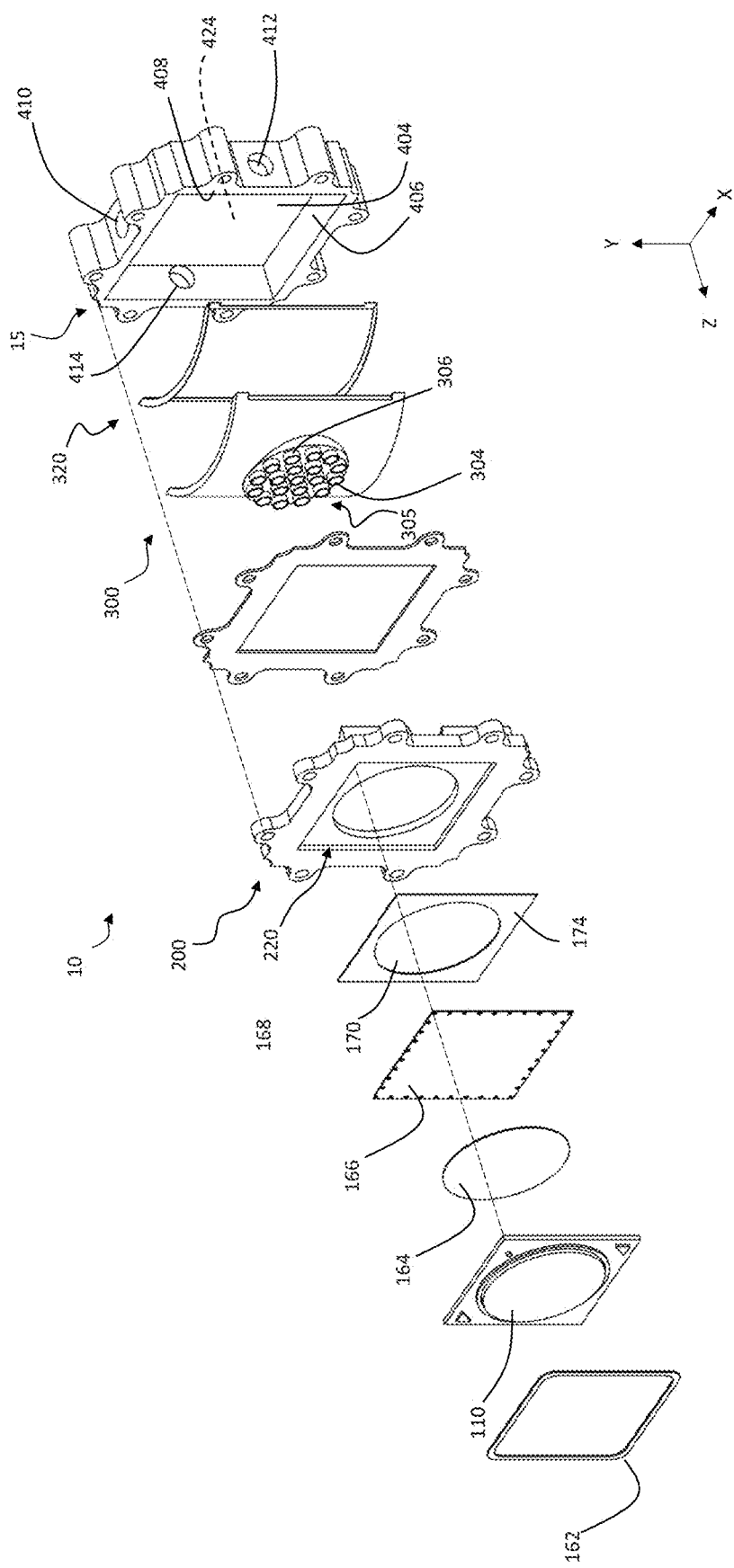
FIG. 1C is an exploded view of the embodiment of FIG. 1A.

FIG. 1C is an exploded view of the embodiment of FIG. 1A, showing the base body 15 of a base thermal management fixture 10, configured to receive an electrically-powered device 110. In the embodiment shown, the base body 15 is configured to receive the electrically-powered device 110, within a device recess 220. The thickness or depth of the device recess 220 can be determined by the thick of the side wall 140 of the electrically-powered device 110 and/or the depth of the electrically-powered device 110. The electrically-powered device-holding assembly portion 200 is an optional portion of the thermal management fixture 11, that can enable easier connection and removal of the electrically-powered device 110 to the body 15. Instead of having to directly install and remove the electrically-powered device to and from the body 15, electrically-powered devices can be pre-connected to the device-holding portion 200, which can function as an intermediate connection between the electrically-powered device 110 and the body 15 and can comprise features facilitating connection to the body 15, allowing for easier replacement or interchangeability of electrically-powered devices to the body 15.

While in FIG. 1C the electrically-powered device 110 is shown as connecting to the device-holding assembly portion 200 of the body, which in turn is connected to base body 15, in other embodiments the base body 15 itself can be configured to directly connect to and accept the electrically-powered device 110, for example the base body 15 can comprise a device recess, like device recess 220.

FIG. 1C further shows optional features that can improve device function in certain embodiments. For example, in embodiments utilizing a liquid cooling fluid, the base thermal management fixture 10 can comprise optional features such as a seal 162, for example an elastomeric seal, an anti-erosion material 164, and/or a thermal transfer material 166. FIG. 1C further shows the embodiment comprising an optional bonding material assembly 168 comprising an opening 170 that would allow cooling fluid to impinge on the backside of the electrically-powered device 110. The surface of the bonding material assembly 168 is represented by the front face 174, which can be be applied to the backside of the electrically-powered device, for example as though it were a silkscreen process. This is one of multiple methods of applying the bonding material to the backside of the electrically-powered device 110; any method of adhesion or connection that is known in the art may be utilized. Although the optional anti-erosion material 164 shown in FIG. 1C is a circle it may also be any different geometry to accommodate any anti-erosion purpose, for example any regular or irregular polygon, and may also have epoxy or another bonding material applied to its surface so as to secure it to the backside of the electrically-powered device 110.

Also shown in FIG. 1C, the base body 15 can comprise within itself a channelizer assembly 300. In the embodiment shown, the base thermal management fixture 10 comprises a connection feature 320, which schematically represents a bonding line that will connect the channelizer assembly 300 to the inside portion 404 of the base body 15. The connection feature 320 creates a fluid tight cavity that is shown in FIG. 1C as a dashed line that will form a cooling fluid reservoir 424. The cooling fluid reservoir 424 receives cooling fluid through aperture 410, and will force the cooling fluid through the apertures 304 of the impingement head 305. Then the cooling fluid CF' that has extracted the heat from the backside 114 now exits as CF". In some embodiments, the aperatures 304 can comprise further features to direct the flow of cooling fluid, for example to prevent the mixture of different types of cooling fluid CF, CF', CF". In Some embodiments, the apertures can comprise one-way valves.

Figure 1D:
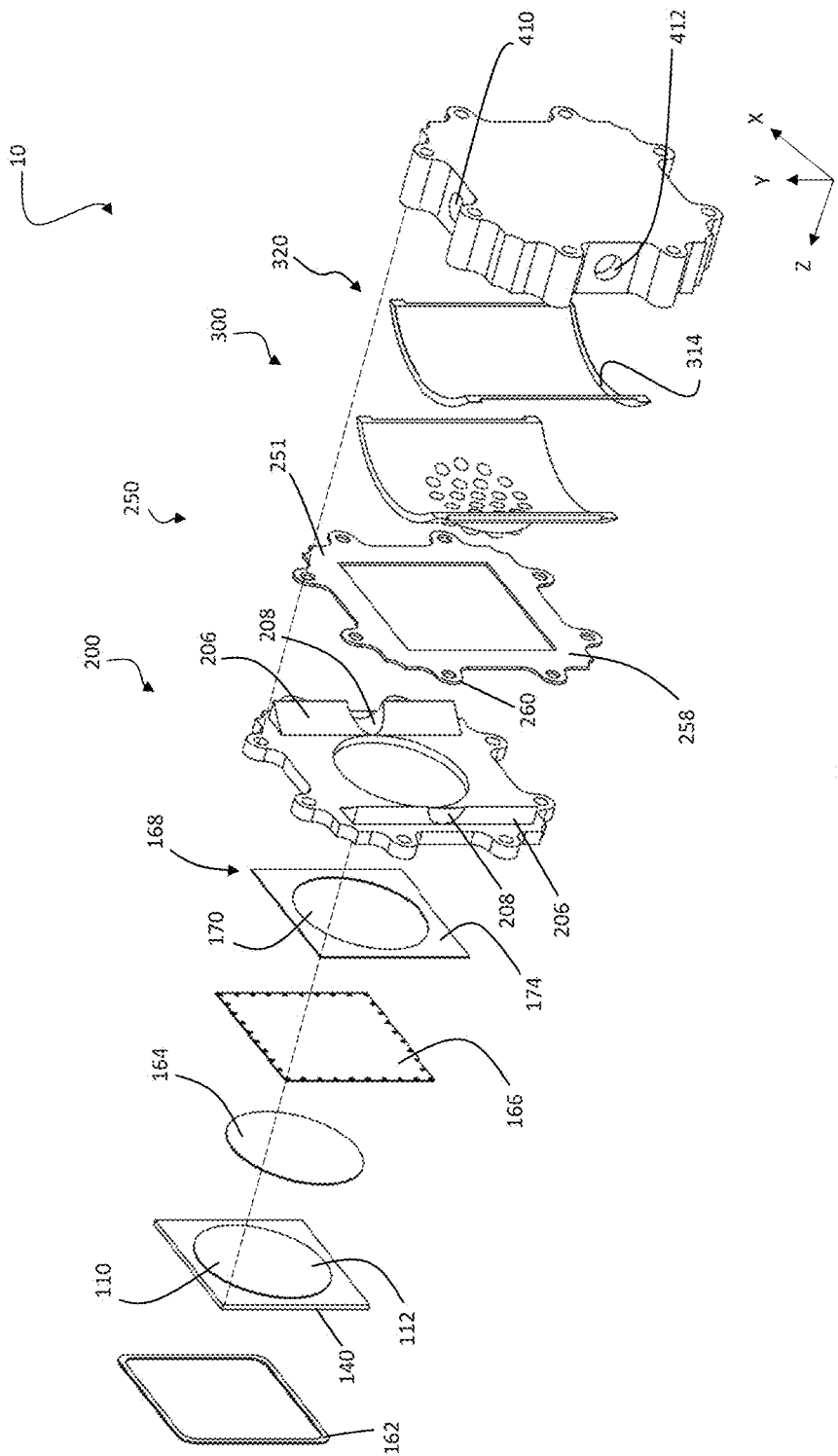
FIG. 1D is an exploded, elevated rear isometric view of the embodiment of FIG. 1A.

FIG. 1D is an exploded, elevated rear isometric view of the thermal management fixture 10 of FIG. 1C, wherein reference numbers utilized in FIG. 1C have been included to fully illustrate the thermal management fixture 10. FIG. 1D further shows the optional added feature of a channel-forming surface 206 with the complimentary surface curvature of the channelizer fixture 300. Combined, these two surfaces form a channel, guiding cooling fluid to proceed to exiting apertures 412, and 414 (414 not show in FIG. 1D), respectively. The channel-forming surface 206 can comprise one or more apertures 208 (two shown, one in each instance of the channel forming surface 206). The apertures 208 can be formed to direct cooling fluid to flow to the exiting apertures 414 and 412.

Figures 1E, 1F:
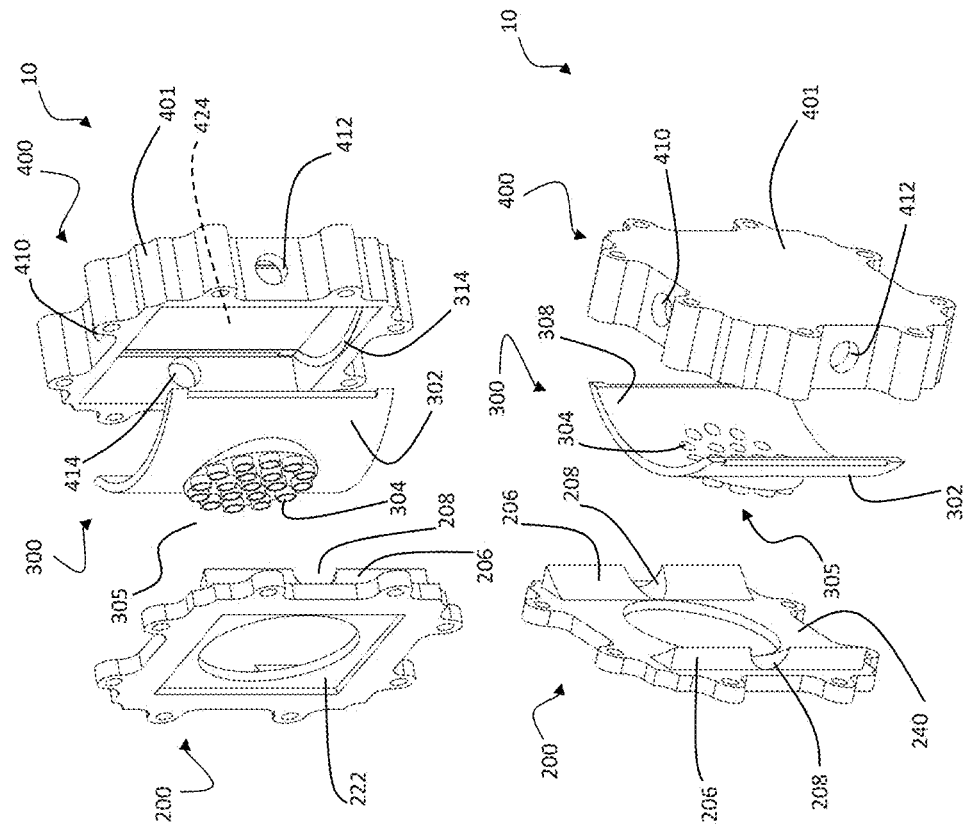
FIG. 1E is an exploded, elevated rear isometric view of the embodiment of FIG. 1A.
FIG. 1F is an exploded, elevated rear isometric view of the embodiment of FIG. 1A.

FIGS. 1E-1F show additional views of the base thermal management fixture 10 shown in FIGS. 1A-1D above, wherein reference numbers utilized in FIGS. 1A-1D have been included to fully illustrate the thermal management fixture 10. FIG. 1E is an elevated exploded front view of the components that form a channelizer body assembly; comprising the device-holding assembly portion 200, the channelizer fixture 300, and the impingement head 305.

FIG. 1F is an elevated rear view showing the components that form the channelizer body and the backside of the channelizer fixture 300. Also shown in FIG. 1F are the apertures 304 that provide a pathway for the cooling fluid that will flow through the impingement head 305. This view shows the channel forming feature 206 on the backside of the device-holding assembly portion 200, with an aperture 208 that directs cooling fluid to the exit aperture 412 and exit aperture 414. The curved surface 302 of the channelizer fixture 300 and the complementary channel forming feature 206 direct the cooling fluid to the exit aperture 412 and exit aperture 414. Two exit apertures were chosen to allow for rapid removal of the cooling fluid. This also helps minimize the size of the base body 15. The curvature of the channel forming feature 206 provides a maximum diameter for the exit aperture 414 and exit aperture 412.

Figure 1G:
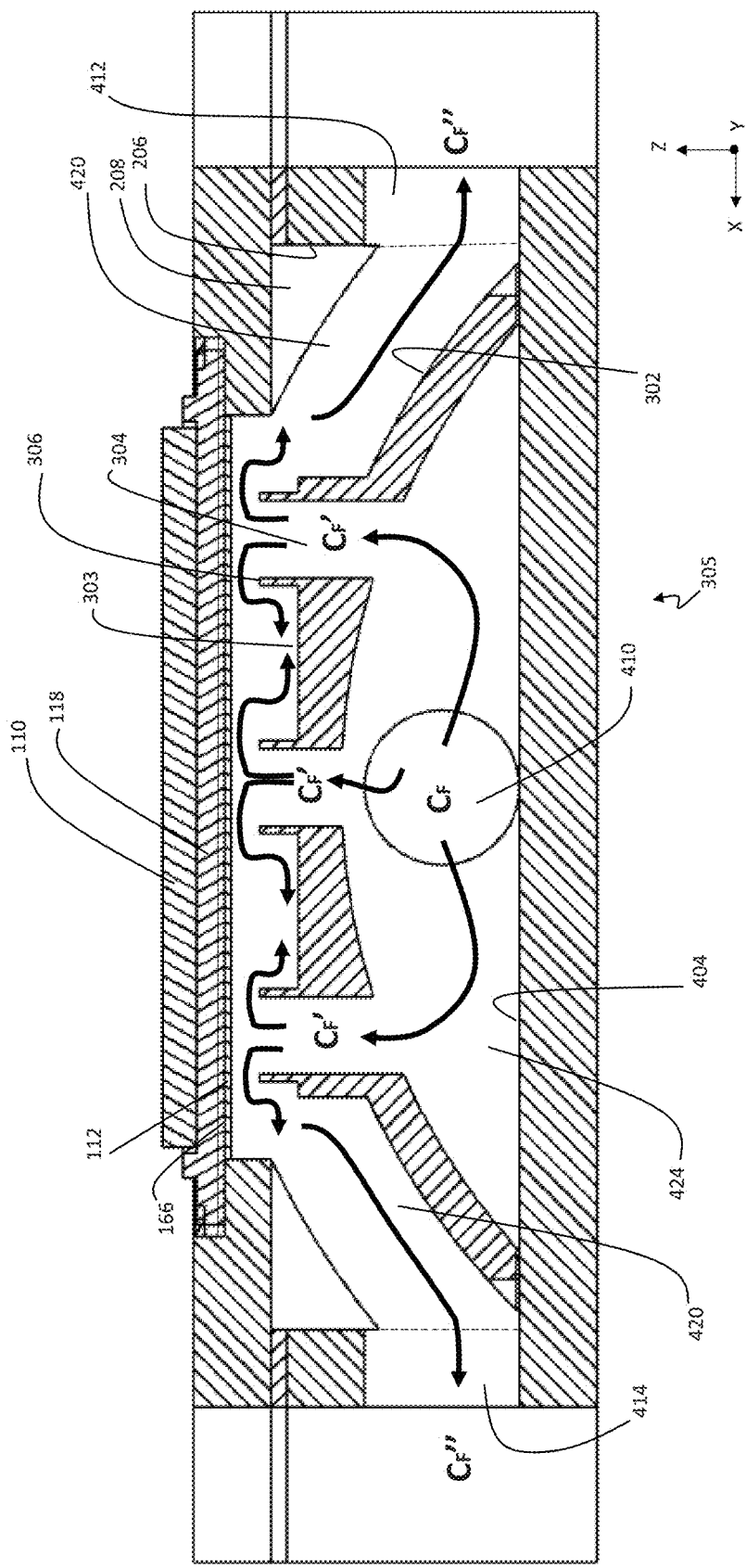
FIG. 1G is a front sectional view of the embodiment of FIG. 1A.

FIG. 1G shows the internal pathways for the cooling fluid CF that is introduced through the input aperture 410. After the cooling fluid CF enters into the cooling fluid reservoir 424 of the channelizer body assembly 450 it becomes CF' and flows through the channel apertures 304. The cooling fluid CF' is directed to and impinges on the thermally active region 112 of the COB assembly 100. Having impinged on a targeted area 112 corresponding to a portion at or near the electrically-powered device 110, in FIG. 1G, this targeted area 112 corresponds to a the thermally active region of the device. The cooling fluid then is denoted as waste cooling fluid CF" (it now has removed heat from the electrically-powered device 110) and exits the impingement head 305 by moving to the floor 303 of the impingement head 305 and snakes around the aperature walls 306 eventually making its way to the channel egress 420 formed by the channelizer surface 206, the partial aperture 208 and the curved surface 302 of the channelizer fixture 300. The waste cooling fluid CF" exits through the exit apertures 412, 414. In some embodiments, the cooling fluid exit aperture 414 and cooling fluid exit aperture 412 as well as the input cooling fluid aperture 410 may have threaded features, connected fittings and self-threaded fittings. As can be seen in FIG. 1G the cooling fluid reservoir 424 can be formed by the channelizer fixture 300 being affixed to the floor 404 and sidewalls 402.

The impingement cooling head 305 through the various apertures provided forces the cooling fluid CF to impinge on the backside of the electrically-powered device 110. The cooling fluid CF removes the heat from the thermally active region 112. The heat generated by the LED die 150 emanates through various features provided by the manufacturer to direct the heat to the backside 114 or the thermally active region 112.

FIGS. 1H-1N set forth alternate channelizer fixture embodiments that can be integrated into the disclosed embodiments herein, for example, in lieu of utilizing the channelizer fixture 300 of FIG. 1A above. FIG. 1H is an isometric view of a channelizer fixture 370, which is similar to the channelizer fixture 300, set forth above. However, this channelizer fixture 370 has walled portions in the form of cooling nipples 376 that direct the flow towards a surface that requires heat to be extracted from it. Channelizer fixture 370 has a series of cooling nipples 376 comprising an aperture 374 where cooling fluid CF' emanates from. Upon reaching the surface to be cooled the cooling fluid CF" flows in-between the cooling nipples 376 as shown by cooling path between cooling nipples 376 represented by inter-nipple pathway 373 and moves to the curved egress wall 372 over the curved surface 372 that forms part of the channelized wall that will form the exit channel 420 as seen in the previous FIG. 1G. The difference here is that there is no plateau floor such as floor 303 from the previous FIG. 1G, so the cooling fluid CF" follows a cylindrical face or curvature 372 two begin its egress through the channels 373 formed by the group of nipple walls 376.

FIG. 1I shows a channelized fixture 380 with linear channelized apertures 384 formed by nipple walls 386 that emanate from a floor 383, or a plateau 383, provides a pathway for the cooling fluid CF" to flow as it begins its egress through the curved feature 382, similar to that of 302 in the previous examples. The curved feature 382 in conjunction with the channelized feature 206 as discussed with regard to FIG. 1D above, will form a channel 420 that directs the flow of the cooling fluid CF" to the exit apertures 414 and 412, respectively.

FIG. 1J shows a planarized channelizer aperture 390 that comprises a pedestal 397 with a cooling fluid aperture 394 and multiple exit apertures 395. The cooling fluid CF' emerges from the cooling fluid aperture 394 and is constrained against the object it is cooling. This allows the cooling fluid CF' to interact with the electrically-powered device to be cooled. The cooling fluid CF" then exits through any of the exit apertures 395 on the face of the pedestal 397 or it cascades over the edge of the pedestal 397. Cooling fluid CF" exiting the exit apertures 395 flows onto the floor 393 and egresses across the sloping curvature face 392. The curvature feature 392 coupled with the channelizer feature 206 of the COB mounting bracket 200 form a channel 420 that directs the flow of the cooling fluid CF" to the exit apertures 414 and 412 respectively.

FIG. 1K shows a planarized multiple pedestal channelizer 360 that is comprised of multiple pedestals 365 and multiple cooling fluid apertures 364. The cooling fluid CF' emerges from the cooling fluid apertures 364 and is constrained against the object it is cooling. The pedestals 365 allows the cooling fluid CF' to interact with the object to be cooled. The cooling fluid CF" then flows off the face of the pedestals 365. Cooling fluid CF" exiting flows onto the floor 363 and egresses across the sloping curvature face 362. The curvature feature 362 coupled with the channelizer feature 206 discussed with regard to FIG. 1D above form a channel 420 that directs the flow of the cooling fluid CF" to the exit apertures 414 and 412 respectively.

FIG. 1L shows a slit channelized aperture fixture 350, comprising a series of roughly parallel circumferentially slotted apertures 354. These apertures can be circumferentially aligned along the curved egress wall 352. This slit channelized aperture fixture 350 can be used in a spray head application where the cooling fluid CF' emanating from the circumferentially slotted apertures 354 impinge on the object to be cooled and flows to the edges making way for new cooling fluid CF' impingement. The curvature feature 352 coupled with the channelizer feature 206 of the COB mounting bracket 200 form a channel 420 that directs the flow of the cooling fluid CF" to the exit apertures 414 and 412 respectively.

FIG. 1M shows the multiple channelizer fixture 300, which is similar to the channelizer fixture 300 discussed above with reference to FIG. 1D, wherein like reference numbers are utilized to denote like features. The channelizer fixture 300 comprises a channelizer main body 301, a curved egress wall 302, a channelizer floor 303, channelizer nipple walls 306 with a channel aperture 304, where cooling fluid CF' will impinge on a surface in front of it to be cooled. The cooling fluid CF" quickly flows from the object to be cooled, to the channel floor 303 and is directed between the channelizer nipple walls 306 eventually to egress to the curved egress wall 302. The curvature feature 302 coupled with the channelizer feature 206 of the COB mounting bracket 200 form a channel 420 that directs the flow of the cooling fluid CF" to the exit apertures 414 and 412 respectively. A major difference between the channelizer fixture 303 in FIG. 1M and the chanalizer fixture 300 in FIG. 1D above is that the channelizer fixture 303 in FIG. 1M comprises nipple walls 306 that comprise a flexible structure that allows the nipple walls 306 to move while cooling fluid CF flows through then, allowing for a more widely-spread cooling fluid distribution to a targeted area.

FIG. 1N shows a multiple small aperture fixture 340 comprising multiple rectangular apertures 344 that are formed on the curved egress surface 342. These multiple rectangular apertures are formed into the fixture body 341 and are radially and cylindrically aligned. These multiple rectangular apertures 344 are not built atop a plateau as some have been in previous embodiments. In this configuration, the multiple rectangular aperture fixture 340 can be used in a direct spray configuration in front of the body that needs to be cooled and can be formed in a matching shape.

Most of the fixtures represented in FIG. 1H through FIG. 1N can have the complimentary shape of most objects that require cooling. They may comprise any suitable shape, including any regular or irregular polygon.

FIG. 2A is an angular cross-sectional view of the thermal management fixture 10 of FIG. 1A-1G above, wherein previous reference numbers have been included to more fully illustrate the structure. This angular cross-sectional view shows the channel-forming surfaces that form the exit channel 420, mainly, the channel-forming feature 206 and the curved egress slope 302. Also seen is the cooling fluid CF' reservoir 424 and a view of the channelizer floor 303. Cooling fluid CF' impinges on the thermally active region 112 of the electrically-powered device 110, and the cooling fluid CF" is forced to move to the channelizer floor 303 and follow a flow pattern that would be dictated by the channelizer walls 306 and flow to the exit channel 420 (shown in FIG. 1G above). The cooling fluid CF' may also impinge on the optional protective surface 164 (or in some embodiments, thermal transfer material 166).

Figure 2B:
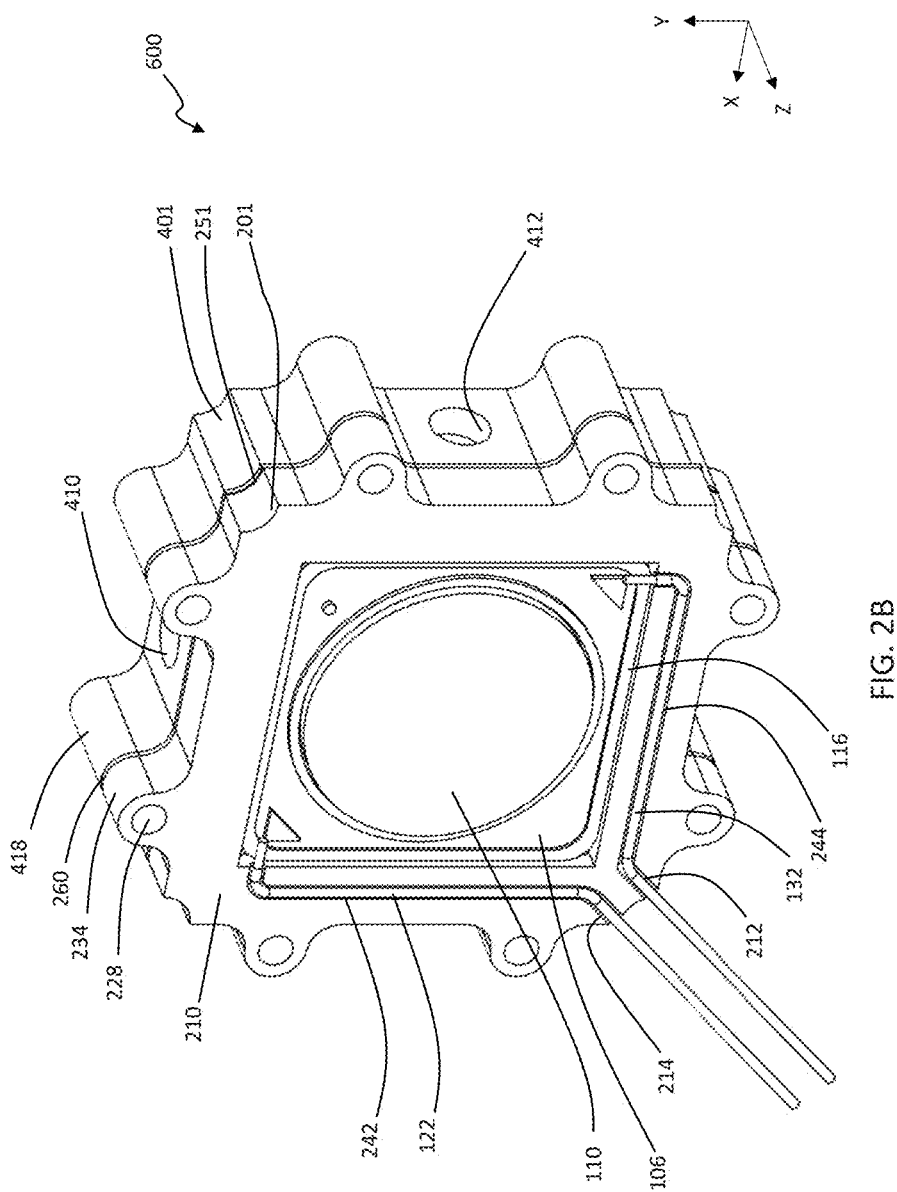
FIG. 2B is an off axis front perspective view of another embodiment incorporating features of the present disclosure.

FIG. 2B is an off axis front perspective view of another base thermal management fixture 600, which is similar to the base thermal management fixture 10, described in relation to FIGS. 1A-1G above, wherein like reference numbers denote like features, except that the base thermal management fixture 600 in FIG. 2B further comprises one or more recessed wiring channels. In this particular embodiment two are shown: a first recessed wire routing channel 242 and a second recessed wire routing channel 244. In order to facilitate the curved path of the multiple wire routing channels, the short wire routing channel recess 214 and wire routing channel recess 212 can be optionally included. In certain electrically-powered devices 110, the recessed wire routing channel 242 can secure a cathode power wire 122 and hold it securely and the recessed wire routing channel 244 can secure the anode power wire 132 and hold it securely.

Figure 3:
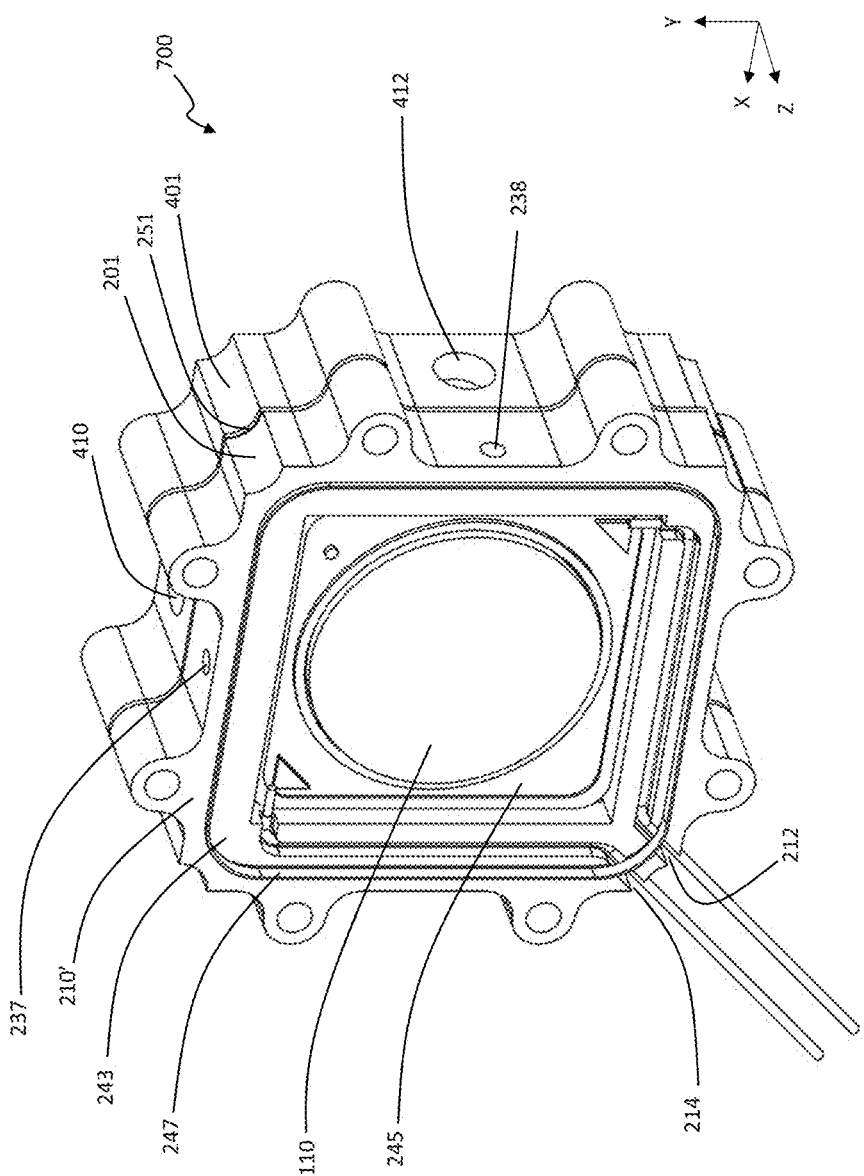
FIG. 3 is an off axis front perspective view of another embodiment incorporating features of the present disclosure.

FIG. 3 is an off axis front perspective view of a base thermal management fixture 700, similar to the base thermal management fixture 10 in FIGS. 1A-1G, but comprising one or more additional added features. To further advance a clean environment for the dust free operation of the electrically-powered device 110, the thermal management fixture 700 can comprise a window aperture 243. This window aperture 243 will accommodate an acceptable material to act as a window 245, that protects the electrically-powered device 110. The window material can comprise any material suitable for operation of the electrically-powered device, for example, in embodiments wherein the electrically-powered device 110 comprises a light, the window material can comprise a material that it is sufficiently transparent to all of the required wavelengths emitted by such a light. The window 245 may also comprise a lens (not shown), that has an appropriate curvature that is suitable to any lighting requirements, also a low loss material to all of the wavelengths emitted by the COB assembly 100.

The base thermal management fixture 700 can further comprise aperture 237 and aperture 238. These two apertures are aperture through-holes that will allow a fluid, for example, a gas, to be introduced into the cavity formed by the window 245 and the internal structures within the window recess 243, that will allow a cooling fluid CF to circulate by introducing it through the aperture 237 and exiting the through aperture 238. In the region of the short wire channel recesses 214 and 212 respectively, there can be a small amount of leakage that passes through those channels along with their respective wires, to keep air moving, dust out, and cool the active surface 110 of the COB assembly 100.

Figure 4A:
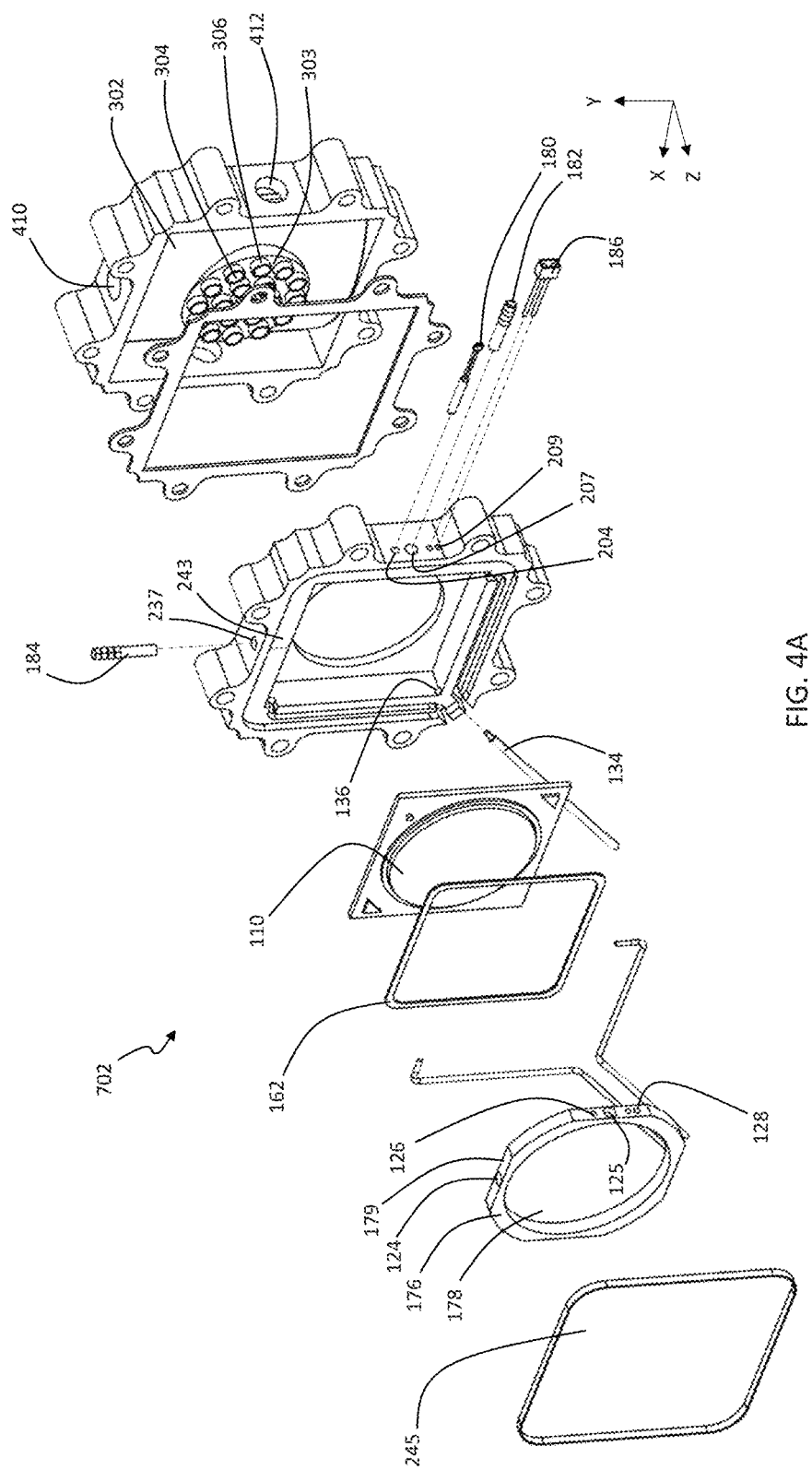
FIG. 4A is an exploded isometric view of another embodiment incorporating features of the present disclosure.

FIG. 4A is an exploded isometric view of a base thermal management fixture 702, similar to the base thermal management fixture 700 in FIG. 3 above, wherein like reference numbers are utilized to denote like features. However, the base thermal management fixture 702 in FIG. 4A further comprises additional features, including sensor access ports in the form of aperture through-hole 204 which can be configured to hold a thermocouple 180. Aperture through-hole 207 can be configured to hold an exit cooling fluid pipe bib 182 and aperture 209 can be configured to hold a two wire liquid sensor 186. The aperture through-hole 237 can be configured to hold a cooling fluid pipe bib 184. The base thermal management fixture 702 can further comprise an additional sensor in the form of a ground wire 134 that has a through-hole 136 formed in the body of the base thermal management fixture 702. This ground wire 134 can be used to sense a current fault when connected to the system if there is a cooling fluid leak that would actuate a current sensor (not shown) to protect the operators and/or the equipment. The base thermal management fixture 702 can further comprise a multipurpose fixture 176, to act as a current sensor, to sense if there is a breach in the seal 162, or any other facet of a leak that would involve a dangerous current.

The multipurpose fixture 176 can further act as a reflector to reflect or thermally deflect any damaging radiation that may result in thermal overload in the system, until the temperature sensor or the thermocouple 180 senses a thermal runaway. The multipurpose fixture 176 can comprise one or more through-holes, in this embodiment shown, two: through-hole 124 and through-hole 125, to accommodate their respective cooling fluid pipe bib 184 and cooling fluid pipe bib 182 to deliver the appropriate cooling fluid to the inside aperture 178. The multiple purpose fixture 176 can further comprise one or more through-holes to accommodate the thermocouple 180 through a through-hole 126 as well as a pair of through-holes 128 to accommodate the liquid sensor 186. The thermal couple 180 can be inserted until it reaches the inside aperture 178 of the multipurpose fixture 176. Likewise, the aperture through-hole pair 209 and aperture through-hole pair 128 align when in operational form and provide a path for the insertion of the liquid detector 186. Aperture through-hole 237 and aperture through-hole 124, form a path when aligned in operational form and provides a path, so that the cooling fluid pipe bib 184 can connect to the inside aperture 178 of the multipurpose fixture 176. Correspondingly, aperture through-hole 207 and aperture through-hole 125 are aligned when in operational form and provide a path for securing the cooling fluid pipe bib to the inside aperture 178 of the multipurpose fixture 176.

Figure 4B:
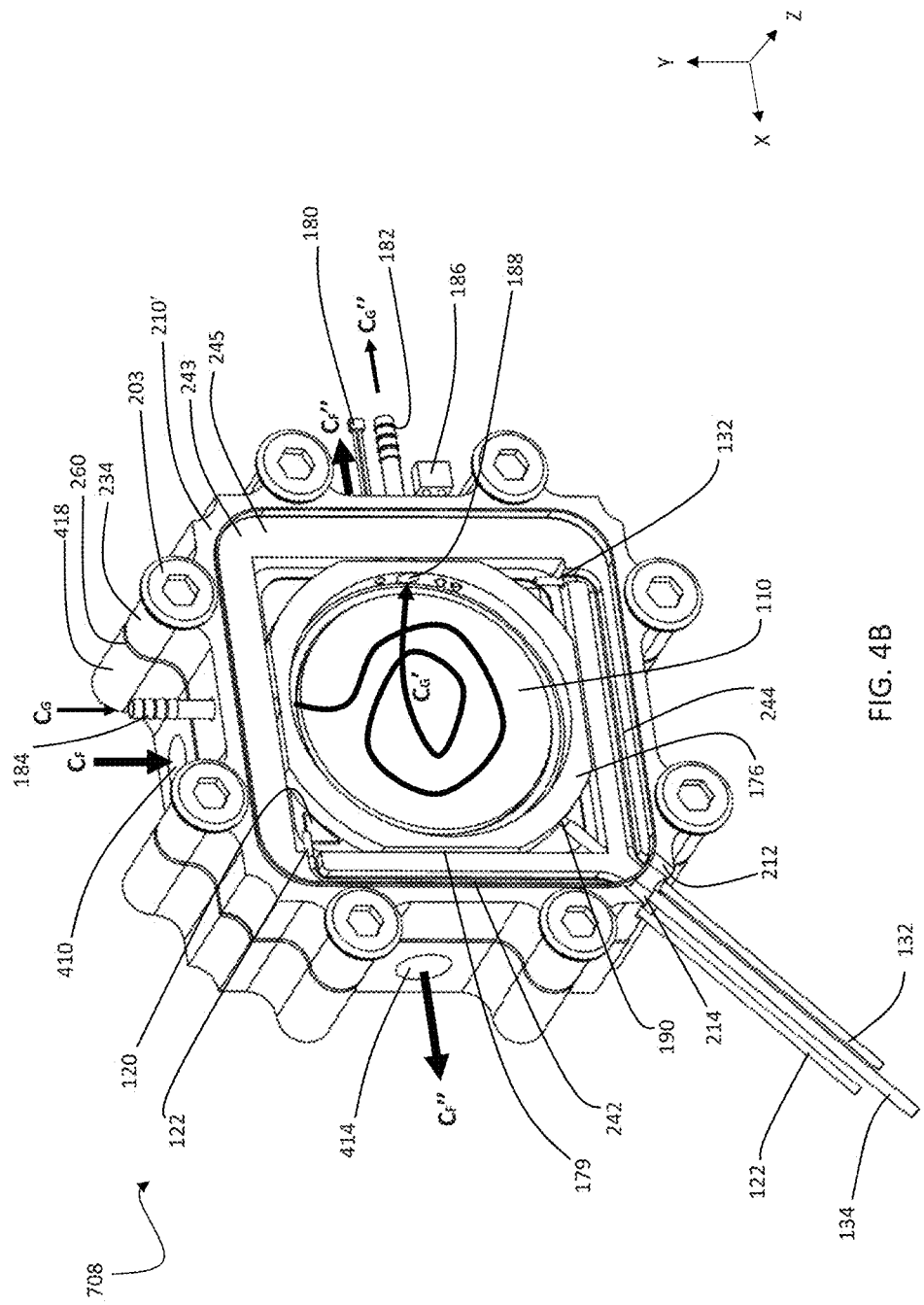
FIG. 4B, is an isometric front perspective of another embodiment incorporating features of the present disclosure.

FIG. 4B, is an isometric front perspective view that shows a base thermal management fixture 708, similar to the base thermal management fixture 700, discussed with regard to FIG. 3 above, wherein like reference numbers are used to denote similar features and to further illustrate the embodiment. In addition to the main cooling fluid input 410 and cooling fluid output 414, wherein the cooling fluid CF can comprise any suitable cooling fluid, for example, a liquid or a gas, this embodiment employs the use of a secondary specifically gas-based cooling fluid CG that can be configured to cool a different portion of the electrically-powered device. The gas can be selected for cooling properties or temperature or can be from the ambient. If the main cooling fluid CF comprises a liquid and is configured to cool the backside of an electrically-powered device, the cooling gas CG can comprise a gas and be configured to cool the opposite front portion of an electrically-powered device. As is shown in FIG. 3 and FIG. 4A., the window 245 can be used to protect the electrically-powered device to prevent debris from accumulating. The window 245 may also comprise a lens. Confinement of ambient gas inside the base thermal management fixture 708 could potentially lead to overheating and degraded performance of the electrically-powered device. By passing a cooling gas CG through the internal cavity of the base thermal management fixture 708, formed between the window 245 and the electrically-powered device 110, with positive or negative pressure the cooling gas CG entering the cooling gas input bib 184 can purge the heated gas CG', through the cooling gas output bib 182. In some embodiments, gas can be configured to migrate through the open short channel wire recesses 212, 214.

Figure 4C:
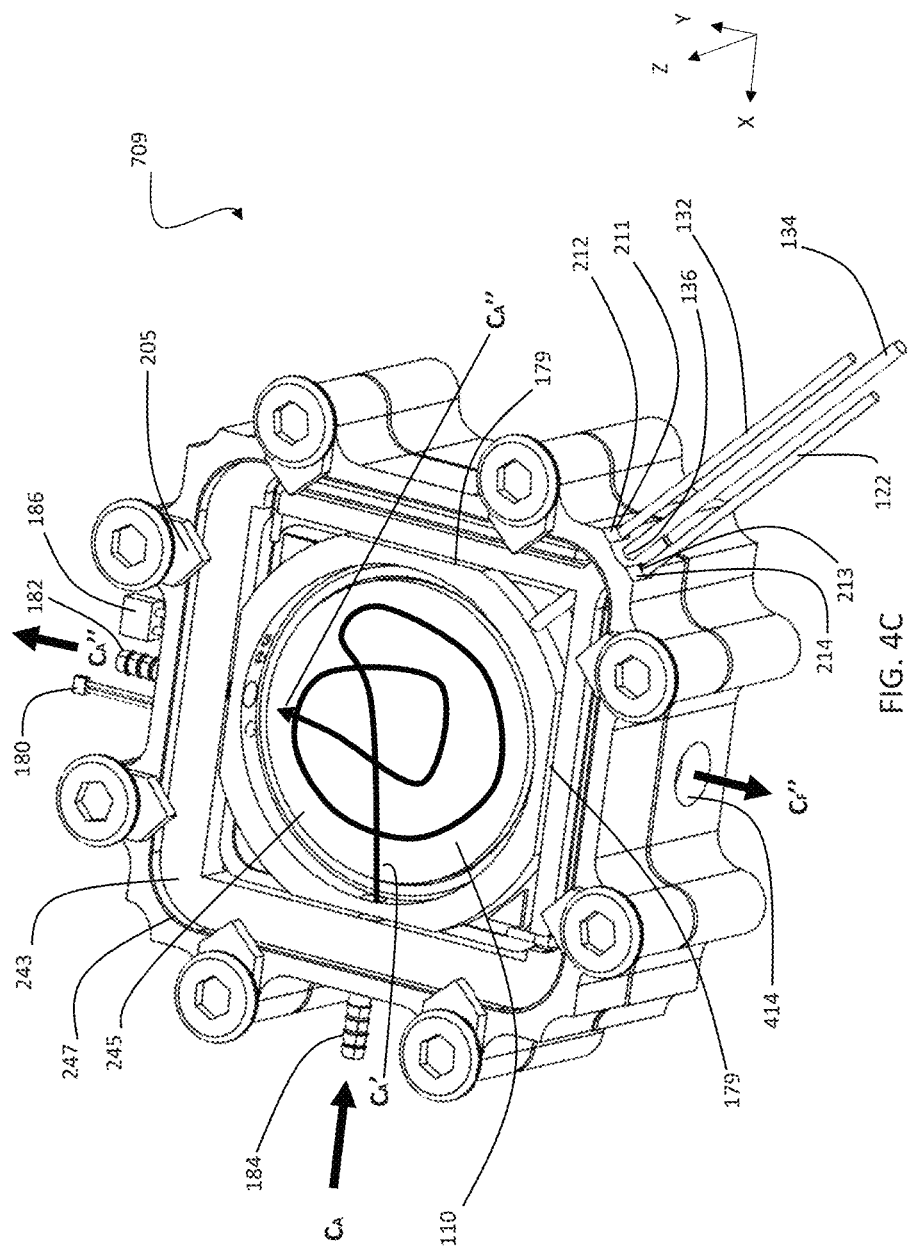
FIG. 4C shows an off-axis elevated isometric view of another embodiment incorporating features of the present disclosure.

FIG. 4C shows an off-axis elevated isometric view of a base thermal management fixture 709, similar to the base thermal management fixture 708, discussed with regard to FIG. 4B above, wherein like reference numbers are used to denote similar features and to further illustrate the embodiment. A difference between the base thermal management fixture 709 in FIG. 4C and the base thermal management fixture 708 in FIG. 4B is that the areas of the anode connection wires 132 and the cathode connection wires 122 comprise a different configuration in that the channels that were opened at 214 and 212 in FIG. 4B are now closed in FIG. 4C and the only through-holes present are through-hole 213 and through-hole 211. In this embodiment, the wire recesses allow the cooling fluid CG to leak or vent to the open environment. If the cooling fluid CG or CF is not compatible with the electrically-powered device, the active surface 110 can be coated with a conformal coating. With all the power connections completely sealed, a liquid coolant can be used instead of a gas, and solder connections in the area of the cathode and the anode of an electrically-powered device can be conformal coated or sealed with an appropriate insulating coating.

Figure 4D:
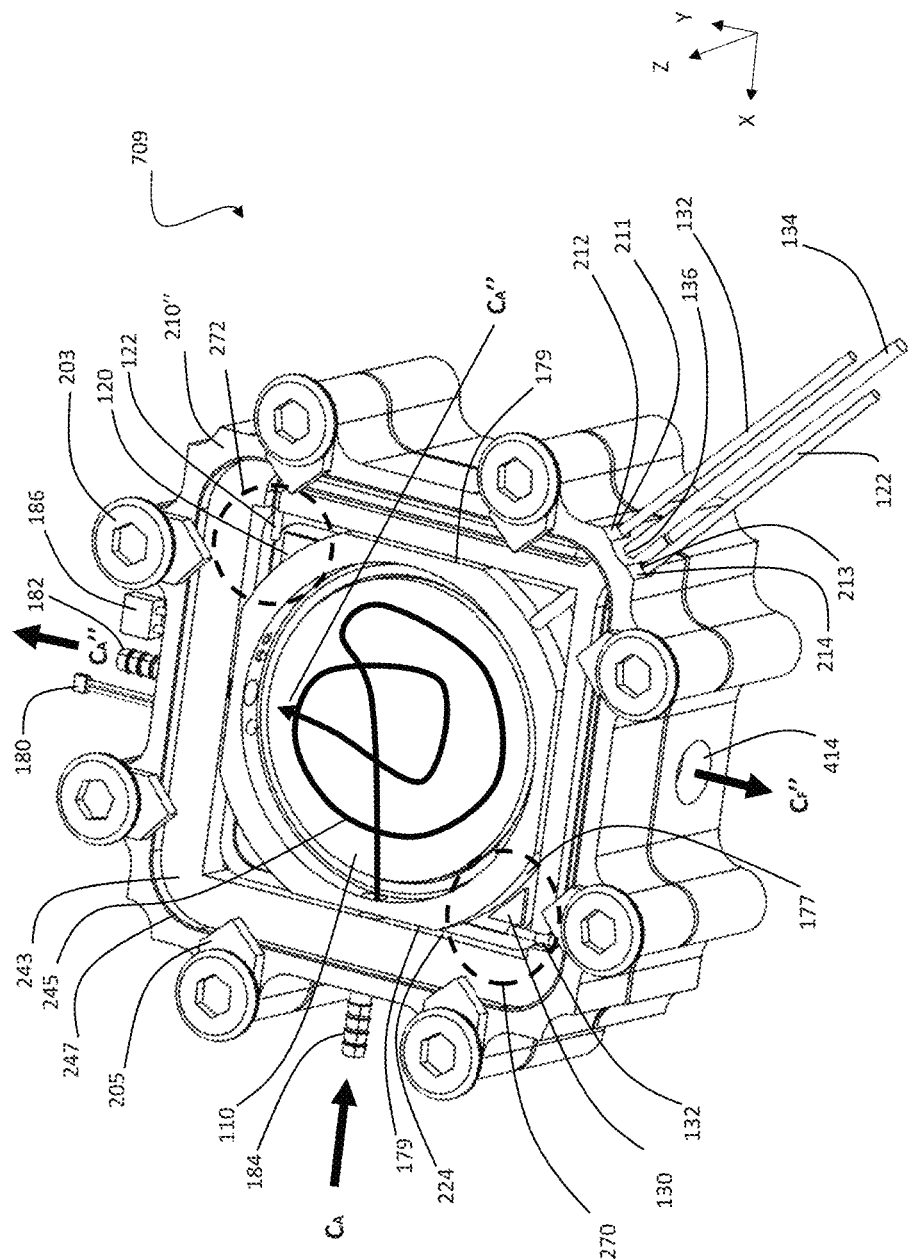
FIG. 4D is an elevated off axis view of the embodiment of FIG. 4C.

FIG. 4D is an elevated off axis view of the base thermal management fixture 709, wherein additional features are visible. The dashed circle 270 represents a cathode soldering site, the cathode soldering site 270 can be defined by the outside circumference 177 of the multipurpose ring 176 and the perpendicular sidewalls 224. After the cathode 130 is soldered to the cathode power connection 132, the volume formed by the perpendicular sidewalls 224 and the outside circumference 177 of the multipurpose ring 176 can be filled with a substance such as an epoxy or elastomer or a UV cured epoxy and/or conformal coated. This will protect the soldering connections from corrosion and prevent short circuit events. The same process can be applied within the dashed circle 272 representing the anode soldering site where the two perpendicular sidewalls 224 and the outside circumferential surface 177 will be filled with epoxy, an elastomer, or a UV cured epoxy once the anode 120 is soldered to the anode connection wire 132. This will provide the needed protection of the solder joint to minimize corrosive effects and to further secure the COB assembly 100 and its position. The other quadrants defined by the two perpendicular sidewalls 224 and the outside circumferential surface 177 can be filled with substances such as epoxies or UV cement to help protect against corrosion and further help secure the electrically-powered device. The cleanest solder connections are preferable, for example, those that use no or minimum amounts of solder flux.

Figure 5A:
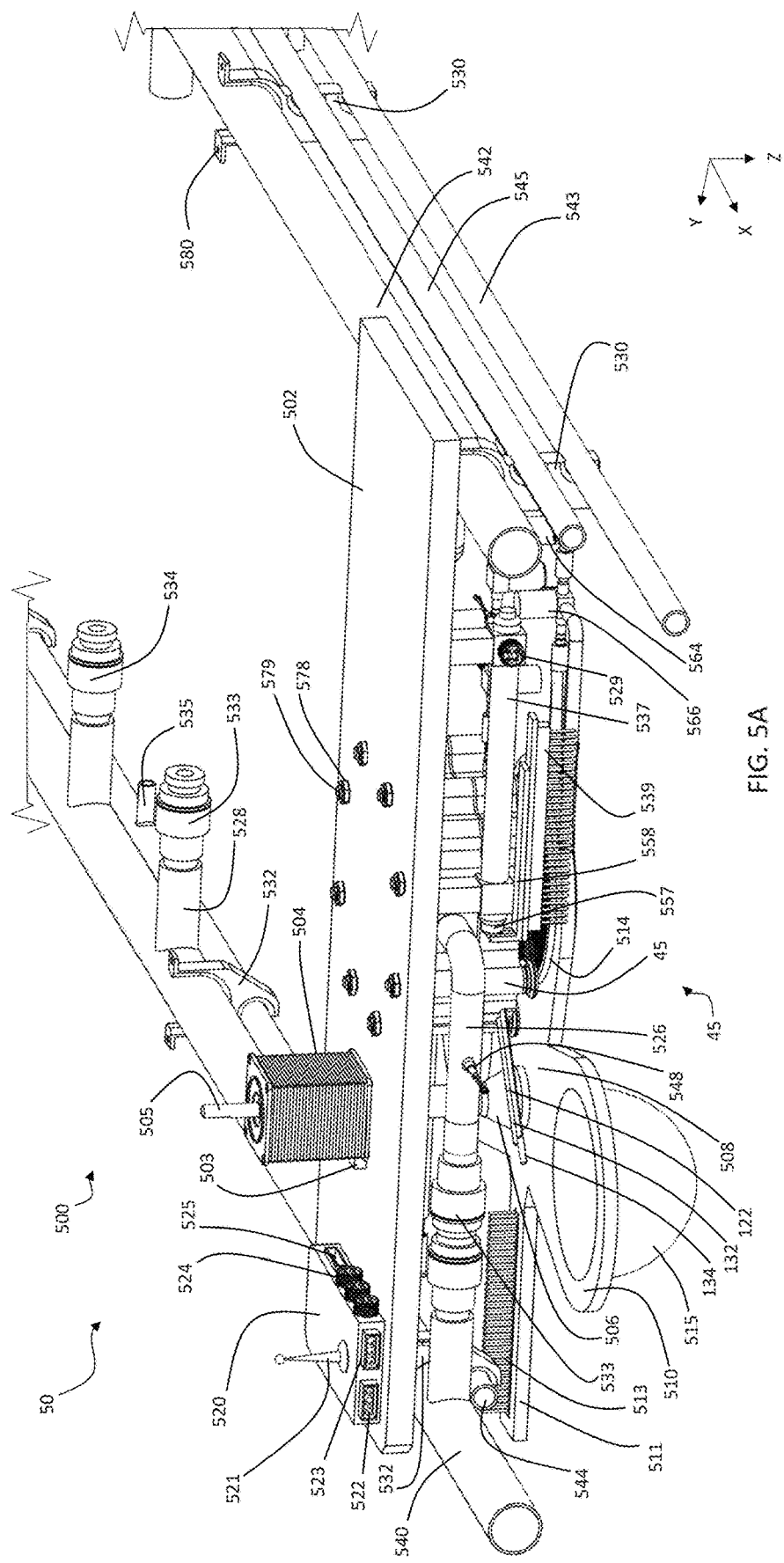
FIG. 5A is an elevated isometric view of another embodiment incorporating features of the present disclosure.

FIG. 5A is an elevated isometric view of an automated light assembly 50. The automated light assembly 50 comprises a sealed light assembly 45, which can include base thermal management features, wherein the electrically-powered device comprises a light or can comprise another lighting assembly comprising a light-emitting device or array of light-emitting devices. The automated light assembly 50 further comprises a mounting base 502, a motor 504, a cooling fluid mounting structure 500, and a function control box 520 with a communications component 521. An advantage of the automated lighting assembly 50 is to minimize the amount of labor necessary during operational cycles or other lighting conditions, for example, in lighting systems utilized in greenhouse or other environments requiring cyclical variations in lighting output. The automated lighting assembly 50, with the control box 520 and communications component 521, monitors and controls the operating requirement of the automated light assembly 50. The communications system interrogates and instructs the functions of the automated lighting assembly 50 by communicating with the various sensors using WiFi or other communication protocols.

The function control box 520 comprises one or more connectors for controlling various devices that are associated with the automated lighting assembly 50. Among the connectors the function control box 520 can comprise are a first connector 522 and a second connector 523, which are connectors that will power a lighting component, for example, a chip-on-board (COB) LED lighting assembly, contained within the automated lighting assembly 50. Other connectors such as 524 can provide control signals to the linear actuator 537 through the power connection 529. The motor controller circuit within the control box 520 can send signals to the motor 504 through the connector on the control box 525 that would connect to the connector on the motor 503. The motor 504 comprises, connected to its rotary axis 505 on the lower side of the base plate 502, a multiple-station holder platform 508.

The sealed light assembly 45 is connected to the base plate 502 with fasteners 579, 578, which can include any known structures configured to perform a fastening or connecting function, including, for example, screws, nuts and bolts, and adhesives. The base plate 502 itself can be connected to a cooling fluid supply pipe 542 and a cooling fluid return pipe 540. The base plate 503 has fastened to its underside one multiple-pipe snap clamp 530 that holds a cooling fluid supply pipe 542, a cooling fluid air pipe 545, and a cleaning fluid pipe 543. On the opposite side is a second multiple-pipe snap clamp 532 which holds at least two pipes, including a return cooling fluid pipe 540 and a return air supply cooling fluid pipe 544. Through different actuator controls and flow regulators, some of these pipes can be reconfigured to perform different functions.

Figure 5B:
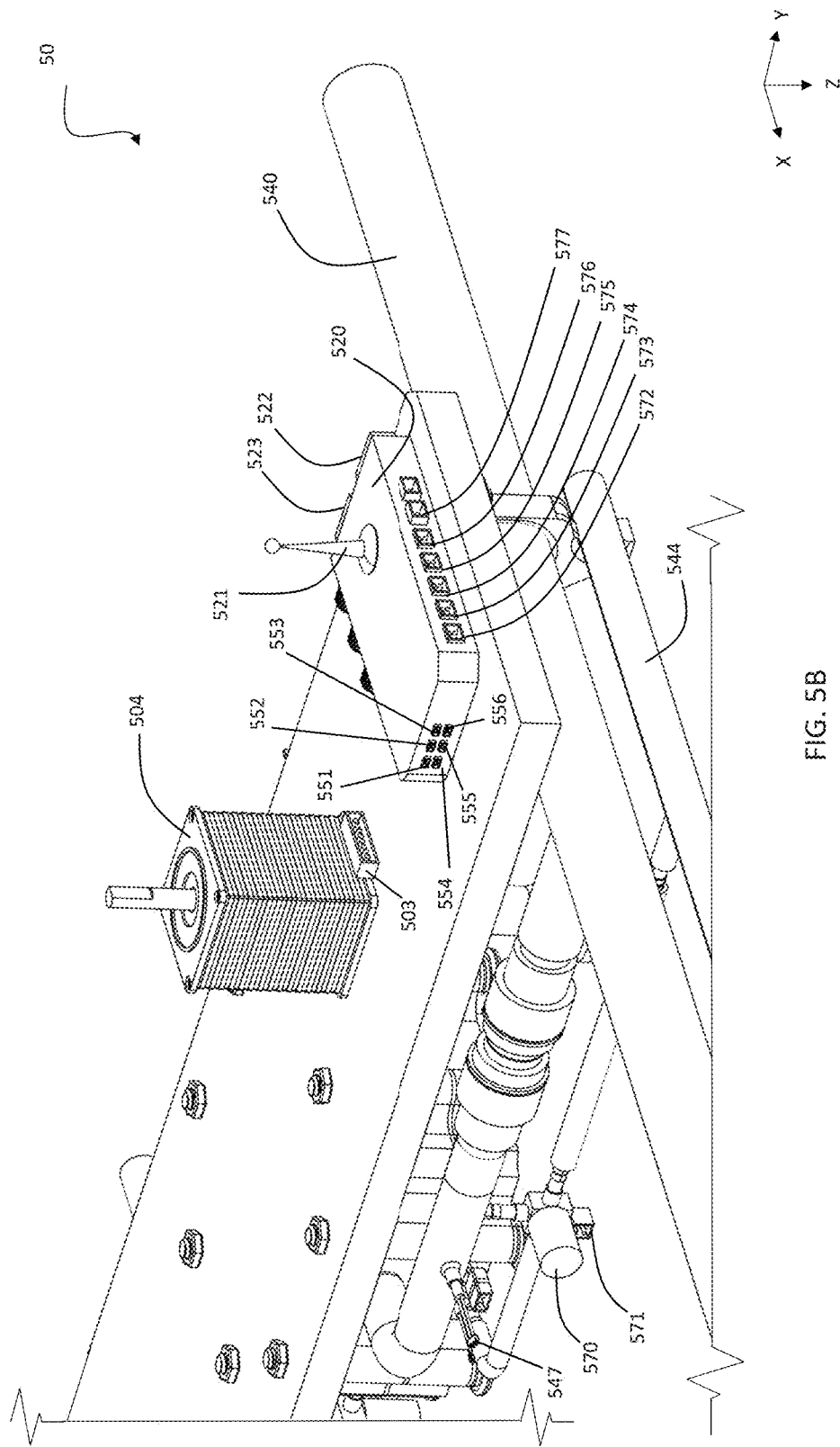
FIG. 5B is an off-axis side view of the embodiment of FIG. 5A.

FIG. 5B is an off-axis side view of the automated lighting assembly 50 and includes a closer view of the control box 520 with a series of connectors for one or more thermocouples throughout the system. The thermal couple connectors shown include six, in the form of thermocouple connectors 551, 552, 553, 554, 555, and 556. The other bank of connectors on the control box 520 are one or more the actuator/controller connectors (five shown) 572, 573, 574, 575, 576. As an example, from FIG. 5B the connector 572 on the function control box 520 could be connected to connector 571 operating the control valve 570. The thermal couple 547 could be connected to the thermocouple connector 556 on the control box 520.

Figure 5C:
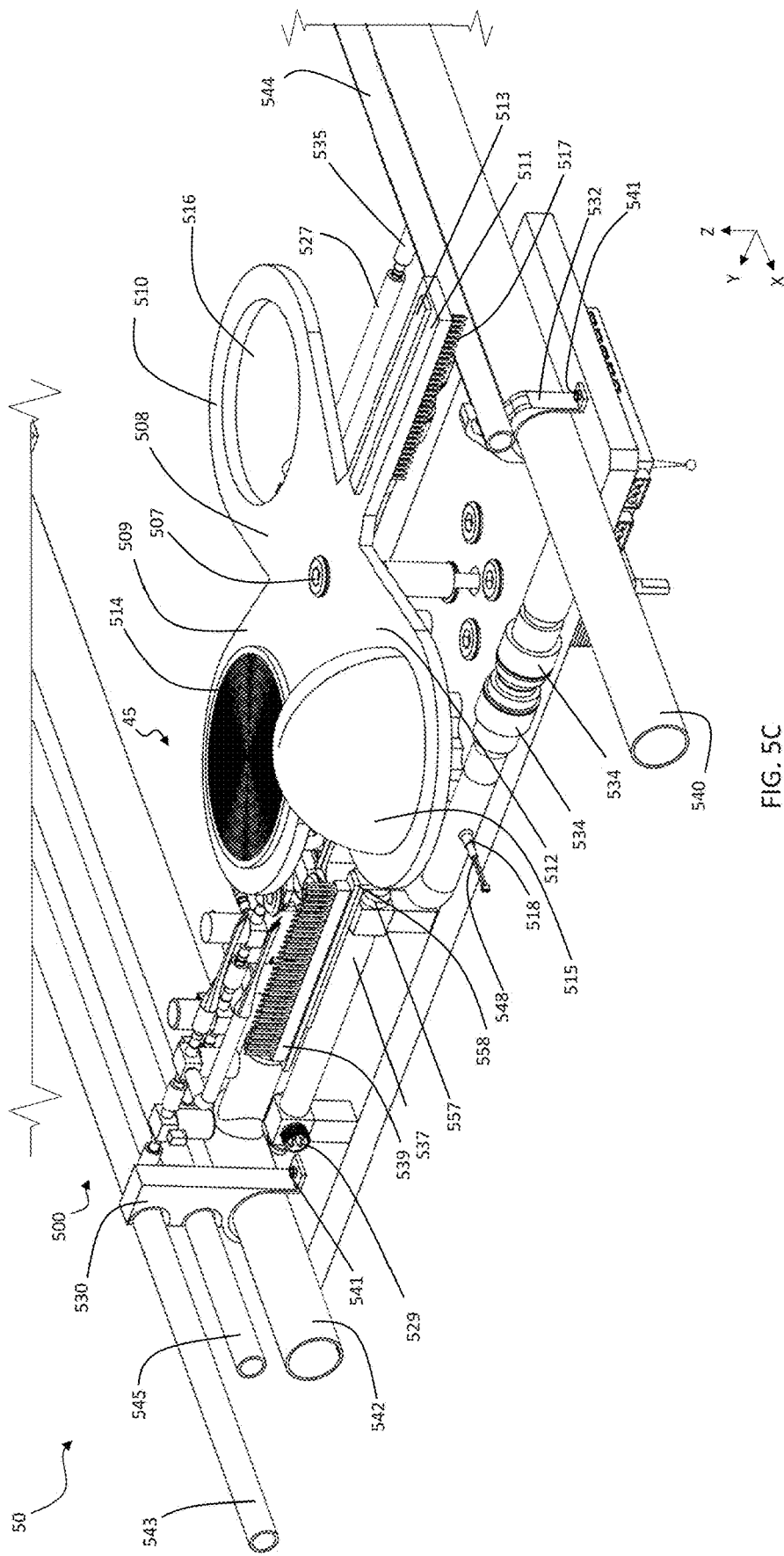
FIG. 5C is a bottom isometric perspective view of the embodiment of FIG. 5A.

FIG. 5C is an isometric view of the underside of the automated lighting assembly 50. The multi-station rotary plate 508 has multiple positions corresponding to different features (four positions shown in this particular embodiment; position 512 has assigned to it the specialty lens 515, position 509 has assigned to it a lens 514, position 510 has an open aperture 516 that can be used to fasten commercial sensors for diagnostic purposes, position 511 holds a cleaning brush or a multipurpose cleaning head. The multi-station rotary plate 508 can have, as a starting position, the lens 514 positioned over the sealed light assembly 45. From this viewpoint, the backside cleaning brush 539 mounted to the linear actuator arm 558 and connected to the linear actuator 537 via the coupling 557. The linear actuator 537 is mounted atop spacers to ensure the proper height for cleaning the lens. The brush 513 that sits in position 511 will be the brush or cleaning head that is used to keep the window of the sealed light assembly 45 clean and performing optimally.

Figure 5D:
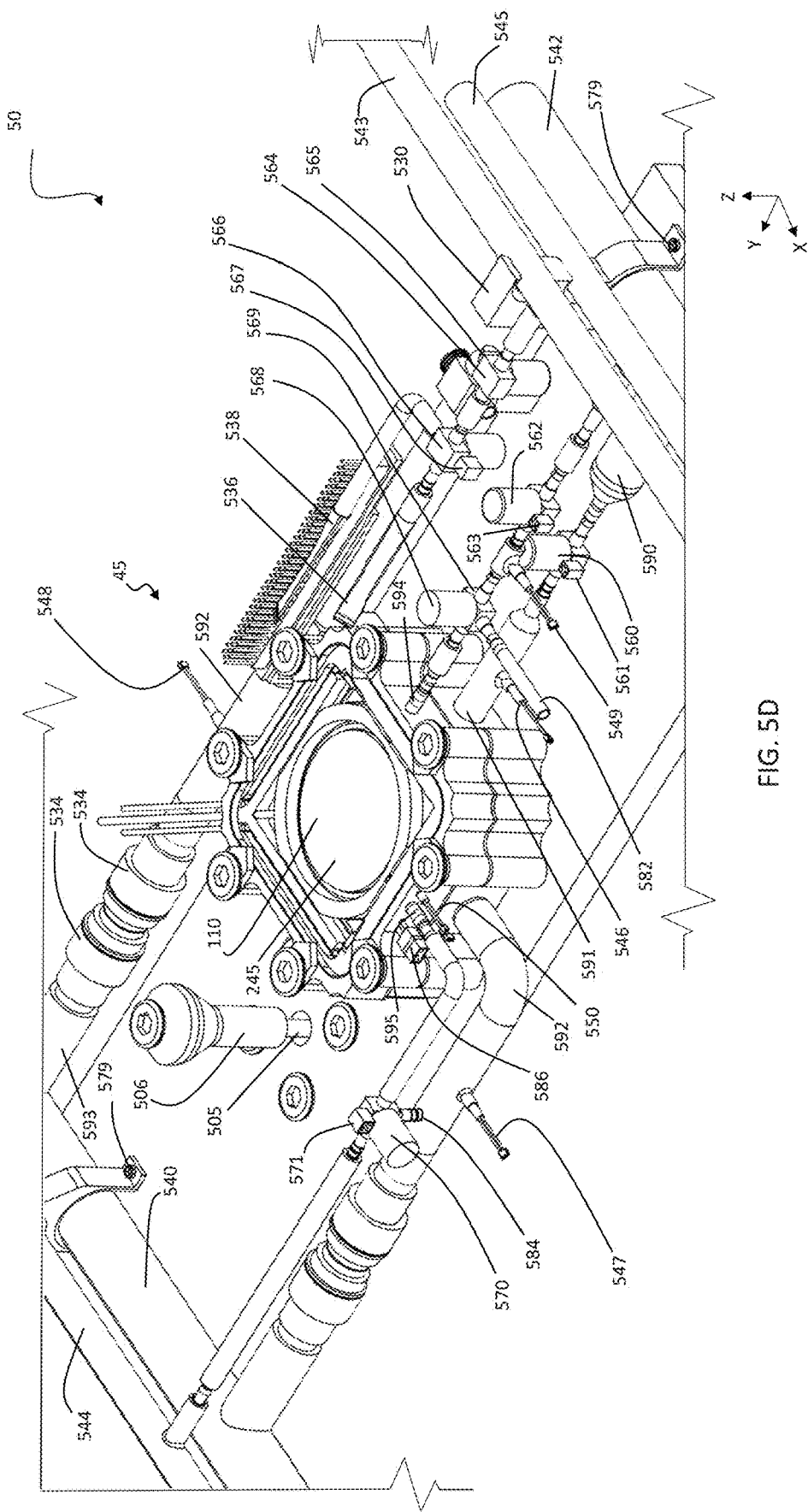
FIG. 5D is a bottom isometric perspective view of the embodiment of FIG. 5A with the multi-station rotary plate removed to further show additional features.

FIG. 5D is an underside isometric view of the automated lighting assembly 50 with the multi-station rotary plate 508 removed. The cooling fluid for the sealed light assembly 45 can flow from the cooling fluid supply pipe 542, through the reducing nipple 590 and can be controlled via the flow controller 560, which can receive its on and off control signal or flow velocity signals from the function controller 520 acting through the connector 561, the function controller 520. The rate for the flow controller 560 can be determined by a feedback loop generated from the cooling fluid temperature differential of the exit cooling fluid thermal-couple sensor 547 and exit cooling fluid thermal-couple sensor 548. Internal firmware within the controller box 520 determines the correct flow rates to maintain proper temperature for the sealed light assembly 45. Also, comparing the differential temperatures between the exit cooling fluid thermocouple 547 and exit cooling fluid thermocouples 548 is processed by the function controller box 520 to determine if there are any flow issues or restrictions within the light and if any of the impingement flow nozzles may be preferentially plugging causing an asymmetry in the respective thermal couple temperatures.

The gas supply line 545 is controlled by a flow control valve 562 and receives its flow rate instructions from the function control box 520. These instructions are communicated over a connector 563 of the flow control valve 562 which is connected to the connector 573 of the flow controller 520. The temperature of the input cooling gas in the input cooling gas conduit 545 is monitored by the connectorized thermal couple 549 connected to the thermal couple input connector 551 of the function control box 520. A dual action diverter valve 568 controls the cooling gas in the input cooling gas conduit 545 to pass through the pipe nipple 594 allowing the input cooling gas in the input cooling gas conduit 545 to pass into the basic light assembly 50, and cool the active surface of the basic light assembly 45 (corresponding to the electrically-powered device 110). The egress of the input cooling gas passes through the exit pipe nipple 595. The input cooling gas may be diverted by the diverter valve 568 to perform an alternate function. The alternate function could be connected to the hose 582 for the purpose of, for example, blow drying the surface of the window 245. Another alternative could be connected to the two separate sprayers 536 and 538 respectively and use their nozzle to blow-dry the respective surfaces that have been washed. Alternative functions that the two sprayers 536 and 538 can perform other operational tasks such as: misting for precision environmental control, water fertilizing crops, and administering gas/pesticide/fungicide/mold control. As there is a possibility of flowing a liquid through the internal chamber of the basic light 50, there can be a feature downstream passed the nipple pipe nipple 595 where a diverter actuator 570, controlled by connector 571, can route cooling fluid into the cooling fluid return path through the pipe nipple 584. The actuator connector 571 could be controlled through the function control box 520 from connector 575.

The fluid supply system and control mechanisms are illustrated in FIG. 5D showing the fluid supply pipe 543, controlled by a flow control actuator 564 through a connector 565. The fluid 542 flows to a diverter actuator 566 acting through connector 567. The diverter actuator 566 diverts the fluid to the spray head 538. Spray head 538 is used to provide fluid to be used in conjunction with the brush 513 that will clean the backside of the lenses 515 and 514. The diverter actuator 566 can divert the fluid to spray head 536 the spray head will be used in conjunction with the brush 513 on station 511 of the multi-position rotary platform 508. The flow controller 564 can then regulate the amount of pressure that the fluid 542 requires to perform its task via the firmware residing in the function controller 520 and acting through the connector 575 communication with the connector 565 of the flow control actuator 564.

FIG. 5E is an isometric view of a normal operating position of the multi-station rotary head 508 shown with the ψ0 reference index. Through software control from the function control box 520, the different lenses desired for specialized functions or the cleaning function can be established by controlling the motor 504 with control signals to its connector 503 from the function control box 520 connector 525. In this particular case, for reference purposes, this is referred to as the starting position. This position uses the lens 514.

FIG. 5F shows the rotation of the multi-station rotary head 508 by ψ1, and shows rotation from the starting position through software control in order to the lens 515 for an intended function.

FIG. 5G shows the rotation of the multi-station rotary head 508 by ψ2 at an angle with respect to the original reference index through software control. This position would be the starting point for cleaning the window 245 of the sealed light assembly 45 using the cleaning brush 513.

FIG. 5H shows the rotation of the multi-station rotary head 508 rotated by some angle ψ3 with respect to the original reference index, through software control. This position would be the open aperture 516 if there were no requirement for lenses, filters or any other function but with a clear aperture. Another use would be to include any commercial light monitoring equipment that can be mounted into a fixture for insertion into this open aperture. Some of the equipment that can be inserted into open aperture would be any light measuring equipment to monitor the status and performance of the sealed light assembly 45, for example, spectral-radiometer, fiber-optic spectral radiometer heads the transfer the light to be measured or diagnosed, to a central monitoring station. A PAR meter (Photosynthetically Active Radiometer) such as a PAR meter to measure the micromoles of the photonic output can also be included.

FIG. 5I shows the multi-position rotary head 508 positioned at an angle of ψ4 with respect to the original index shown in the previous FIG. 5H. This position can be used to clean the window 245 with the cleaning brush 513 mounted in position 511 of the multi-station rotary head 508. A software command can be given to rotate the multi-position rotary head 508 through an angle from an angle starting at ψ5 and progressing to ψ6 within a software loop for either a certain period of time or for a number of oscillations or cycles. While the cycling is occurring under software control, the spray nozzle 536 will be spraying cleaning fluid 543 to the underside of the brush bristles 517. The diverter valve 566 is positioned such that the correct spray nozzle 536 receives the cooling fluid or cleaning fluid 543 as shown by the spray pattern 559 and the pressure and/or volumetric flow of the spray pattern 559 is regulated by the control flow valve 564. After a certain period of time has elapsed the software control will return the multi-position rotary head 508 to any one of the desired operating positions on the multi-position rotary head 508.

In FIG. 5J the multi-position rotary platform 508 has been rotated to the Ω lens cleaning starting position through software control. Also, the actuator 537 has received software commands through the connector 529 to oscillate brush 539 back and forth as shown by the double-ended arrow 588. The software control via the diverter valve 566 receives instructions through its connector 567 to produce a cleaning spray 559 through the spray head 538, simultaneously, software instructions are given to oscillate the multi-position rotary head 508 through an angle of Ω and Ω1 to affect cleaning of the lens 514 in position 509. Once the cleaning process is complete, the software controller within the function control box 520 will issue the appropriate instructions through the respective connectors to return to the normal state of operation.

Viewed from another perspective, FIG. 5K represents a different aspect for the rotation of the multi-position rotary platform 508 through the arbitrary angle of Ω and starts the rotation between Ω and Ω1 with the spray head 538 spraying cleaning fluid 559 onto the brush bristles 517 of brush 513 connected to the actuator 537 and moving back and forth according to the double ended arrow 588.

Figure 5L:
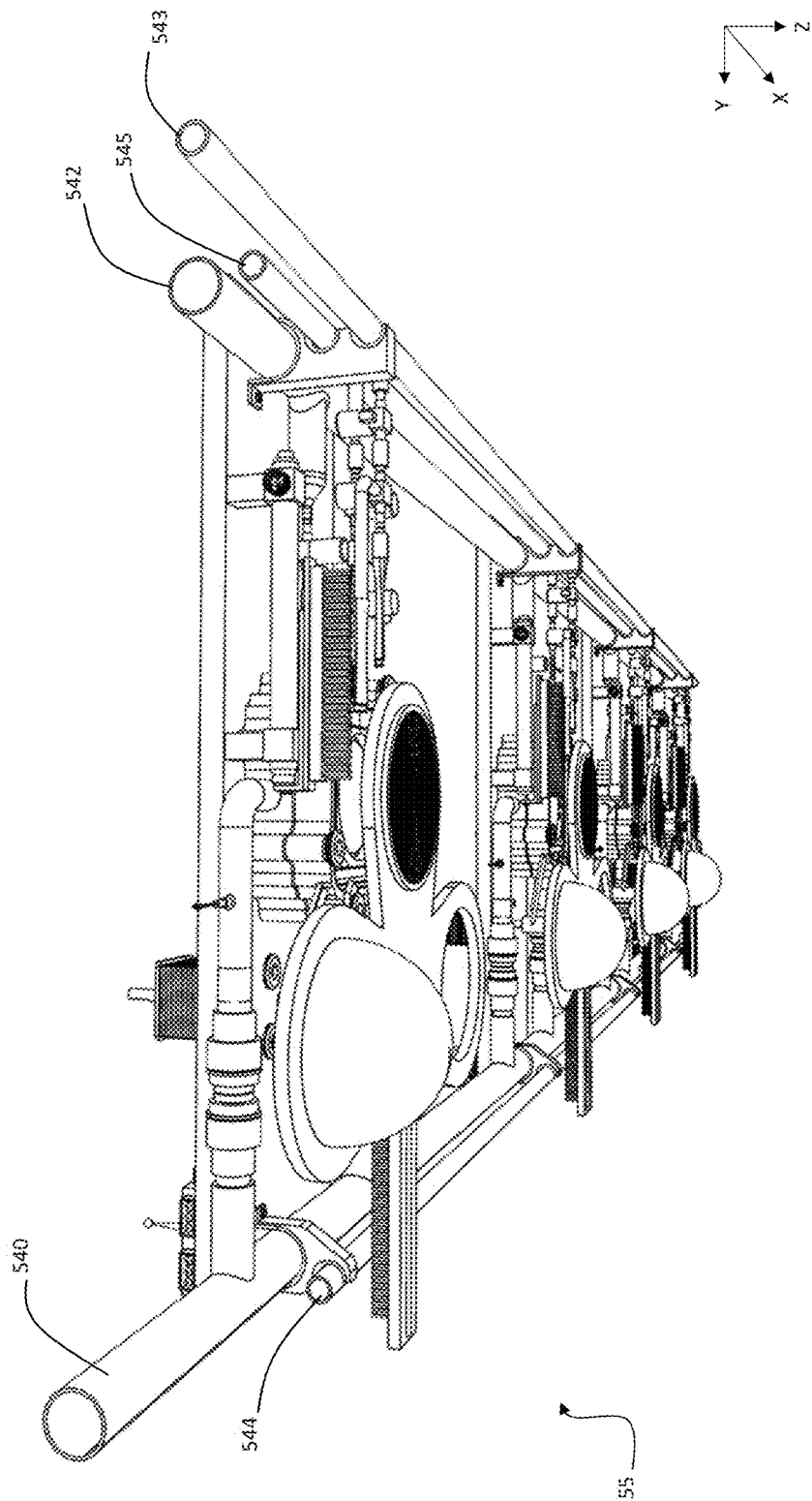
FIG. 5L a front perspective view of another embodiment incorporating a multi-position rotary head incorporating features of the present disclosure.

FIG. 5L shows a fully implemented multi-station automated light assembly 55 with a support structure that includes the cooling fluid return lines 540 and the cooling fluid supply lines 542. Some additional strength may be added through the clamping mechanisms such as the two pipe clamp 532 and the three pipe clamp 530. By implementing the various aspects of this invention there is a great laborsaving feature provided by this invention.

Figure 6A:
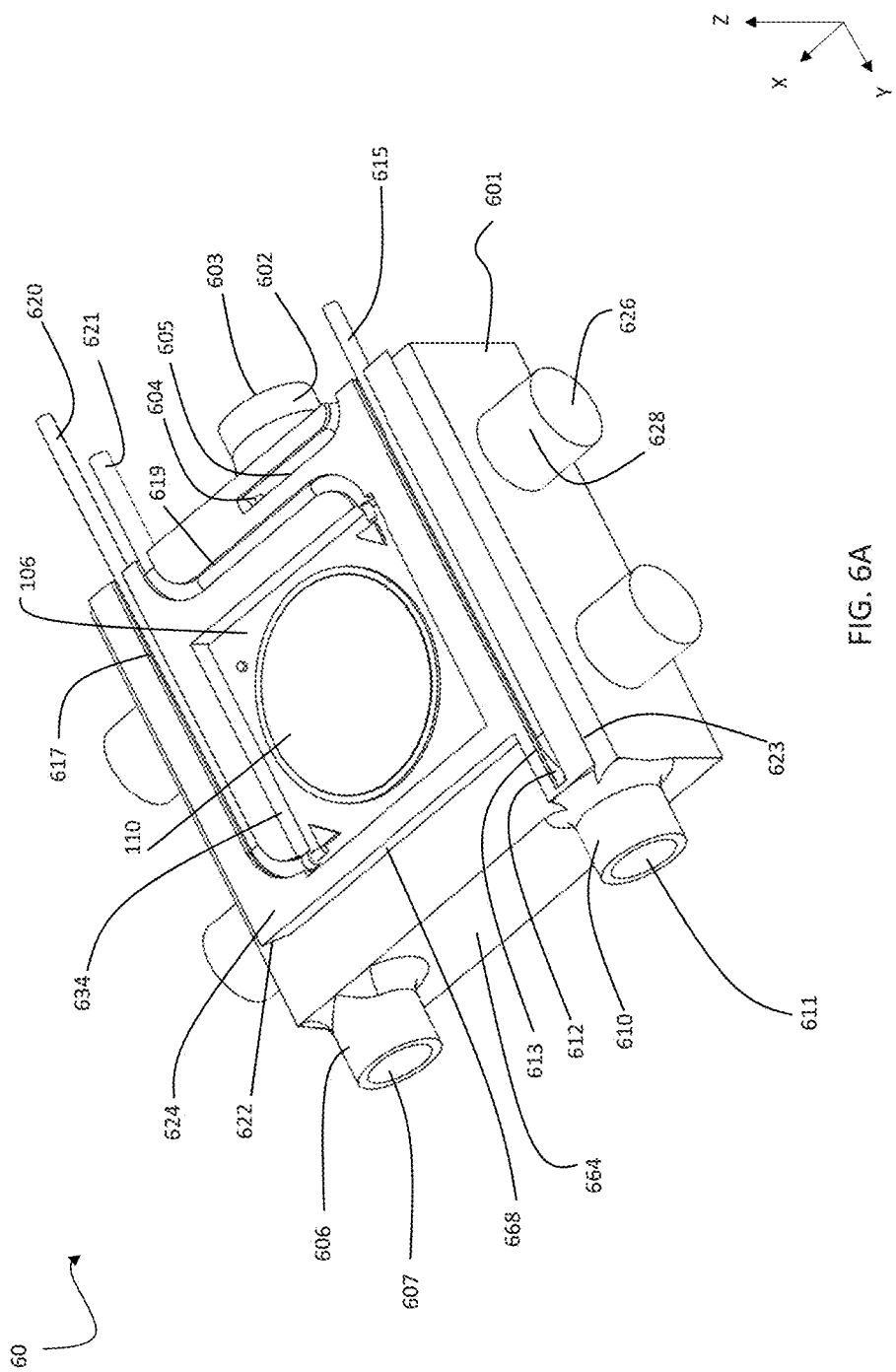
FIG. 6A is an elevated isometric view of a monolithic embodiment incorporating features of the present disclosure.

FIG. 6A is an elevated isometric view of a monolithic body thermal management fixture 60, similar to the base thermal management features discussed above in regard to FIGS. 1A-1G and FIG. 3, wherein like features are denoted by like reference numbers, except it is formed as a monolithic body, for example, by using molding techniques and/or the capabilities of three-dimensional (3-D) printers. This monolithic body thermal management fixture 60 can be made of one material having sophisticated, complex internal geometries. The monolithic body thermal management fixture 60 is comprised of a monolithic body 601 with an input aperture 603 formed into the input boss 602. The monolithic body thermal management fixture 60 can further comprise one or more output apertures (two shown), including output aperture 607 formed into the output aperture boss 606 and the second output aperture 611 formed into the output boss 610. Formed on the sides of the monolithic body 601 are mounting boss rim 628 and a mounting boss face 626. These features can be used for mounting extra hardware or mounted to another fixture. There is an elevated deck 624, formed onto the top side 627 of the monolithic body 601. of the elevated deck 624, features such as an anode wire channel recess 617, and a cathode wire channel recess 619, and a thermocouple wire channel recess 605 as well as a thermocouple well 604 can measure the temperature of the incoming cooling fluid CF. A thermocouple wire recess 613 and a thermocouple well 612 that reaches deep into the output aperture 611 can measure the temperature of the exiting cooling fluid CF".

The anode wire channel recess 617 can hold the anode wire 620. The cathode wire channel recess 619 holds the cathode wire 621. The thermal couple wire channel recess 605 holds the thermal couple wire pair at one end and is submerged into the aperture well 604 that enters into the input cooling fluid aperture 603. The thermocouple wire recess 613 holds a two-wire pair thermocouple 615 at one end and is deeply submerged into the thermocouple well 612 that reaches deep into the output apertures 611. There is a large aperture with sidewalls 634 that is large enough to accept the COB assembly 100.

Figure 6B:
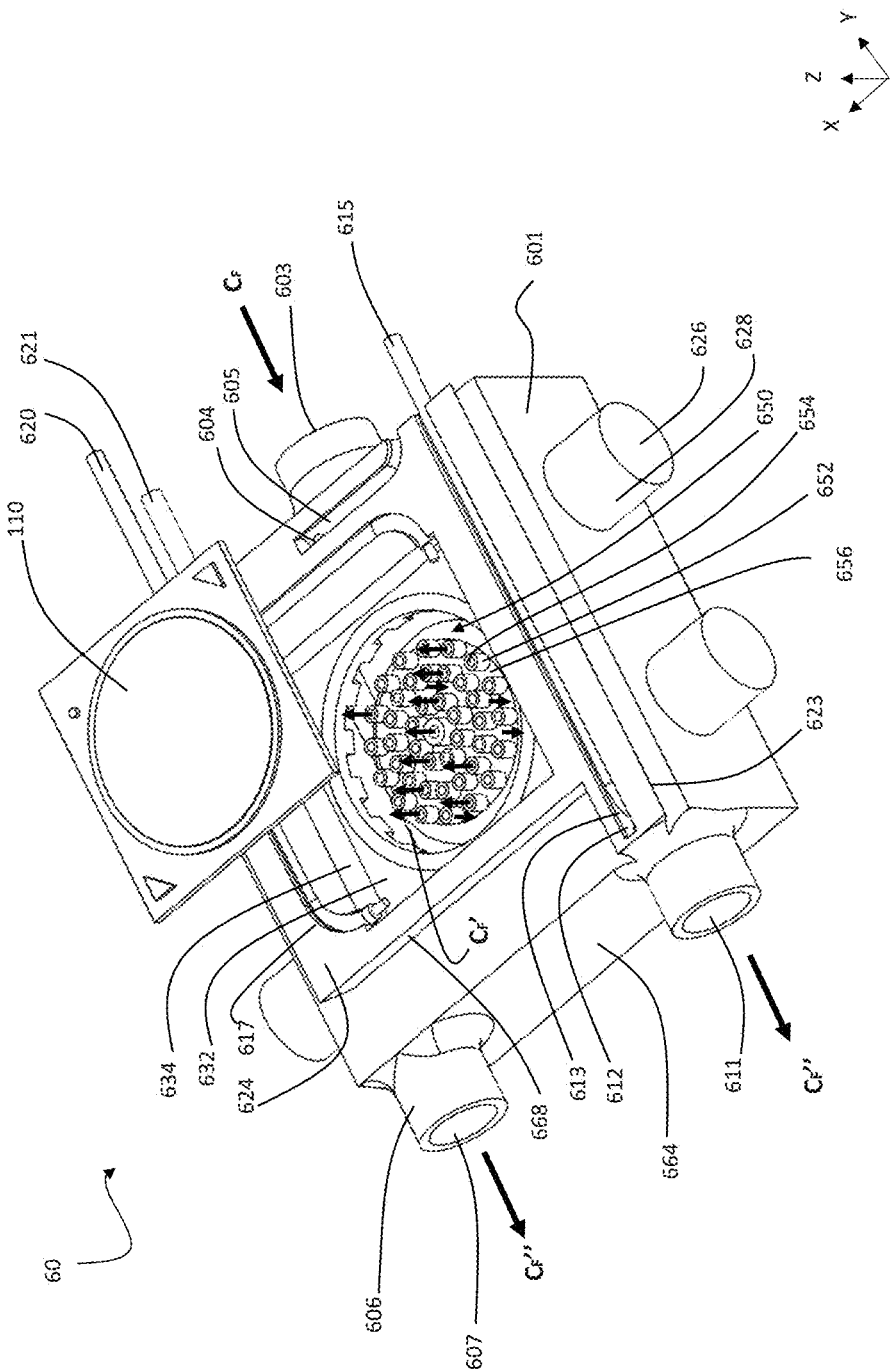
FIG. 6B is an exploded isometric view of the embodiment of FIG. 6A.

FIG. 6B is an exploded isometric view of the monolithic body thermal management fixture 60 of FIG. 6A with the electrically-powered device 110 raised above the monolithic body 601. The impingement head 650 can comprise spray nipple aperture 654, from which cooling fluid CF' emerges, and the impingement deck 656, from which the nipple sidewalls 652 emanate. The electrically-powered device 110 can be fastened to the platform face 632. The cooling fluid CF' emerges from the spray nipple aperture 654 and impinges on the electrically-powered device 110 and the heated waste cooling fluid CF" flows to the impingement head deck 656 exiting through channels formed by the sidewalls 652 and quickly moves to the exit reservoir 642 as seen in FIG. 6C.

FIG. 6C is a cross cut of the main body 601. It shows the deep well 604 for the thermocouple and how it intersects and interacts with the input cooling fluid channel 630 after it enters the input channel aperture 603. The cathode wire channel recess 619 can be seen embedded in part of the monolithic structure. The impingement head 650 can be part of the monolithic body 601, as the cross-cut shows. The impingement head cooling fluid reservoir 640 receives the incoming cooling fluid CF' where it is immediately directed through the nipple aperture 654 where it travels a very short distance to impinge on the electrically-powered device, then flow to the impingement deck 656 of the impingement head 650 as described in FIG. 6B. There the heated cooling fluid CF" cascades through the channels created by the nipple walls 652 and flows into the cooling fluid exit reservoir 642 and exits the monolithic body 601 through the cooling fluid exit aperture 607 and the cooling fluid exit aperture 611.

Another feature of the monolithic body 601 is that the raised deck 624 comprises a sidewall that comprises a V-rail 622. On the opposite side of the monolithic body 601 there can be another V-rail 623, that can be identical or substantially similar to the first V-rail 623.

Figure 6D:
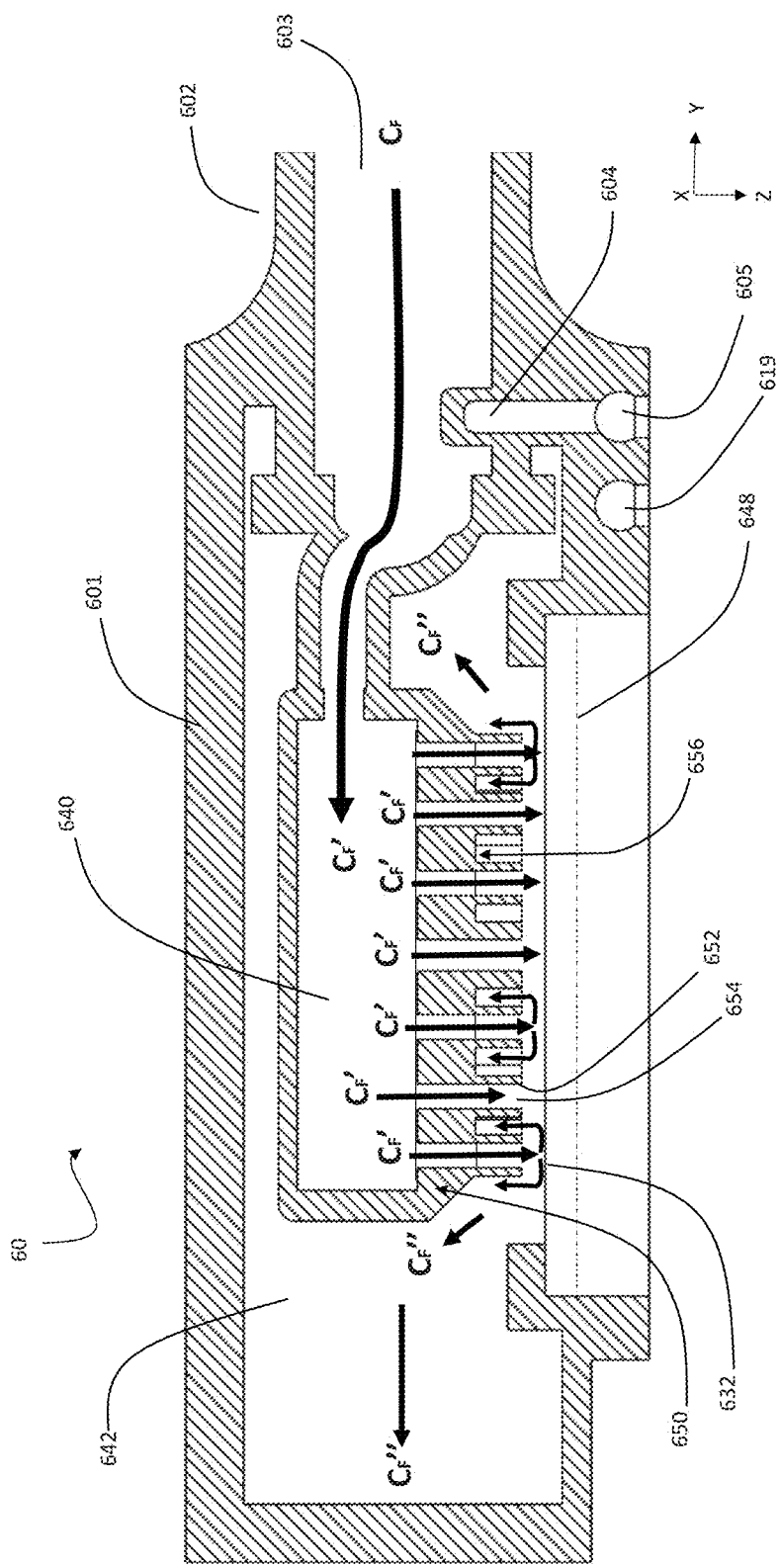
FIG. 6D is a lateral cross-sectional view of the embodiment of FIG. 6A.

A lateral cross-section of the monolithic body 601 is seen in FIG. 6D. This cross-sectional view shows the structure of the monolithic body 601 and the cooling fluid input aperture 603 receiving the cooling fluid CF and how it is transported into the impingement head cooling fluid reservoir 640. The dashed line 648 represents a targeted area corresponding to a placement position for an electrically-powered device. The interaction zone 632 is where the impingement head 650 directs the cooling fluid CF' to the electrically-powered device. Once the cooling fluid CF' has transferred or accepted the heat it is denoted as heated or waste cooling fluid CF" and quickly flows to the cooling fluid exit reservoir 642 where it will then exit through the cooling fluid exit apertures 607 and the cooling fluid exit aperture 611 (the two exit apertures are not seen because this is the bilateral cross-section). It is further understood that while this particular embodiment comprises two exit apertures, embodiments incorporating features of the present disclosure can comprise a single exit aperture or more than two exit apertures. The penetration into the input cooling fluid channel 630 of the thermocouple well 604 is also shown. The formation of the thermocouple well 604 penetrating into the input cooling fluid channel 630 as a monolithic feature provides a unique leak proof method of manufacturing. The same type of cross-section exists in either one or both of the cooling fluid exit apertures 607 and cooling fluid exit aperture 611.

FIG. 6E is an expanded isometric view of the monolithic body 601 with the addition of a multipurpose ring 644. The flats 646 (4) on the multipurpose ring 644 serve as a bonding surface to help secure and retain the electrically-powered device in the recess formed by the side walls 634. Flat facets 646 of the multipurpose ring 644 are affixed to the side walls 634 of the monolithic body 601 by a connection structure, for example, welding, epoxying, use of fasteners or other methods known in the art.

In FIG. 6F there are two additional structures included, angular bar 636 having flat surface 637 and flat surface 639. The angular bar 636 is used to secure the electrically-powered device 110, which can be affixed to the platform floor 632 of the monolithic body 601 with any known connection structure, including typical bonding compounds such as an epoxy or other chemical or physical means using clamps, fasteners, or seals and lids. The side walls 634 can have secured to them the angular bar 636 where the electrically-powered device 110 resides. The angular bar 636 is secured to top surface 106 of the COB assembly 100. The angular bars 636 having been fixed to the sidewalls 634 adds more structural support to the electrically-powered device 110. These structures can define the soldering regions for connecting power to the electrically-powered device 110. Other geometries for the side walls 634 are possible as well as the corresponding angular bar 636

Figure 6H:
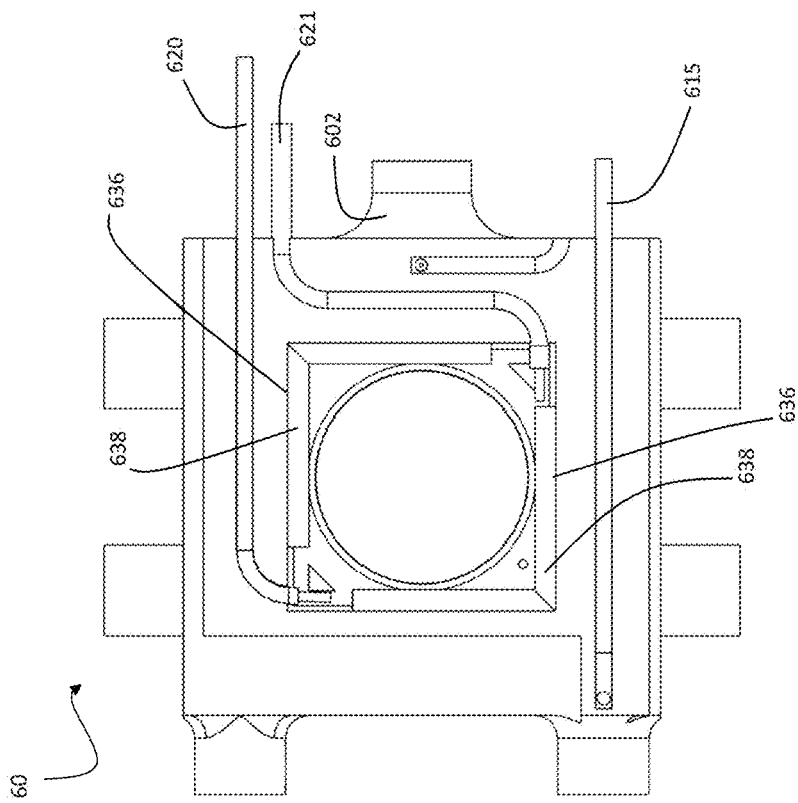
FIG. 6H is another top view of the embodiment of FIG. 6E, shown with an addition lens holder body feature.
Figure 6G:
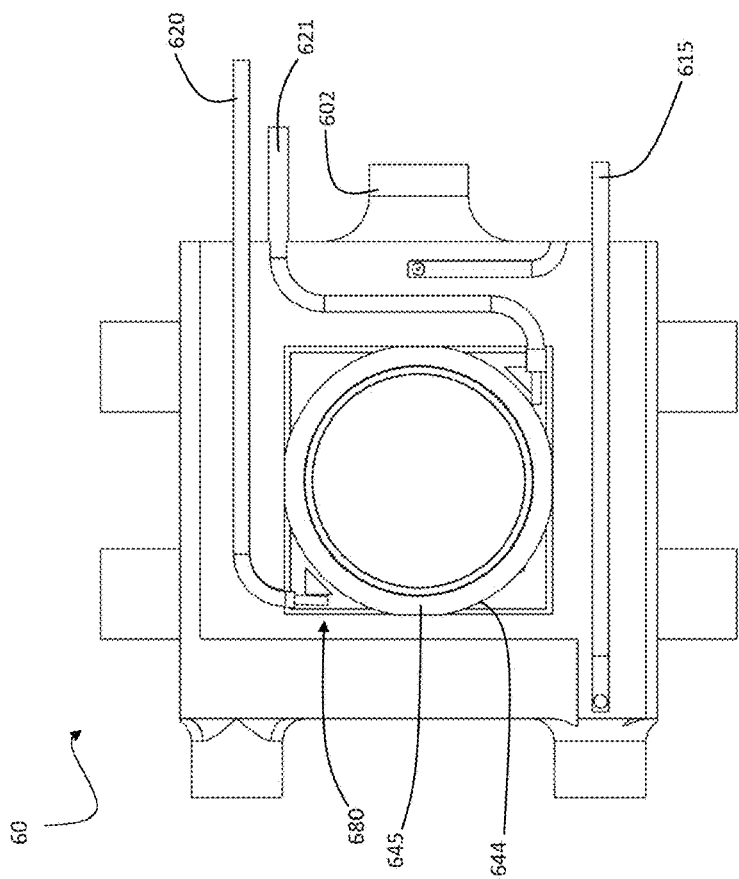
FIG. 6G is a top view of the embodiment of FIG. 6E.

FIG. 6G is a top view of the monolithic thermal management fixture 60. After soldering the anode to its power wire 620 and the cathode 120 to its power wire 621, the confinement regions formed by the side wall and the outside circumference of the multipurpose ring 645 can be encapsulated or conformal coated to protect these regions from corrosion and short circuit events.

FIG. 6H is a top view of the monolithic thermal management fixture 60. After soldering the anode to its power wire 620 and soldering the cathode to its power wire 621, the confinement regions formed by the side wall 634 and the angular bars 636 are encapsulated or conformal coated to protect these regions from corrosion and short circuit events.

FIG. 6I is an isometric view of a monolithic thermal management fixture 65. This monolithic thermal management fixture 65 is similar to the monolithic thermal management fixture 60 discussed with regard to FIGS. 6A-6H above, wherein like references numbers are utilized to denote like features. This monolithic thermal management fixture 65 comprises V-rail 623 and the V-rail 622 on the monolithic body 601 to accept a lens holder body 660, for use in, for example, embodiments wherein the electrically-powered device comprises a light-emitting device that can benefit from an easily interchangeable and replaceable lens. The lens holder body 660 and the monolithic thermal management fixture 65 can comprise the complimentary V-rail 663 and V-rail 662, which comprises the V-Rail System 675. Because of the raised deck 624 the power connections and the thermocouple connections remain in their respective recesses and do not impede movement of the lens holder body 660 back and forth on the v-rail system 675.

FIG. 6J is an isometric view of the monolithic thermal management fixture 65 with the lens holder body 660 shown in a fully closed position and covering the electrically-powered device 110. The lens holder body does not interfere with any of the wire harnessing and can easily be removed using the V-rail system 675.

Figure 6K:
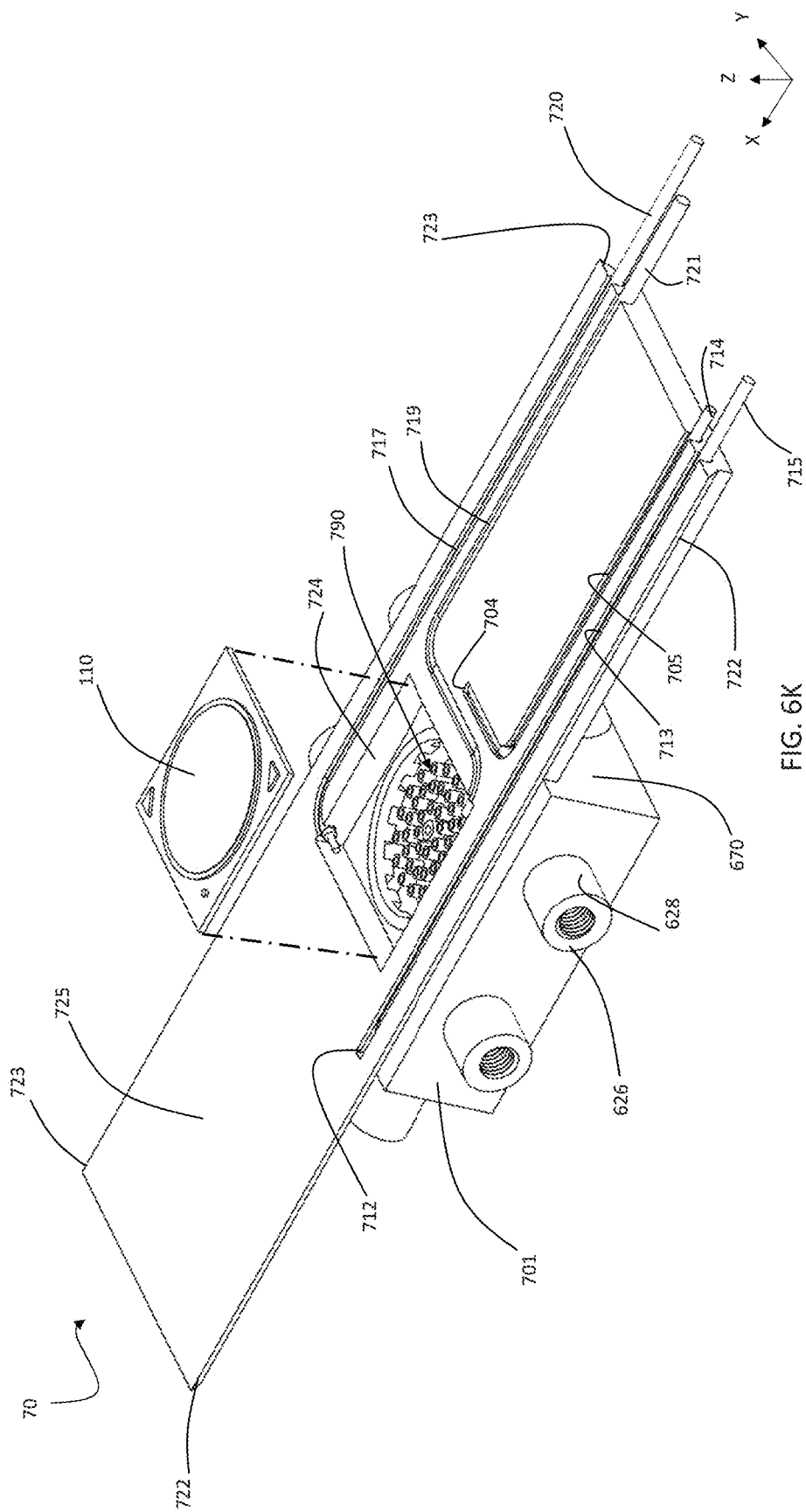
FIG. 6K is an isometric view of another embodiment incorporating features of the present disclosure.

FIG. 6K is an isometric view of an extended track embodiment of a monolithic thermal management fixture 70, similar to the monolithic thermal management fixture 60 discussed with regard to FIGS. 6A-6H above, wherein like references numbers are utilized to denote like features. In this embodiment, the upper deck 624 of the previous drawings has been extended on both sides of the monolithic body 701. The extended deck 725 maintains the same features and characteristics that the upper deck 624. However, an advantage of this extended deck embodiment includes that a multiple-lens carrier may be added to the top deck 725, for example in embodiments wherein the electrically-powered device comprises a light-emitting device. The extended track retains the same exit cooling fluid thermocouple well 712 and the thermocouple wire 715 lies in the thermocouple wire recess 713. The input cooling fluid thermocouple well 704 retains the same position and the thermocouple wire pair 714 lies in the thermocouple wire recess 705. The anode power connections 720 reside in the wire channel recess 717. The cathode power wire 721 rests in the power wire channel recess 719. The deeper sidewalls 724 define the recess where the electrically-powered device 110 resides and the impingement head 790 has all the characteristics of the previous impingement head 650 as shown in FIG. 6D. The V-rails 722 and the V-rails 723 have been extended the full length of the extended deck 725, and will be referred to as the extended v-rail system 675.

Figure 6L:
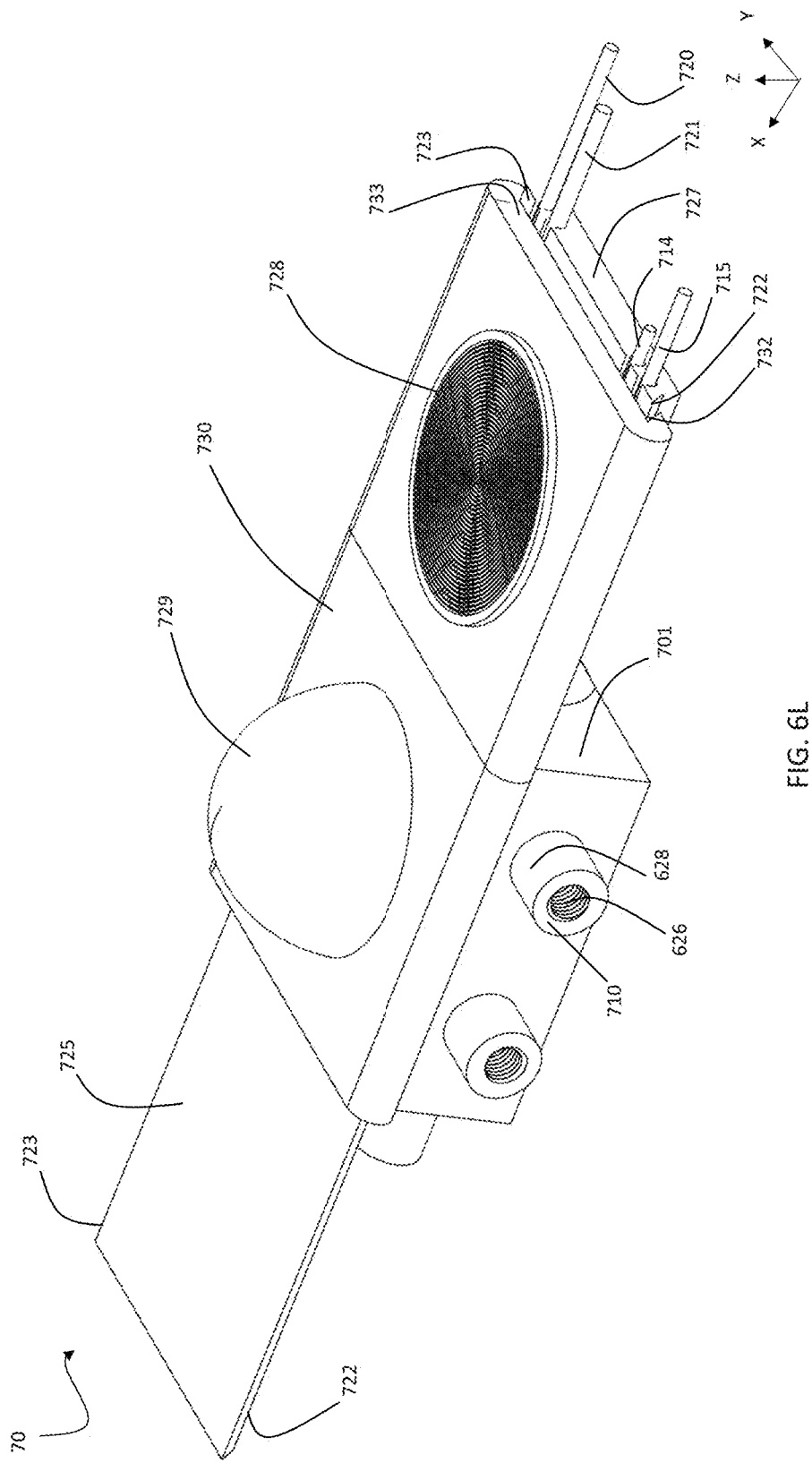
FIG. 6L shows an isometric view of the embodiment of FIG. 6K.

FIG. 6L shows an isometric view of the extended track monolithic assembly 70 with an added dual lensholding fixture 730. The dual lens holding fixture 730 can comprise one or more lenses, for example, for embodiments utilizing a light-emitting device as the electrically-powered device, In this particular embodiment, the lens holding fixture 730 comprises two lenses: a first lens 728 and a second lens 729. One of the lenses may not be required and therefore the aperture that it fills may be left blank in order for the light-emitting electrically-powered device to illuminate through that vacated aperture if required or desired. The mounting boss rim 628 is a fixture support structure. A threaded aperture 710 can be formed into the mounting boss face 626, and can be configured to receive a fastener to secure to a frame for added support. The dual lens holding fixture 730 can be easily maneuvered to any required position using the extended v-rail system 676. The dual lens holding fixture 730 can have more positions by further extension of the extended v-rail system 676.

Figure 6M:
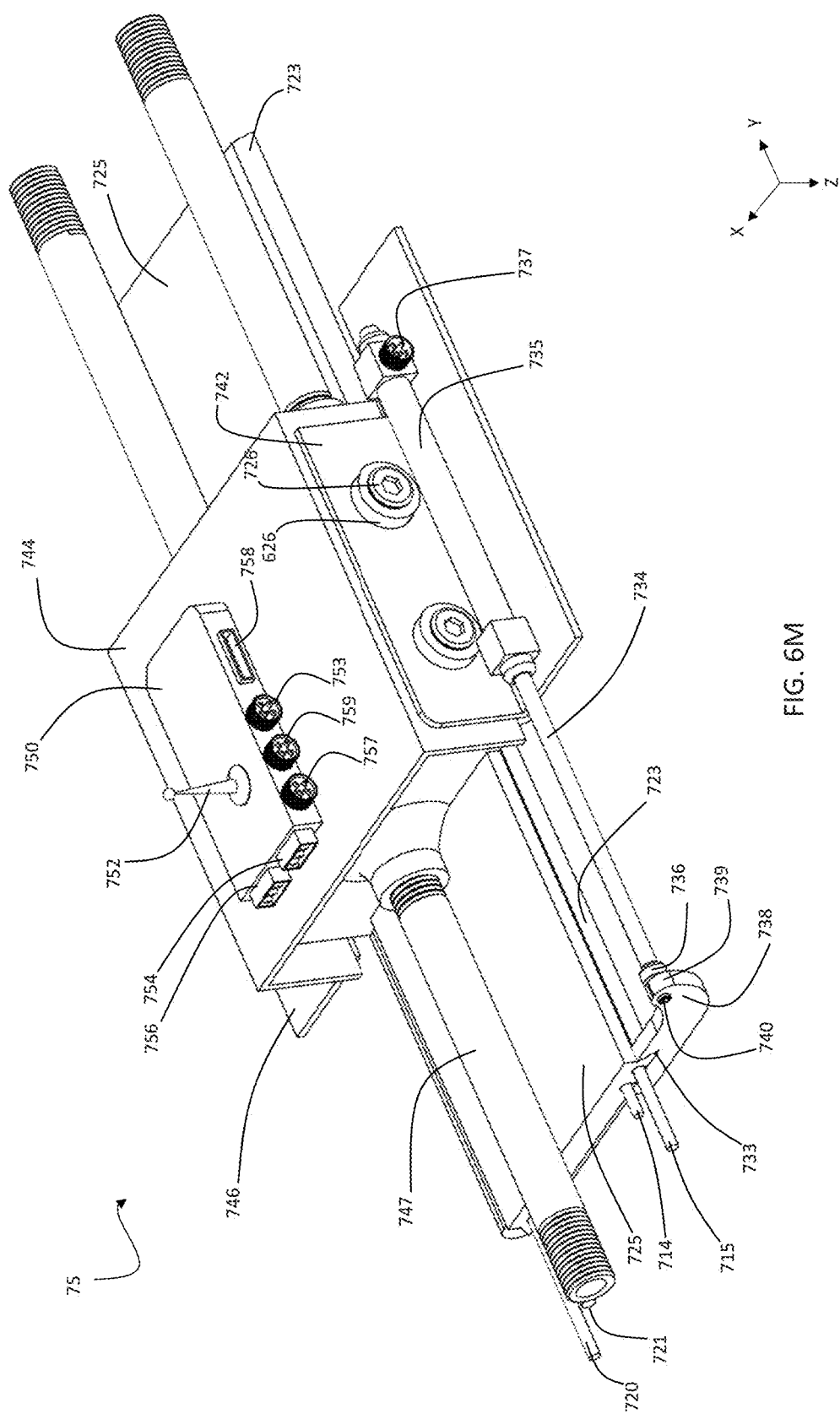
FIG. 6M is an isometric view of another embodiment incorporating features of the present disclosure.

FIG. 6M is an automated extended track monolithic thermal management fixture 75, similar to the extended track monolithic assembly 70 described in relation to FIG. 6L above, wherein like reference numbers are utilized to denote like features. In this embodiment, a support structure formed by a cover plate 744, connected to the mounting boss face 626 with the fastener 726, which can also be any known fastening or connecting structure or adhesive, and also attached is an actuator mounting bracket 742, and on the opposite side another optional mounting bracket 746. The actuatormounting bracket 742 has mounted to its surface a dual action latching actuator 735. The actuator control arm 734 is attached to a coupling fixture 736 by a fastener 740 that passes through a fastener through-hole 739 to secure the connecting arm to the coupling fixture 736. The actuator 735 receives its control signals from a function control box 750 via its connector 737 to its control connector 753 on the function control box 750. The function control box 750 can receive its power through connector 756. The connector 754 is the connector that the anode power wire 720 and the cathode power wire 721. The connector on the control box 754 can comprise a multiple-prong connector if there were a ground sensing or current sensing wire it would be connected to a third position on the connector 754. The multipurpose ring 645 that was discussed in the previous drawings in FIG. 6G, can be included and serve as a ground sensor to shut down any faulty electrical circuit that may be detected with the multi-purpose ring 645.

Other connectors on the function control box 750 can be utilized for the thermocouple wire pairs 714 for monitoring the input cooling fluid temperature from the thermocouple inserted into the thermocouple well 704. Likewise, thermal couple wire pairs 715 can be connected to a thermal couple connector on the function control box 750 and monitor the output heated cooling fluid CF" temperature by inserting the thermocouple sensor into the thermal couple sensor well 712. In this situation, the temperature can be monitored through software and can compare the input cooling fluid CF temperature to the output heated waste cooling fluid CF"

temperature and through the communications antenna 752 alarm signals could alert the system operator to attend to any issue. Also, further software management via AI (Artificial Intelligence) could perform the required tasks. A flow control actuator can be implemented and firmware or software from an operator can be used to control that flow control actuator through connector 757 or 759 on the flow control box 750

FIG. 6N is an isometric view of the operating face of the automated extended track light assembly 70 with the actuator arm 734 fully extended to allow the lens 729 of the multiple lens holder platform 730 to be the operating lens for the required task. FIG. 6O shows the actuator arm 734 fully retracted thus moving the lens 728 on the multi-lens holder platform 730 be placed in the alternate operating position for the task required.

Figure 6P:
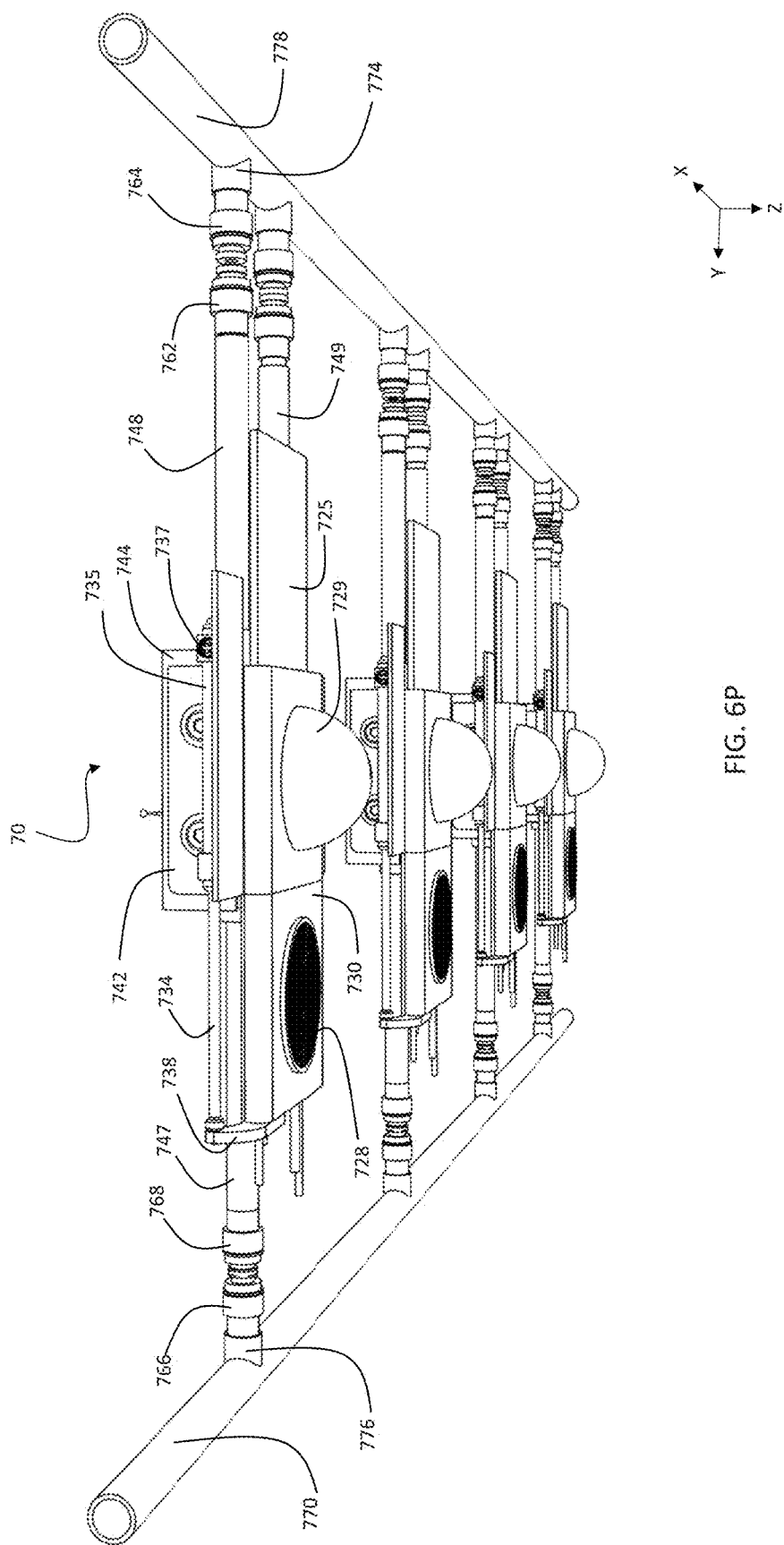
FIG. 6P is a front perspective view of the embodiment of 6L, shown in a fourfold array.

FIG. 6P is a front perspective view of the multi-position autonomous extended track lighting assembly 70 from FIG. 6N-6O shown in a fourfold assembly configuration. This configuration shows how quick disconnect connectors 764, can be mated to connect the cooling fluid CF" returns 762 and also support that side of the automated extended track thermal management fixture 75. The opposite side can comprise quick disconnect connectors 766 and 768 that can connect the input cooling fluid pipe 770 and in so doing help suspend that side of the multi-position autonomous extended thermal management assembly 75. Additional support structures can be added as needed.

Figure 7A:
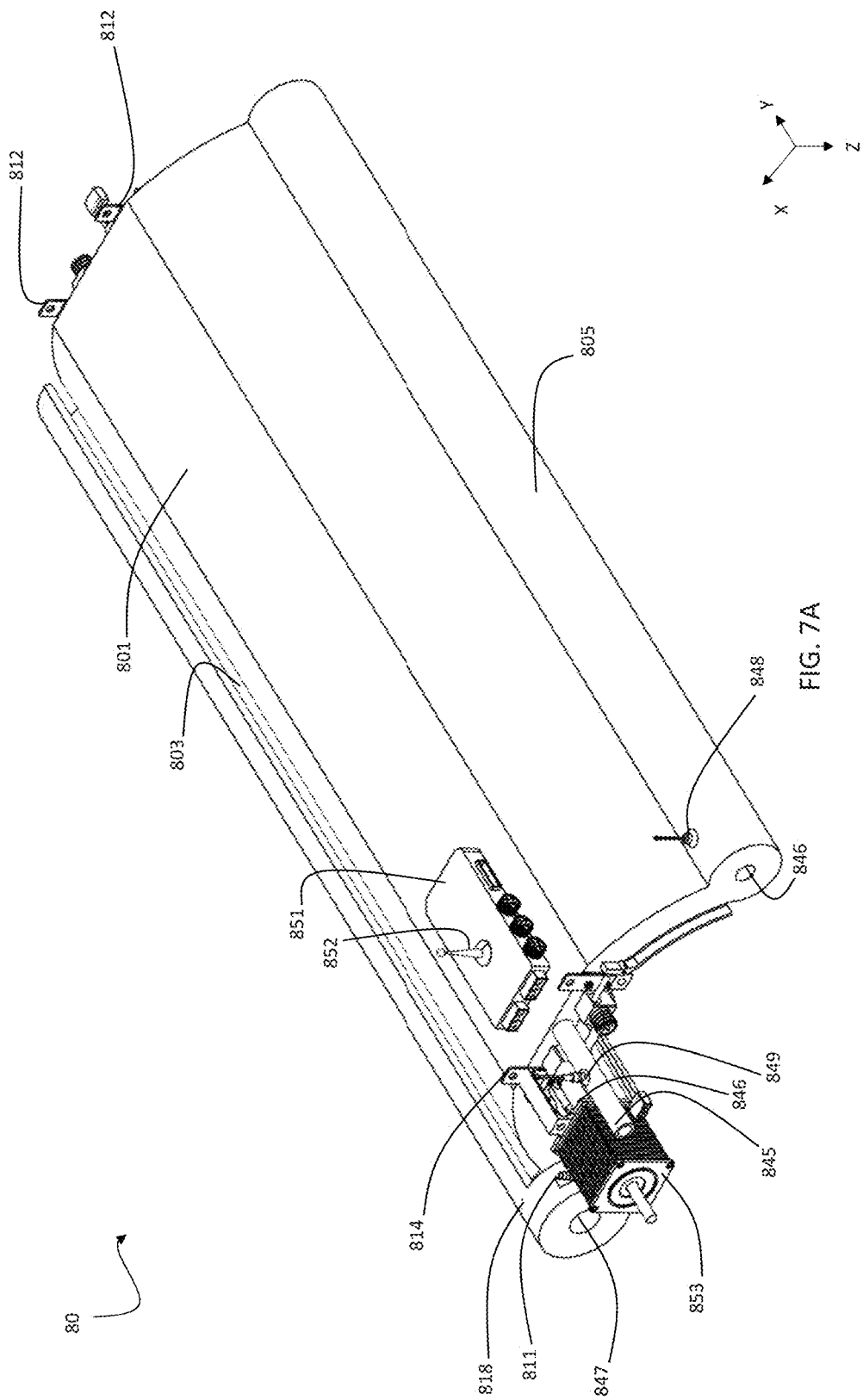
FIG. 7A is an overhead isometric view of another embodiment incorporating features of the present disclosure.

FIG. 7A is an overhead isometric view of an automated light assembly 80. The main body of the light assembly can be formed with many unique features such as one or more cooling fluid exit pipes, two in this embodiment, a cooling fluid exit pipe 805 on the right side and cooling fluid exit pipe 803 on the left side. This embodiment further shows, fitted over the cooling fluid exit pipe 803, is an optional slide-on spray bar 818. Connected to the main body 801 is a multifunction control box 851 with an internal computer and a communications antenna 852. Attached to the main body 801 are optional hanger fixtures 812. There are at least three positions for these hanger fixtures 812 that can be used to support the automated light assembly 80, also included is a fourth hanger fixture and motor mount support 814.

Figure 7B:
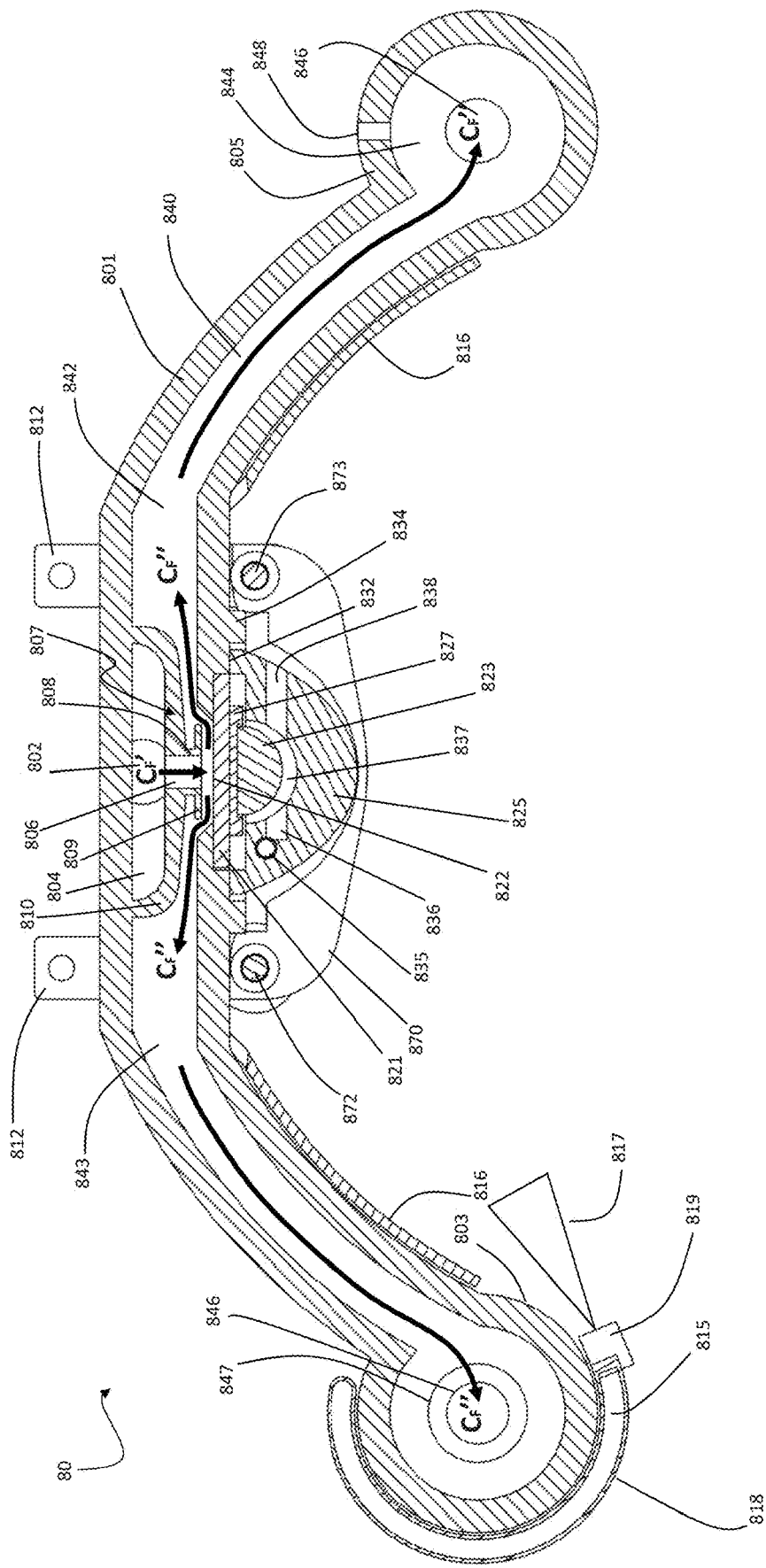
FIG. 7B is another cross-sectional view of the embodiment of FIG. 7A.

FIG. 7B is a cross-sectional view of the light assembly 80 and its components. This cross-sectional view shows the monolithic body 801. A cooling fluid input aperture 802 where cooling fluid CF is introduced into the system. Once in the system the cooling fluid is designated as cooling fluid CF'. The impingement head 807 comprises a cooling fluid reservoir 804, formed or defined by the structure wall 810 with one or more impingement nipple apertures 806 that are defined by the impingement nipple walls 808, and an impingement spreader pedestal 809. The input cooling fluid CF' can flow through the impingement nipple apertures 806 and impinge on the thermally active region 822 of the electrically-powered device 823. The cooling fluid CF", which has extracted the heat from the thermally active region 822, can egress through the restrictive channel formed by the impingement pedestal head 809 and the backside of the thermally active region 822.

The heated waste cooling fluid CF" flows past the pedestal head 809 and emerges on either side of the cooling fluid transition region 843 on the left and the cooling fluid transition region 842 on the right. The cooling fluid CF" cascades down the sloping walls 840 to reach the exiting cooling fluid reservoir 844. The cooling fluid exit reservoir 844 can comprise a thermalcouple access port 848. Other thermal couple access ports can be attached to the main body 801 as required. The concave feature is not a requirement for the cooling fluid CF" egress. The concave feature was added to accommodate the left side and right side concave reflectors 816.

To assist in the light distribution in embodiments utilizing an electrically-powered light-emitting device, and to further protect the light-emitting device, a lens 825 can be included in the thermal management fixture 80. The lens 825 can enable the additional spreading or concentrating of emitted light, the lens 825 can also provide a configuration for extracting excessive heat that can be generated. The lens 825 has on either or both front and back ends a cooling fluid aperture 835 that propagates all the way through the lens 825.

In some embodiments, the cooling fluid can include a gas. The cooling fluid gas can be introduced through the cooling fluid input aperture 835 and can flow into the transport tubes 836. These transport tubes 836, which can be parallel or nearly parallel, provide cooling fluid gas CG' to each electrically-powered device included in the array. Utilizing this configuration, there is no serial buildup of the heat, carrying the heat from one electrically-powered device to the other. The transport tubes 836 can transport the cooling fluid gas across the face of the electrically-powered device 823 by entering a gas chamber 837 that surrounds the electrically-powered device 823 and then be exhausted through a exhaust port channel 838. An optional spray bar 818 can receive cleaning fluid through cleaning fluid reservoir 815 for distribution through the cleaning fluid 813 through the spray nozzle 819.

The embodiment of FIG. 7B can further comprise an optional lens-cleaning capability provided by a lens scrubber platform 870 that can travel on a threaded drive rod 872 and a guide rod 873. This scrubber platform 870 can work in conjunction with the spray head 818. The spray head 818 comprises a body that is slid over or onto the cooling fluid exit chamber 803. The spray head 818 features a spray nozzle 819 that can produce a stream of cleaning fluid 817 that can impinge on the surface of lens 825, while the scrubbing platform 870 is in motion.

Figure 7C:
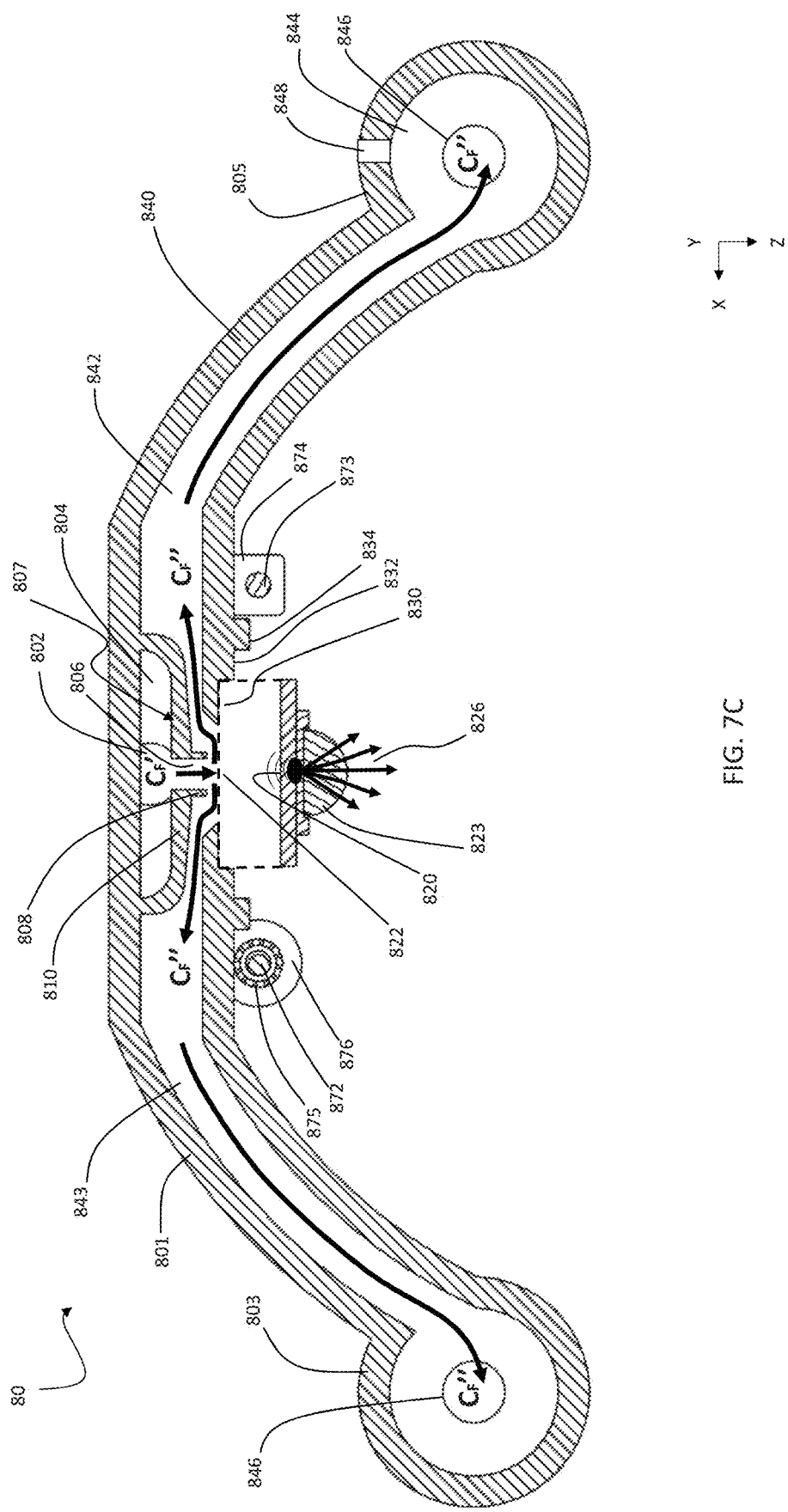
FIG. 7C is another cross-sectional view of the embodiment of FIG. 7A.

FIG. 7C is a cross-sectional view of the main body 801 of the thermal management fixture 80. In this view, the impingement head 807 has eliminated the pedestal head 809 and uses the impingement nipple wall 808 to channelize the cooling fluid CF' to be impinged on the thermally active region 822, that would correspond to the targeted area configured to receive an electrically-powered device. An aperture with the proper cooling fluid force can impinge on the surface to be cooled and not require a nipple, although in the present embodiment, a nipple is utilized. One function of the nipple wall length or height is to provide an egress path for the heated cooling fluid CF". In this embodiment, the electrically-powered device mounting surface 830 is recessed into the main body 801. An epoxy mask can be applied to its surface so that the electrically-powered device is bonded to the mounting surface recess 830. Within the electrically-powered device mounting surface 830, the thermally active region 822 can comprise an open aperture where the cooling fluid CF' impinges on the backside 820 of the electrically-powered device.

In embodiments wherein the electrically-powered device 823 comprises a light-emitting device, the lens 825 (not shown) can be mounted on a lens mounting surface 832 and fixed in position by a lens boss 834. The outgoing useful radiation 826 emanates from the electrically-powered device 823.

Figure 7D:
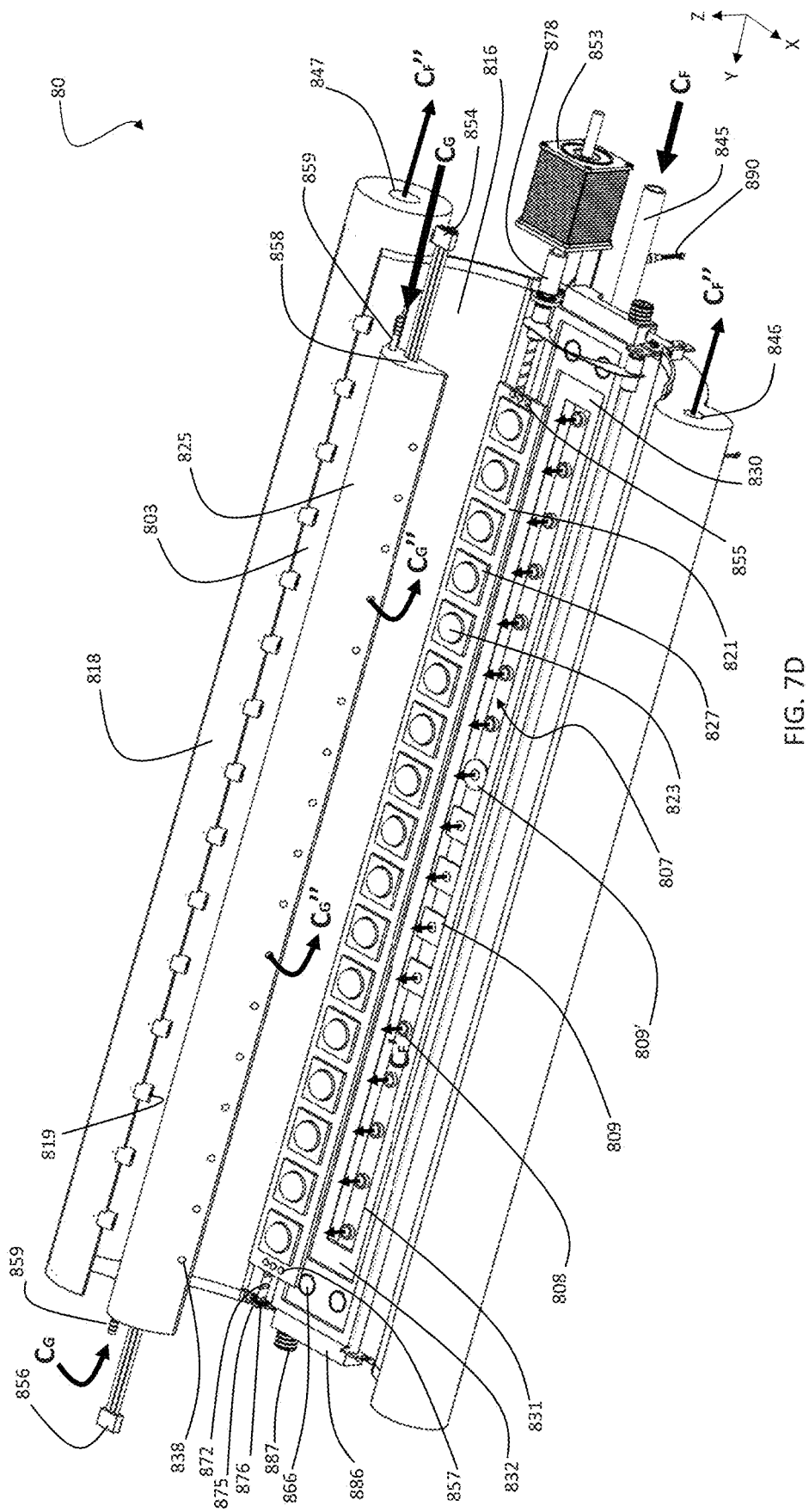
FIG. 7D is an expanded isometric view of the embodiment of FIG. 7A.

FIG. 7D is an expanded isometric view of the thermal management fixture 80 with the lens 825 elevated above the electrically-powered device, in this embodiment, shown as an LED chip carrier 821, wherein the chip carrier 821 is shown elevated above its functioning position which is at the chip carrier recess 832 for illustrative purposes. The input cooling fluid CF is introduced to the impingement cooling fluid CF' reservoir 804 via a input cooling fluid pipe nipple 845 that is fitted into the input aperture 802 of the main body 801. An aperture 831 is formed in the main body 801 that allows the impingement cooling fluid CF' to engage the backside 820 of the chip carrier 821. Within this aperture 831 resides the impingement head 807 with, in this embodiment, a linear array of impingement nipples 808 and square impingement pedestals 809, and circular impingement pedestals 809'. In is understood, however, that the impingement pedestals 809, 809' can comprise other shapes and geometries, including any regular or irregular polygon. Emanating from the impingement pedestals is the input cooling fluid CF' that will impinge on to the backside of the chip carrier 821. Once the cooling fluid has extracted the heat from the backside the heated waste cooling fluid CF" then moves through the internal cavities of the main body 801 as described previously. The cooling fluid CF" emerges from the internal structures of the main body 801 to be expelled through the cooling fluid outlet apertures cooling fluid outlet aperture 847 and cooling fluid outlet aperture 846.

The lens 825 can comprise, on one or on both ends a pipe bib 859 and on either end the electrical connector 856 for the power to the LEDs. The electrical power and the cooling can be introduced from either end. The two electrical power connectors 854 and 856 allow for cascading more light assemblies 80. The parallel exhaust ports 838 are seen on the periphery of the cylindrical lens 825. The exhaust ports 838 expel the heat carried away by the cooling fluid gas CG" generated by the LED's. The heated cooling gas CG" can be captured and removed controllably by a channel and directed to a control path to exit the light assembly 80.

FIG. 7E is an off axis elevated view of the light assembly 80. In this embodiment, a motor 853 is attached to a motor support frame 877. The motor output shaft 879 is connected to a coupler 878 that is attached to a threaded drive rod. The threaded drive rod is supported by a bearing 875 that is fixed to a bearing mount 876. The drive system can be configured for the motion control of features such as a scrubber platform as discussed above. The motor 853 can receive its commands from the function control box 851 via a connector 864 on the control box 851 and connected to the motor connector 865.

There can be one or more connected thermocouples, In the embodiment shown, there are two thermocouples, including an output cooling fluid thermocouple 888 and can input cooling fluid thermocouple 890. Their signals can be fed to the control box connector 889 for the input cooling fluid thermocouple 890 and the signal from output cooling fluid thermocouple 888, can be sent to the control box connector 891. The thermal differential between these two thermocouples can be utilized to determine the proper flow rates to establish constant temperature control set-points and can be controlled remotely or by the firmware that resides within the function control box 851. If the functions are to be controlled remotely the information and data connection can be performed preferably on a wireless basis through the antenna 852.

Slightly below the input cooling fluid pipe nipple 845 can reside a dual acting variable linear actuator 880, which can control, on opposite sides, dual control arms 881, 882 that can pivot about a fixed point. The actuator control arms 881 can function to position the reflector 816 at any position that meets the needs of any lighting or illumination requirements.

Input cleaning fluid CF, can be introduced to the spray bar 818 via a pipe nipple 811. To accommodate the spray bar 818 and still have the output cooling fluid CF" exiting through the aperture 847 can utilize a slightly larger pipe nipple 833 fitted into the cooling fluid CF" exit aperture 847. The spray bar 818 is free to rotate about the larger pipe nipple 833 through an angle from ω0 to ω1. The spray bar 818 has many functions it can perform. If the angle is ω0 the spray bar 818 can function as a lens cleaning mechanism and if the angle is co the spray bar can function as a mister, irrigator, fertilizer or other utility needs.

Figure 7F:
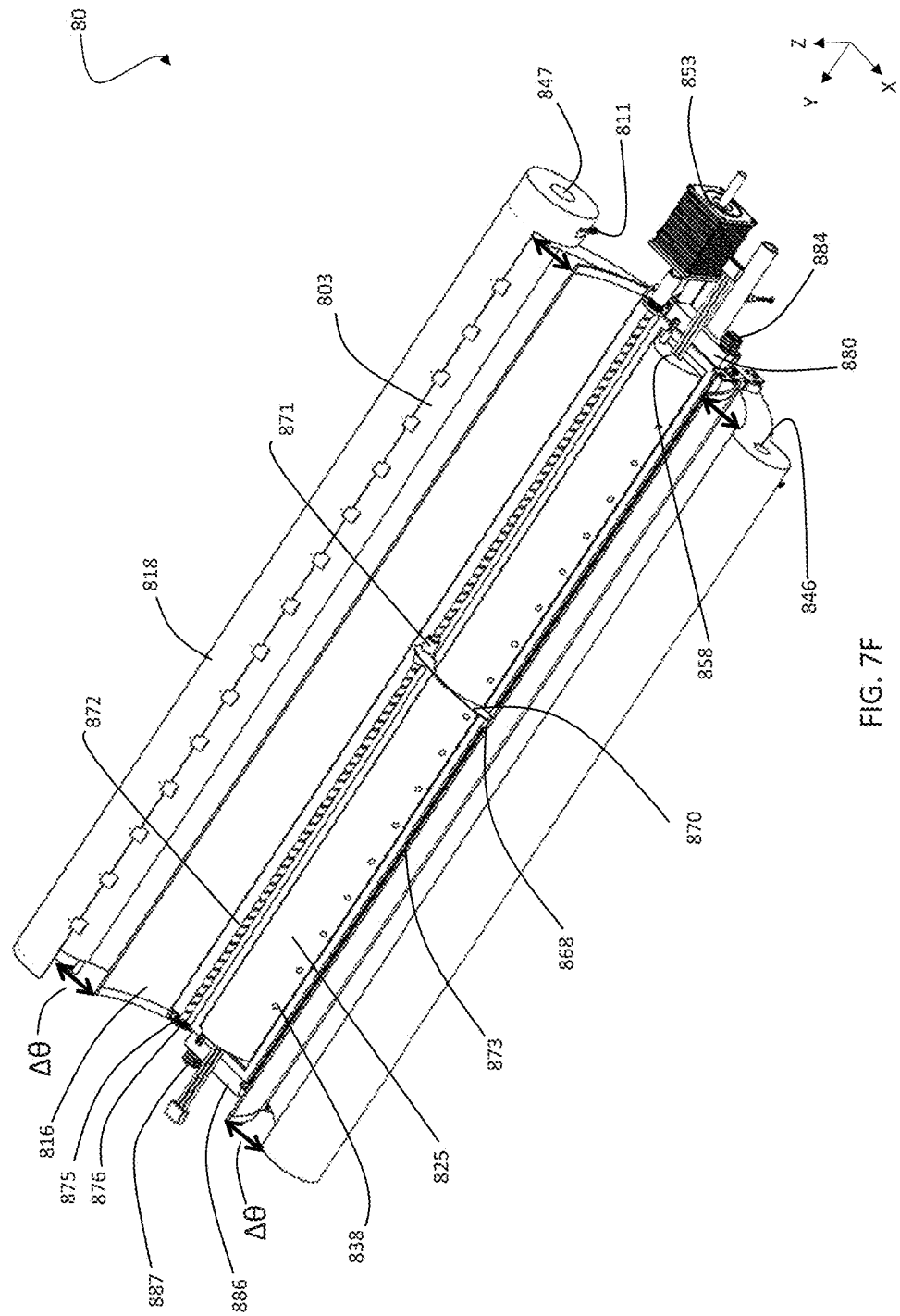
FIG. 7F is an front perspective operational view of the embodiment of FIG. 7A.

FIG. 7F is an operational view of the light fixture 80 that shows reflectors 816 at a different angular displacement from its original position to maximize or broaden the amount of light coverage as required by the environment. The Δθ represents the angular displacement of the reflectors 816, that can be performed by performed manually or by, for example, the software control described previously. The dual acting variable linear actuators 886 and the dual acting linear variable actuator 880 can receive their positioning requirements from the function control box. The dual acting variable linear actuator 886 through its connector 863 can receive its positioning information from the connector 887 on the function control box. Likewise, the dual acting variable linear actuator 880 through its connector 884 can receive its positioning information from the connector 862 of the function control box 851. The reflectors may have lenses or filters that can replace the reflector function so therefore the application of positioning via these dual acting variable linear actuators can serve many other functions.

Figure 7G:
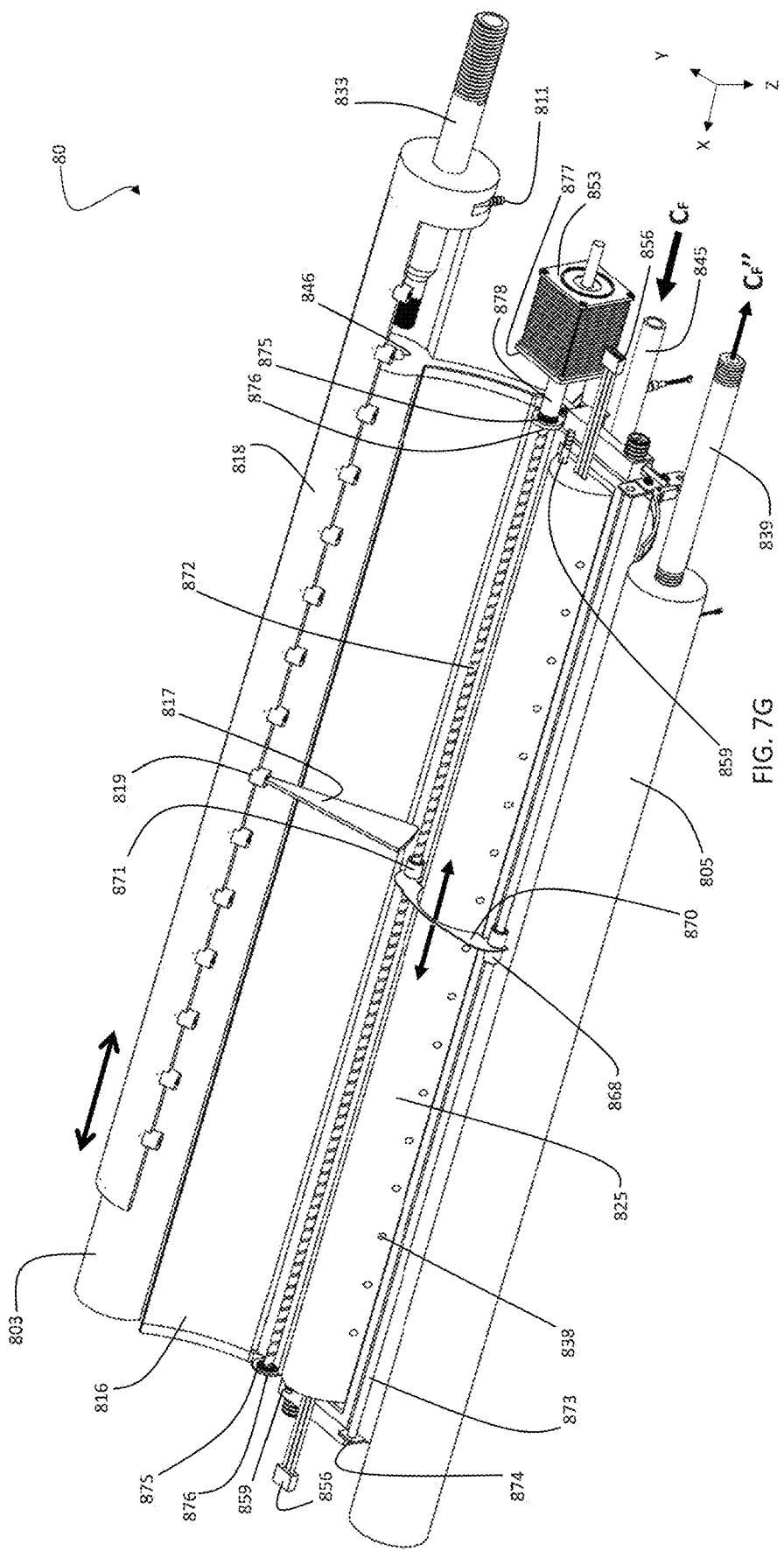
FIG. 7G is an off axis operational view of the embodiment of FIG. 7A.

FIG. 7G is an off axis operational view of the light assembly 80 and shows the implementation of the scrubbing platform 870 being driven by a threaded rod 872 that is connected through a bearing 875, supported by a bearing support bracket 876, and coupled to the motor 583 via a coupler 878, with the motor 853 being supported by the motor mount 877. The threaded rod 872 is supported on the opposite end by a bearing support structure 876 and a bearing 875. The scrubbing platform 870 can be stabilized by a guide rod 873 and the guide rod 873 itself can be stabilized by the guide rod bracket 874 on either end of the guide rod 873. A linear bearing 868 can support the scrubber platform 870 on the guide rod 873. On the opposite side, a threaded drive nut 871 is the connection between the scrubber platform 870 and the threaded drive rod 872. Software control signals are sent from the function control box 851 through the motor connector 864 on the function control box 851 to the motor connector 865. Not shown is the actuator controlling the cleaning fluid 817 for the spray bar 818. That controller can coordinate the duration of cleaning fluid spraying as the scrubber platform 870 moves from one end of the threaded drive rod 875 to the other, until the cleaning function is complete.

Figure 7I:
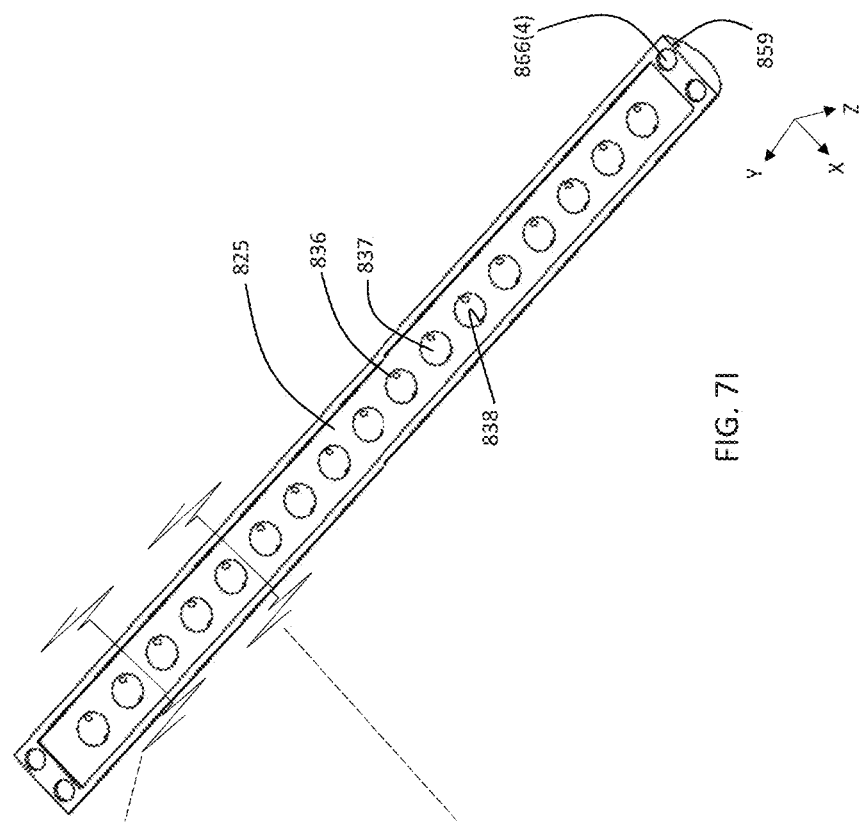
FIG. 7I is an elevated off axis view of the embodiment of FIG. 7A.
Figure 7H:
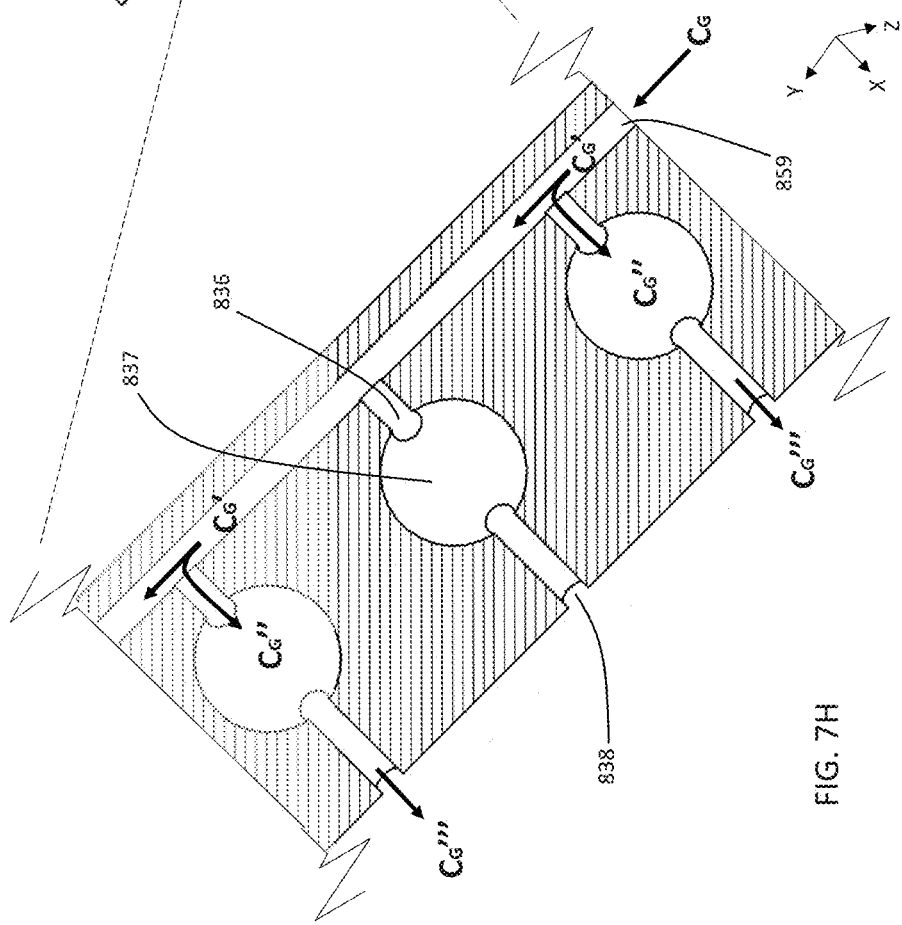
FIG. 7H is a magnified cross-sectional view of the embodiment of FIG. 7A.

FIG. 7H is a magnified cross-sectional view of a mid-level section of the lens 825. The lens 825 acts as a cover and comprises lens domes 837, if not vented, could accumulate heat and degrade the performance of LED emitters. Heat can be extracted from the lens dome region 837 by passing a cooling gas CG' through channels 836 in a parallel fashion to all of the lens dome regions 837 simultaneously or in parallel. The heat generated by the LEDs or the COBs can be transferred to the cooling gas CG". The through channels 836 are fed the cooling gas CG' through a feed channel aperture 859. Therefore, all of the lens domed regions 837 receive the same temperature cooling gas CG' and maintain uniform cooling over the entire length of the LED chip carrier substrate 821. The cooling gas CG''' is vented to the outside via exit channel 838. If the cooling gas CG''' were required to be captured and directed to or vented to the outside of the controlled environment or vented into capturing return line similar to the cooling gas CG input line 859 could be added to the opposite side of the lens cylindrical lens 825 to capture the gases or fluids exiting the channel 838, so that there would be an entirely symmetric channel system to perform the parallel cooling and serial extraction of the cooling gas CG''' or cooling fluid CF'''.

FIG. 7I is an elevated off axis view of the cylindrical air cooled lens 825. This view shows the region from which the mid-cross-sectional view of FIG. 7H was taken and shows the LED lens dome 837 with the cooling fluid channel output port 838 and the channel input port 836 along with the cooling gas input port 859. Also located on the extremes of the cylindrical lens assembly 825 are one or more magnet recesses 866 (four shown). In non-gas-tight embodiments, magnets within the magnet recesses 866 can be used to rapidly change and secure the cylindrical lens 825.

Figure 8A:
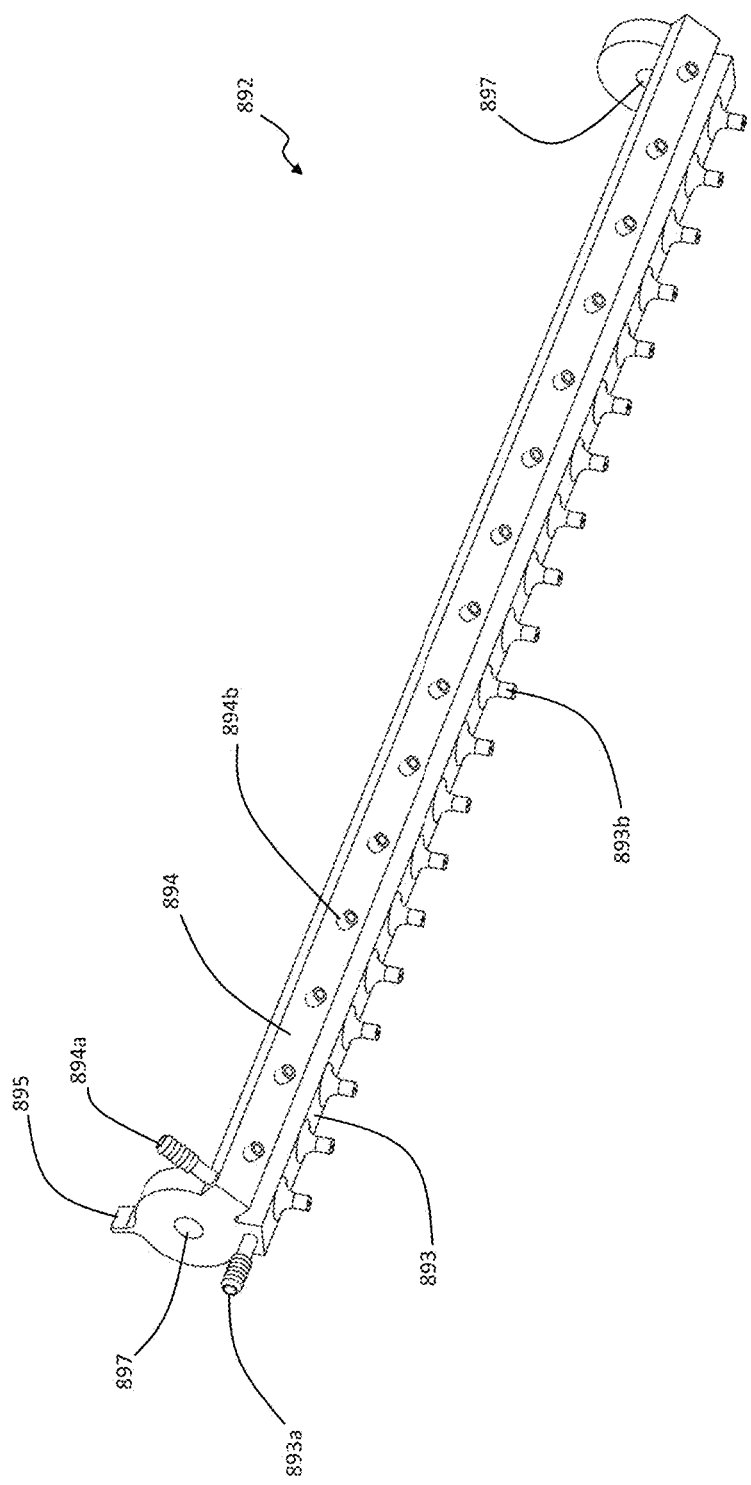
FIG. 8A is an isometric off axis view of a spray assembly 892, that can be added to the embodiments of FIG. 7A-7I.

FIG. 8A is an isometric off axis view of a spray assembly 892, that can be added to the light fixture 80 shown in FIGS. 7A-7I. This spray assembly 892 can be mounted to the light fixture 80 by placing it onto the cooling fluid return channel, securing it with pipe nipple's 839 through the apertures. The pipe nipple's 839 can be threaded into the cooling fluid return channel 805 and aperture 846 as seen in FIG. 7F. The spray assembly 892 comprises a spray bar 894 and spray bar 893. Spray bar 893 receives its fluid from pipe bib 893a, and, spray bar 894 receives its fluid from pipe bib 894a. The spray bars respectively 894 and spray bar 893 are comprised of a series of fluid distribution orifices 894b, and 893b. Positioning of the spray assembly 892 is achieved by applying pressure to the drive tang 895 located on at least one and of the spray assembly ends 892.

Figure 8B:
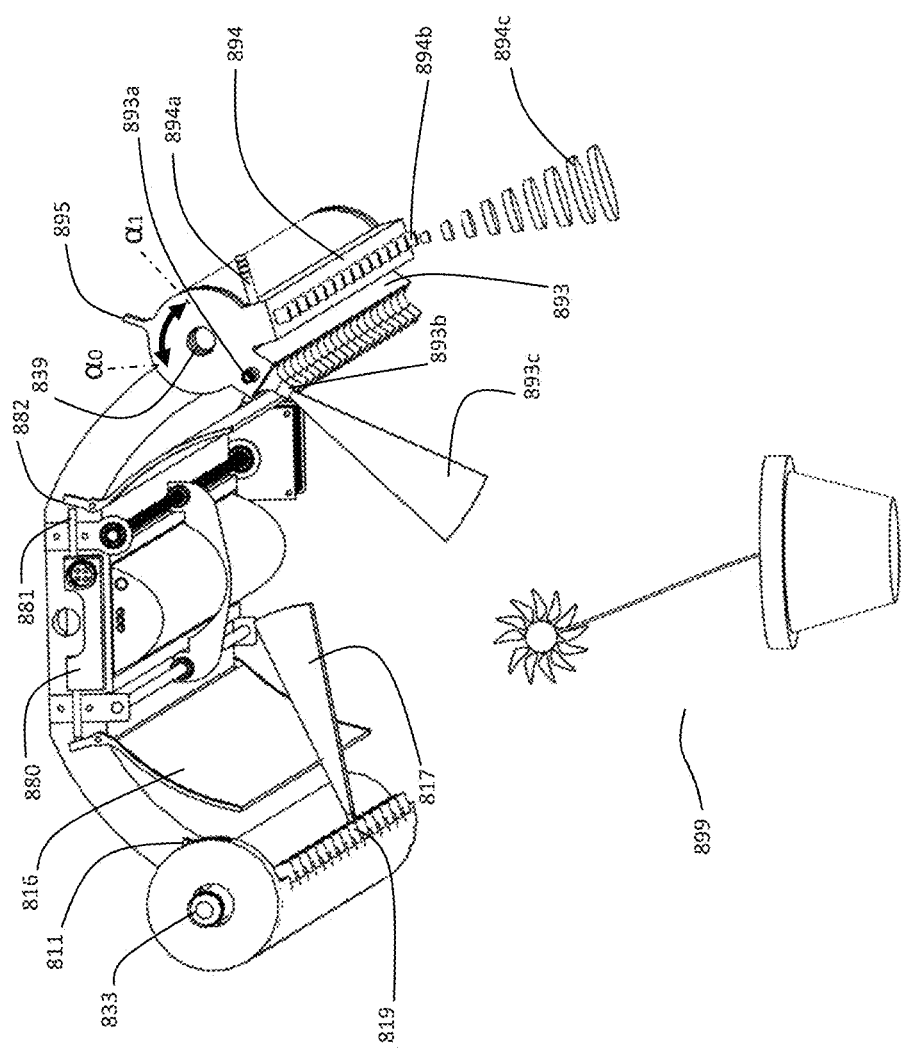
FIG. 8B is an off axis low angle view of spray assembly of FIG. 8A installed on the embodiment of FIG. 7G.

FIG. 8B is an off axis low angle view of the light fixture 80 showing the spray assembly 892 attached to the cooling fluid exit channel 805. By applying the appropriate pressures to the cooling fluid used, the appropriate spray pattern 893c can be realized as it emerges from the spray nipple 893B. Also by applying the correct pressure and fluid mixtures, liquids with gases, the spray fixture or spray bar 894 can generate the appropriate misting spray 894C emerging from the spray nipple 894B. If automated positioning is required, and actuator similar to 880 that drives the adjustable mirrors 816 can be implemented to drive the drive tang 895. To select which spray function is required the drive tang 895 is positioned by another a linear drive actuator (not shown) through an arbitrary angle of α0 to α1. In growing environments, this feature can be used along with the appropriate automation to enable watering of the product 899. with the required/and/or appropriate misting, fertilizing, general watering, and/or distribution of pesticides.

Figure 9A:
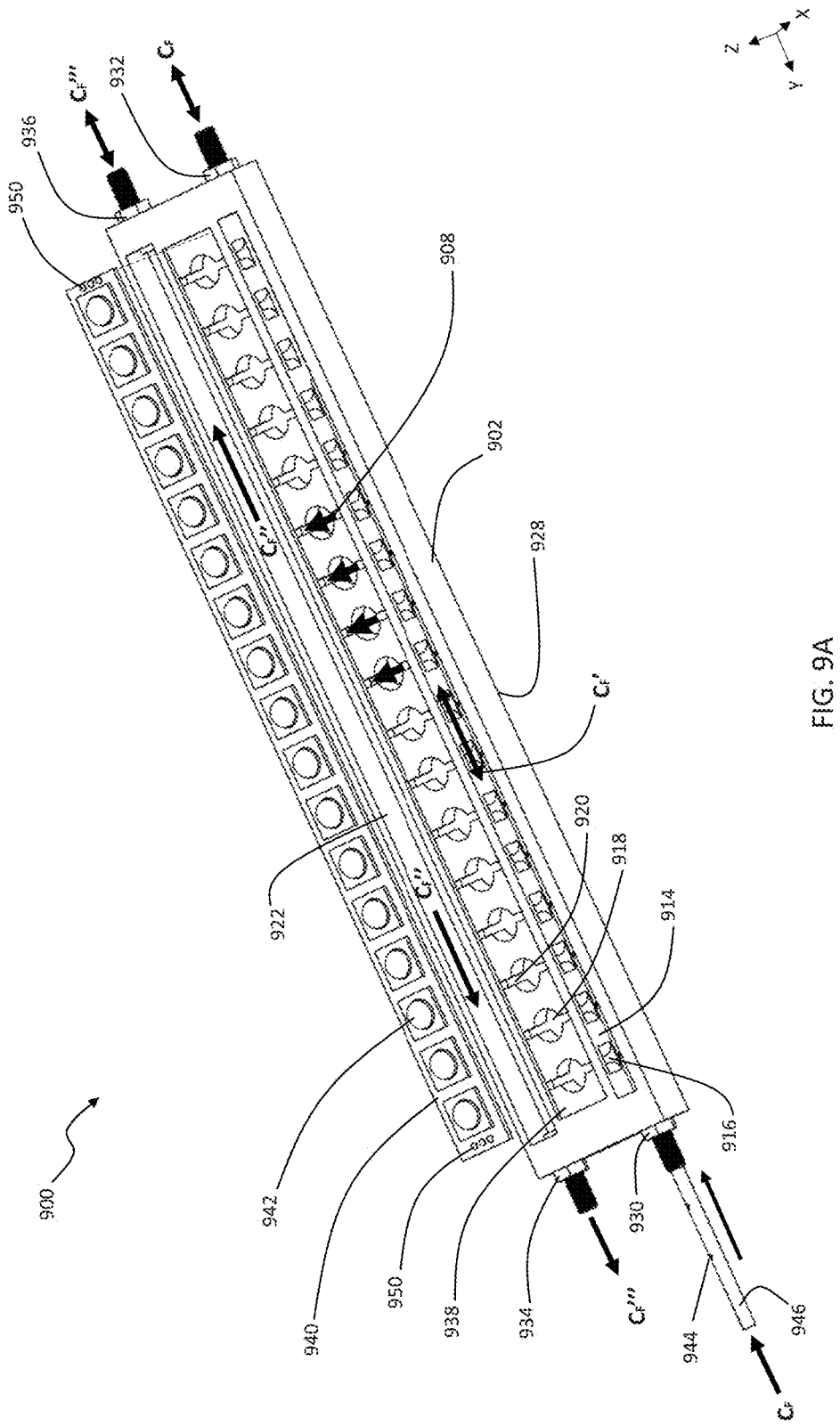
FIG. 9A is an elevated isometric view of another embodiment incorporating features of the present disclosure.

FIG. 9A is an elevated isometric view of an impingement fixture 900 configured to thermally manage the underside of a chip carrier 940 that has on its surface LEDs or COB's. The chip carrier 940 can be affixed to the recessed surface 938 with methods that are acceptable for the materials chosen. The horizontal impingement fixture 900 comprises an input nipple 930 that accepts an internal fluid distribution inlet tube 946 that distributes the cooling fluid CF into the cooling fluid flow channel 914. The cooling fluid CF exits small apertures 944 that are distributed uniformly along the length of the internal fluid distribution inlet tube 946. The apertures 944 can vary in size along the total length of the rod in order to allow for equal flow rates from each of the apertures 944. This cooling fluid flow channel 914 has vertical walls with apertures 916 that except the cooling fluid CF and passes it through the inlet aperture 916 such that it flows into the cooling fluid pocket chamber 918, whereby fluid turbulence causes the cooling fluid to come in contact with all walls and the bottom side of the chip carrier back face 928.

The cooling fluid CF' will turbulently or laminarly flow through the cooling fluid pocket chamber 918 extracting heat now represented by CF". Four arrows illustrate the parallel flow cooling 908 in the cooling fluid pocket chamber 918. The cooling fluid CF" then passes through and exit channel 920 and flows through the common heat extraction channel 922. The cooling fluid CF" can exit via a cooling fluid exit port 934 and a cooling fluid exit port 936. The exiting cooling fluid CF" may also exit in a single direction, by for example plugging the exit port 934 and allowing all of the cooling fluid CF''' to exit the cooling fluid exit port 936 and possibly cascading to another horizontal impingement thermal management fixture 900. Likewise, the input cooling fluid CF introduced via the input cooling fluid aperture 910 may also flow in one direction if configured to do so by allowing the cooling fluid aperture 912 to be cascaded to another horizontal impingement thermal management fixture 900. Other configurations are possible.

Figure 9B:
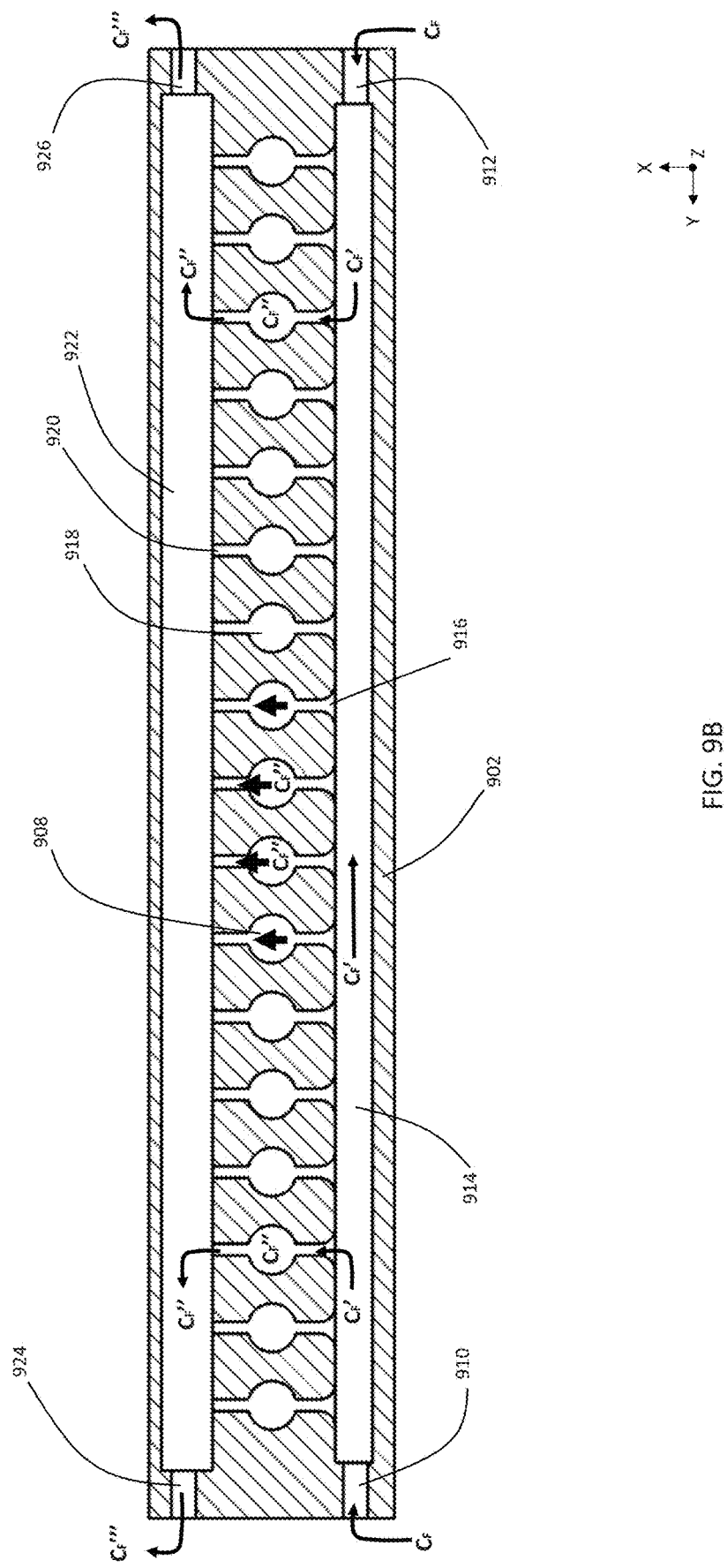
FIG. 9B is a cross-sectional view of the embodiment of FIG. 9A.

FIG. 9B is a cross-sectional view of the horizontal impingement thermal management fixture 900 showing a serial path followed by the cooling fluid CF' to the parallel cooling channels 916. The inlet cooling fluid aperture 910 receives the input cooling fluid nipple 930 the input cooling fluid aperture 912 receives the input or output cooling fluid nipple 932 the cooling fluid exit aperture 924 and 926 also receive respectively there cooling fluid nipple 934 and cooling fluid nipple 936. All of the fluid nipples are shown in the previous FIG. 9A. Four arrows illustrate the parallel flow cooling 908 in the cooling fluid pocket chamber 918. The circular region which is the cooling fluid pocket chamber 918 may be of any desirable geometry, it may be similar to the geometry to a Bernoulli valve, whereby the Bernoulli valve generates many symmetrical channels that can have a laminar flow or a turbulent flow that is generated internally by the valve itself through the various geometric contours.

Figure 10A:
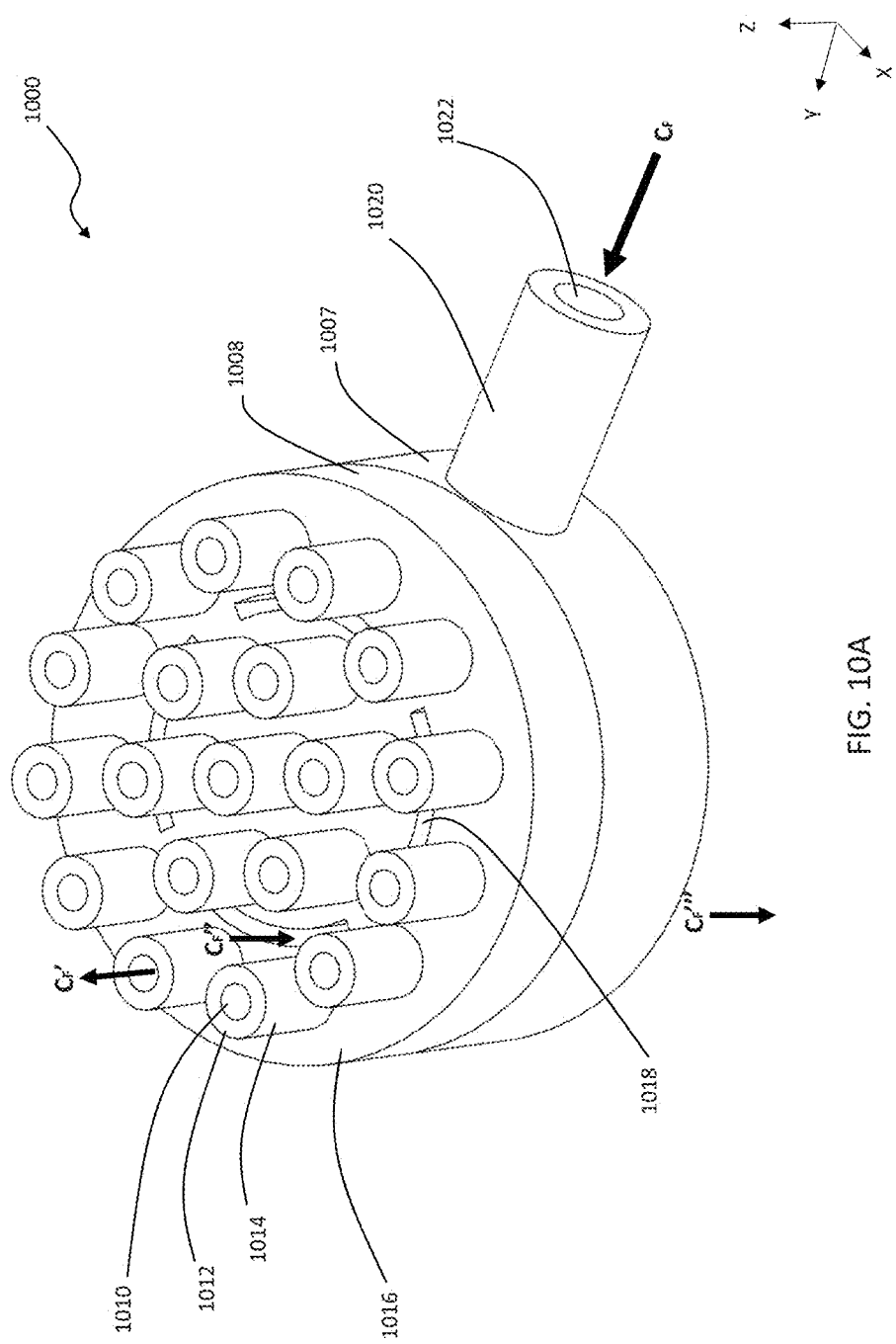
FIG. 10A is an elevated isometric view of an embodiment of an impingement head incorporating features of the present disclosure.

FIG. 10A is an elevated isometric view of an impingement head 1000 comprising a drain, that comprises internal drain apertures 1018 located at the base 1016 of the impingement head 1000. Previous descriptions of the various impingement head configurations operate in the same manner with cooling fluid CF' exiting the nipple aperture 1010 and flowing to the floor or base 1016 of the impingement head 1000 and maneuvering around the nipples 1014 to find the exit path (not shown). The same input cooling fluid aperture 1022 internally formed in the large pipe nipple 1020, provides a pathway for the cooling fluid CF.

Figure 10B:
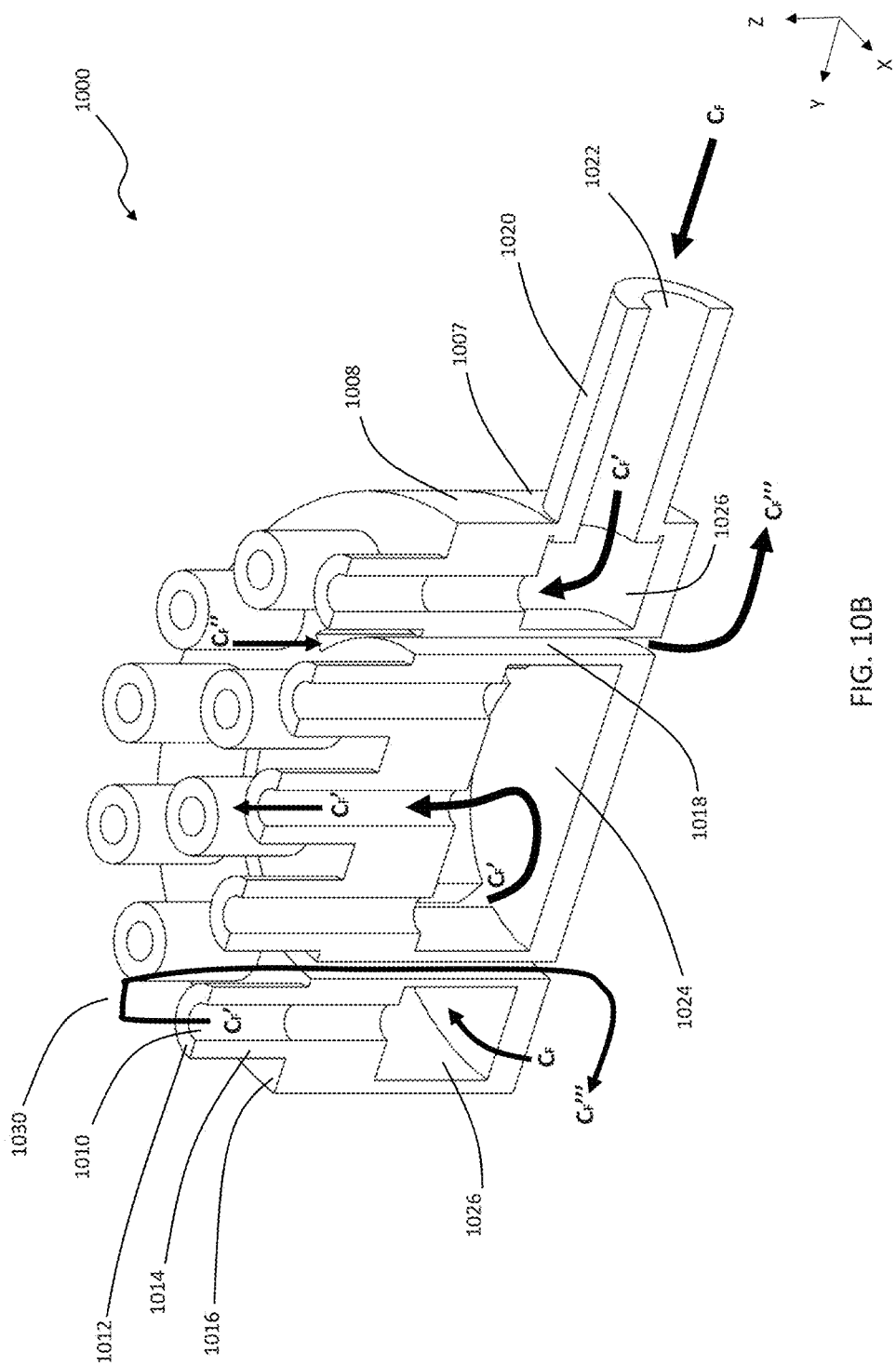
FIG. 10B is an elevated off axis cross-sectional view of the embodiment of FIG. 10A.

FIG. 10B is an elevated off axis cross-sectional view of the internal workings of the impingement head 1000. The cooling fluid CF' is shown exiting a nipple aperture 1010, and impinges on the backside of an electrically-powered device to be cooled, and then redirected towards the base exit aperture 1018 where the cooling fluid CF"" exits and quickly reaches a cooling fluid CF"' exit pathway or exit chamber.

Figure 10C:
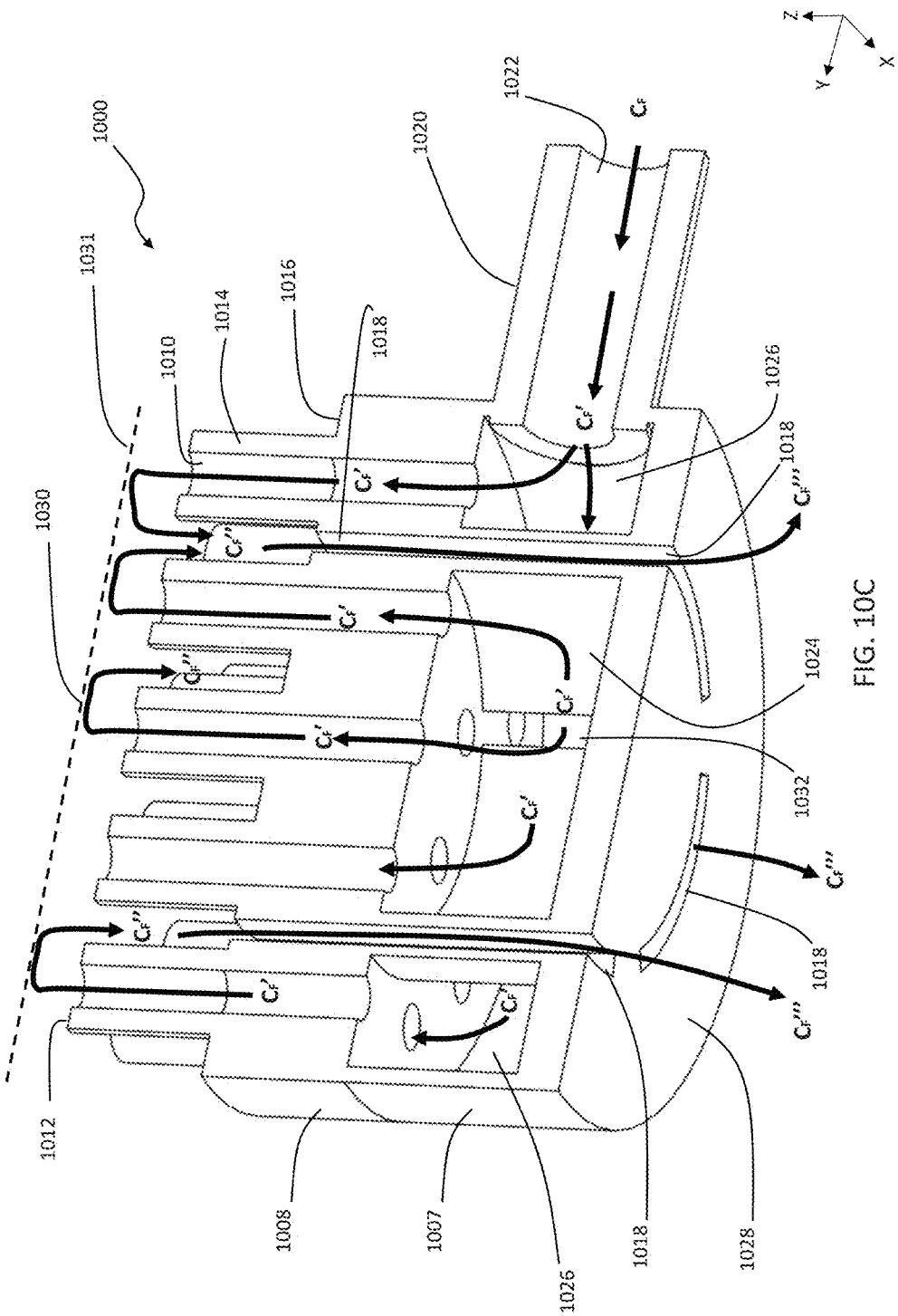
FIG. 10C is a partial underside cross-sectional view of the embodiment of FIG. 10A.

FIG. 10C is a partial underside cross-sectional view of the impingement head 1000 with drain. The cooling fluid CF is introduced through the cooling fluid aperture 1022 in the access pipe 1020. The cooling fluid CF' enters the cooling fluid filling reservoir 1026 where it transfers the cooling fluid CF' to the cooling fluid center reservoir 1024 through the cooling fluid reservoir fill aperture 1032. With both of these apertures containing pressurized fluid or cooling fluid CF' it is forced through nipple aperture 1010 where it then will impinge on the backside 1031 of a device that requires thermal management. The fluid path 1030 shows the transformation of the cooling fluid CF' to a slightly perpendicular profile and then transformed into CF", where CF" indicates that the cooling fluid CF' has absorbed heat or performed a thermal transfer at the electrically-powered device 1031. The cooling fluid CF" containing the heat to be removed from the assembly exits through a drain channel 1018. The drain channel 1018 proceeds all the way through the body or bodies 1008 and 1007 to the base bottom 1028. It exits through the aperture 1018.

The nipple terminus 1012 is terminated with no specific geometry however, it could include a mushroom, a sphere hollow sphere or other geometries that deflect the cooling fluid CF' with whatever geometry is required.

The body section 1008 and body section 1007, of the impingement head with drain 1000, can function by themselves if they are fitted to the appropriate cavities that will enclose the cooling fluid and the device to be cooled 1031 in an appropriate fashion as to control the cooling fluid CF' and CF" and CF'''

Figure 11:
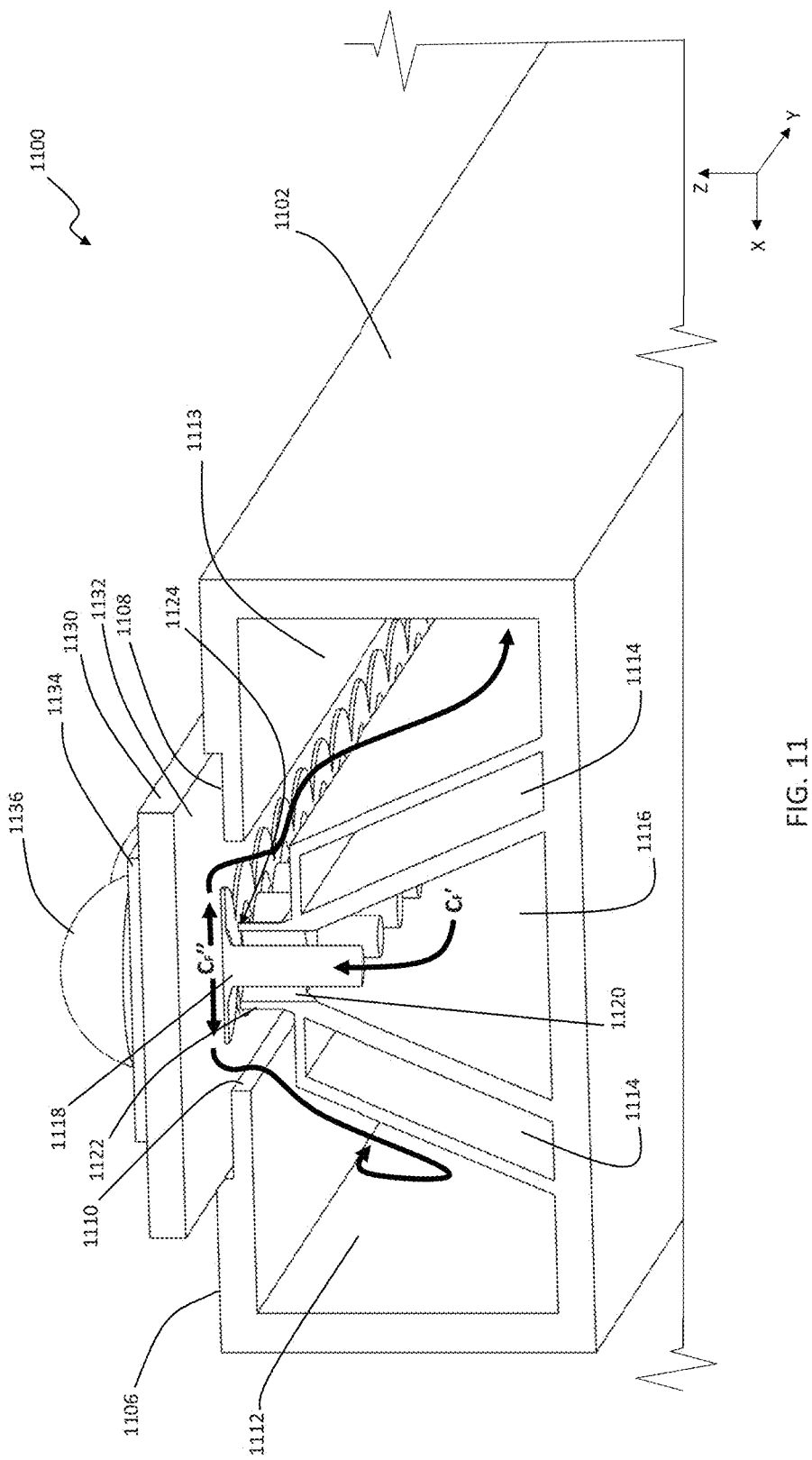
FIG. 11 is a low off axis view of another embodiment incorporating features of the present disclosure.

FIG. 11 is a low off axis view of a multifunction fixture 1100, wherein the electrically-powered device to be cooled comprises a COB, however, it is understood that in some embodiments the features set forth in FIG. 11 can be utilized with electrically-powered devices that are not light-emitters, for example microprocessor chips. The main body 1102 of the multifunction fixture 1100 comprises a surface aperture 1110 formed in the top surface 1106. This top surface aperture 1110 allows the cooling fluid CF' to move from the cooling fluid supply channel 1116 through the inside of the nipple channel 1120. The cooling fluid CF' then impinges on the chip carrier backside 1132 the cooling fluid CF" then flows into the cooling fluid return channel 1113 and cooling fluid return channel 1112. This multifunction fixture 1100 also comprises additional structures such as cavities 1114 on adjacent sides of the main cooling fluid supply channel 1116. These cooling channels 1114 are shown as parallelograms, they could also have alternate geometries to function more effectively under certain conditions for insulating the main cooling fluid supply channel 1116. Another function of the insulating channel 1114, it can also serves as a cooler channel where a cooled fluid is circulated through this channel and transfers heat so that the cooling fluid CF' flowing through the cooling fluid main supply channel 1116 extracts heat or reduces the temperature of the cooling fluid CF' that will impinge on the chip carrier backside 1132. Also a refrigerant gas could also be passed through to accommodate cooling. Another function of the multifunction device 1100 could have return lines with the negative pressure cooling gas being pulled through the cooling channel 1116 whereby the cooling fluid CF' is actually a cooling gas and impinges on the surface of the chip carrier backside 1132. Implementing this function greatly reduces the overall weight of the system and can offer more rapid cooling response with less weight than a liquid coolant when required.

Nipples and nipple tops according to the present disclosure can comprise many different geometries to facilitate various flow characteristics such as impingement velocities, and impingement angles and impingement volumes.

We claim:

1. A thermal management fixture for use in a thermal management system, comprising:
    a holding assembly portion defining an aperture;
    a microprocessor chip in said aperture;
    an input opening configured to receive cooling fluid from a cooling source;
    an impingement head connected to said input opening and configured to direct said cooling fluid into said aperture such that said cooling fluid absorbs heat from said microprocessor chip and becomes heated waste fluid; and
    an exit port configured such that said heated waste fluid can exit said aperture from said exit port.

2. The thermal management fixture of claim 1, wherein said impingement head comprises one or more apertures surrounded by raised walls.

3. The thermal management fixture of claim 1, wherein said impingement head comprises a plurality of apertures surrounded by raised walls.

4. The thermal management fixture of claim 1, wherein said impingement head comprises a plurality of nipples.

5. The thermal management fixture of claim 1, further comprising a protective surface on said microprocessor chip, wherein said thermal management fixture is configured such that said cooling fluid can absorb heat directly from said protective surface.

6. The thermal management fixture of claim 5, wherein said protective surface comprises an anti-erosion material.

7. The thermal management fixture of claim 1, wherein said microprocessor chip is part of a microprocessor.

8. The thermal management fixture of claim 7, configured such that said cooling fluid can absorb heat directly from said microprocessor.

9. The thermal management fixture of claim 1, further comprising:
    a base body comprising said input opening and said exit port;
    a channelizing fixture between said base body and said holding assembly portion, said channelizing fixture configured to allow said cooling fluid to pass from said base body into said aperture; and
    a seal between said holding assembly portion and said channelizing fixture.

10. The thermal management fixture of claim 9, wherein said channelizing fixture comprises said impingement head.

11. The thermal management fixture of claim 9, wherein said impingement head extends through an aperture of said seal.

12. The thermal management fixture of claim 9, wherein said holding assembly comprises one or more channel forming surfaces on a backside thereof, and wherein said one or more channel forming surfaces and said channelizing fixture combine to form one or more channels that direct said heated waste fluid to said exit port.

13. The thermal management fixture of claim 9, wherein said cooling fluid becomes said heated waste fluid after extracting heat from said microprocessor chip.

14. The thermal management fixture of claim 9, wherein said channelizing fixture is curved.

15. A thermal management system, comprising:
    a plurality of thermal management fixtures each comprising:
        a base body comprising an input opening for receiving cooling fluid, a cooling fluid exit opening, and a heated waste fluid exit opening;

a holding assembly portion defining an aperture configured to hold at least one electronically-powered device, said holding assembly portion connected to said base body; and an impingement head between said base body and said holding assembly portion, said impingement head configured to pass at least some of said cooling fluid from said base body into said aperture to become heated waste fluid;

wherein said thermal management fixture is configured such that at least some of said cooling fluid is an unused cooling fluid that does not pass through said impingement head; and wherein said thermal management fixture is configured to direct said unused cooling fluid to said cooling fluid exit opening, and configured to direct said heated waste fluid to said heated waste fluid exit opening;

wherein one of said thermal management fixtures is a first thermal management fixture and another of said thermal management fixtures is a last thermal management fixture, and wherein said first and last thermal management fixtures are connected in series such that at least some of said unused cooling fluid of said first thermal management fixture passes from said cooling fluid exit opening of said first thermal management fixture to said input opening of said last thermal management fixture.

16. The thermal management system of claim 15, wherein said plurality of thermal management fixtures further comprises one or more intermediate thermal management fixtures;

wherein said first, intermediate, and last thermal management fixtures are connected in series; and wherein said system is configured such that at least some of said unused cooling fluid in each of said thermal management fixtures passes from said cooling fluid exit opening of said thermal management fixture to said input opening of a next successive one of said thermal management fixtures.

17. A lighting assembly, comprising:
a lighting component;
a rotary plate over said lighting component, said rotary plate comprising a lens and a cleaning component; and
a motor operably connected to said rotary plate and configured to move said rotary plate between a first position wherein said lens is over said lighting component, and a second position wherein said cleaning component is over said lighting component.

18. The lighting assembly of claim 17, wherein a sealed lighting assembly comprises said lighting component and a window over said lighting component, and wherein said cleaning component is configured to clean said window.

19. The lighting assembly of claim 17, further comprising a spray head configured to provide cleaning fluid.

20. The lighting assembly of claim 19, further comprising a fluid source, wherein said lighting assembly is configured to use said fluid from said fluid source for cooling said lighting component and for cleaning said window.

21. The lighting assembly of claim 17, further comprising a function controller configured to provide instructions for moving said rotary plate between positions and for oscillating said rotary plate when cleaning.

22. The lighting assembly of claim 17, wherein said rotary plate further comprises an open aperture and a second lens different than said first lens, and wherein said motor is further configured to move said rotary plate among said first position, said second position, a third position wherein said second lens is over said lighting component, and a fourth position wherein said open aperture is over said lighting component.

* * * * *